(12) United States Patent
Enomura et al.

(10) Patent No.: US 10,196,267 B2
(45) Date of Patent: Feb. 5, 2019

(54) METHOD OF PRODUCING OXIDE PARTICLES

(71) Applicant: M. TECHNIQUE CO., LTD., Izumi-shi, Osaka (JP)

(72) Inventors: Masakazu Enomura, Izumi (JP); Daisuke Honda, Izumi (JP)

(73) Assignee: M. TECHNIQUE CO., LTD., Izumi-Shi, Osaka (JP)

( * ) Notice: Subject to any disclaimer, the term of this patent is extended or adjusted under 35 U.S.C. 154(b) by 0 days.

(21) Appl. No.: 15/740,132

(22) PCT Filed: Jul. 14, 2016

(86) PCT No.: PCT/JP2016/070919
§ 371 (c)(1),
(2) Date: Dec. 27, 2017

(87) PCT Pub. No.: WO2017/010557
PCT Pub. Date: Jan. 19, 2017

(65) Prior Publication Data
US 2018/0186638 A1    Jul. 5, 2018

(30) Foreign Application Priority Data

Jul. 14, 2015 (JP) .................... 2015-140772
May 17, 2016 (JP) .................... 2016-098844

(51) Int. Cl.
C01B 13/00    (2006.01)
C01B 13/32    (2006.01)
(Continued)

(52) U.S. Cl.
CPC .............. C01B 13/32 (2013.01); C01F 17/00 (2013.01); C01F 17/0043 (2013.01); C01G 49/06 (2013.01); C01G 49/08 (2013.01)

(58) Field of Classification Search
CPC ......... C01B 13/32; C01B 13/36; C01G 49/08; C01F 17/0043
See application file for complete search history.

(56) References Cited

U.S. PATENT DOCUMENTS

2004/0241070 A1    12/2004 Noh et al.
2009/0199488 A1    8/2009 Haerle et al.
(Continued)

FOREIGN PATENT DOCUMENTS

JP    61-81778 A    4/1986
JP    8-325098 A    12/1996
(Continued)

OTHER PUBLICATIONS

International Search Report (PCT/ISA/210) issued in PCT/JP2016/070919, dated Aug. 9, 2016.

*Primary Examiner* — Steven J Bos
(74) *Attorney, Agent, or Firm* — Birch, Stewart, Kolasch & Birch, LLP

(57) ABSTRACT

The object of the present invention is to provide a method of producing oxide particles, which can improve crystallinity of the obtained oxide particles, more desirably can form single crystal oxide particles stably. The present invention provides a method of producing oxide particles, which comprises at least two fluids to be processed including the first fluid and the second fluid, wherein one of the first fluid and the second fluid is an oxide raw material liquid obtained by mixing at least an oxide particle raw material with a solvent, and the other of the first fluid and the second fluid is an oxide precipitation solvent obtained by mixing at least a basic substance with a solvent, and wherein the method comprises mixing the first fluid and the second fluid in the space between the processing surfaces which are disposed so as to face each other, being capable of approaching to and separating from each other, at least one of which rotates relatively to the other; and discharging the mixed fluid in (Continued)

which the oxide particles are precipitated from the space between the processing surfaces; and wherein the method controls crystallinity of the oxide particles discharged from the space between the processing surfaces, by changing at least one selected from the group consisting of the temperature of the first fluid to be introduced in the space between the processing surfaces, the temperature of the second fluid to be introduced in the space between the processing surfaces, and the temperature of the first fluid and the second fluid at the time of mixing.

20 Claims, 12 Drawing Sheets

(51) Int. Cl.
    *C01G 49/06*     (2006.01)
    *C01G 49/08*     (2006.01)
    *C01F 17/00*     (2006.01)

(56)     References Cited

U.S. PATENT DOCUMENTS

2010/0155310 A1*   6/2010   Enomura .............. B01F 3/0807
                                                                                                                                      209/668

2011/0015054 A1   1/2011   Enomura
2012/0104309 A1   5/2012   Koizumi
2013/0156682 A1   6/2013   Kuraki et al.
2014/0155247 A1   6/2014   Aoyagi et al.
2017/0130358 A1   5/2017   Enomura
2017/0246595 A1   8/2017   Enomura

FOREIGN PATENT DOCUMENTS

| | | | |
|---|---|---|---|
| JP | 2005-519845 A | | 7/2005 |
| JP | 2006-219353 A | | 8/2006 |
| JP | 2009-132994 A | | 6/2009 |
| JP | 2011-511751 A | | 4/2011 |
| JP | 2012-96962 A | | 5/2012 |
| JP | 2013-082621 | * | 5/2013 |
| JP | 2013-132621 A | | 5/2013 |
| WO | 2009/008388 | * | 1/2009 |
| WO | 2009/008393 | * | 1/2009 |
| WO | WO 2009/008392 A1 | | 1/2009 |
| WO | WO 2013/008706 A1 | | 1/2013 |
| WO | 2013/111811 | * | 8/2013 |
| WO | WO 2015/125819 A1 | | 8/2015 |
| WO | WO 2016/010018 A1 | | 1/2016 |

* cited by examiner

METHOD OF PRODUCING OXIDE PARTICLES

TECHNICAL FIELD

The present invention relates to a method of producing oxide particles.

BACKGROUND ART

Oxide particles are materials used in a wide range of fields such as catalysts, conductive materials, magnetic materials, secondary electron emission materials, luminous bodies, heat absorbers, energy storage bodies, electrode materials, color materials, and the like. As characteristics of the oxide particles change depending on the particle size, oxide particles having different particle diameters or crystallinity are required depending on the purpose and requirements. Particularly, characteristics of the particles greatly different from those in the bulk state may be expressed by micronization, and oxide particles are widely required materials in the future.

For example, magnetite is a kind of iron oxide represented by chemical formula $Fe_3O_4$ ($Fe(II)Fe(III)_2O_4$), and is a material which has been widely used from long ago. In particular, magnetite particles are chemically stable particles having relatively large magnetic properties and have been widely used for magnetic recording media, magnetic fluids or the like in the information recording field, or for applications as magnetic toner, carrier, pigment or the like in the image recording field. In addition, in recent years, magnetite particles have been also used for contrast media in NMR, thermotherapy of cancer, or the like in the medical field, and practical use in various fields is expected.

Similarly, cerium oxide is a kind of oxide represented by chemical formula $CeO_2$ (IV) and has been widely used as an abrasive for a long time. In recent years, as a method for producing nanosize cerium oxide particles has been developed, utilization thereof in new applications such as ultraviolet absorbing agents, solid electrolytes, catalyst carriers or the like in addition to abrasives is progressing.

Methods of producing oxide particles known today include sol-gel method, co-precipitation method, hydrothermal synthesis and the like.

For example, as a method of producing magnetite, a method of co-precipitating ferrous ions ($Fe^{2+}$) and ferric ions ($Fe^{3+}$) in an alkaline solution, a method of oxidizing a ferrous hydroxide solution with air, a method of reducing iron oxide ($\alpha$-$Fe_2O_3$) or iron hydroxide ($\alpha$-FeOOH) under a hydrogen atmosphere and the like have been known from long ago. However, there are problems that the obtained magnetite particles tend to become coarse, and it is difficult to obtain nanometer order magnetite having a primary particle size of 100 nm or less, and dry heat treatment or high temperature are required.

As characteristics of nanoparticles, particles generally tend to aggregate due to the influence of surface energy as the particle diameter decreases. In addition, since the magnetite particles have magnetic aggregability, improvement of dispersibility is a particularly serious problem. Single crystal magnetite particles having the most stable surface state in their average particle size are desirable for improving the dispersibility, and improvement of durability against temperature, light or solvent and magnetic characteristics and the like are expected. Thus, methods of producing single crystal magnetite particles have been proposed for a long time as follows.

Patent Literature 1 discloses a method of forming magnetite particles comprising adding an oxidizing agent to an alkaline aqueous solution subjected to deoxidation treatment, and adding a soluble amount of a divalent iron ion to the alkaline aqueous solution to which the oxidizing agent is added, and stirring the alkali aqueous solution to which the divalent iron ion is added.

Patent Literature 2 discloses a method of neutralizing the ferric salt aqueous solution with an alkali aqueous solution at a temperature in the range of 5 to 40° C., filtering the formed ferric hydroxide, washing the ferric hydroxide with water, dispersing the ferric hydroxide in water, and adding to the dispersion a reducing agent in an amount sufficient to reduce one third of the total ferric ions to form a slurry having a pH in the range of 7 to 11, and then subjecting the slurry to hydrothermal reaction at a temperature of 120 to 200° C.

In the method as described in Patent Literature 1 or Patent Literature 2, a long period of time is required to obtain single crystal magnetite. In addition, due to using a batch method, in order to obtain magnetite in the tank, it is difficult to make the reaction while maintaining the molar ratio $Fe^{2+}/Fe^{3+}$ of $Fe^{2+}$ ions and $Fe^{3+}$ ions strictly at $Fe^{2+}/Fe^{3+}=0.5$. For this reason, it is difficult to obtain $Fe_3O_4$ nanoparticles uniformly, and in some cases, there is a risk that hematite ($\alpha$-$Fe_2O_3$) or goethite ($\alpha$-FeOOH) is contaminated. Also, because of the batch method, it is very difficult to obtain nanoparticles having uniform particle size distribution and particle shape due to temperature gradient and concentration gradient in the reaction tank for mass production.

On the other hand, Patent Literature 3 discloses a method of collecting single crystal magnetite from an aquatic bacterium having a plurality of single crystal magnetite ($Fe_3O_4$) in one body which is called a magnetotactic bacterium. In the method of collecting substances from such organisms, it is difficult to supply single crystal magnetite stably, and such method is considered to be difficult to use industrially.

As methods of producing cerium oxide, a method of co-precipitating cerium ($Ce^{3+}$) ions or cerium ($Ce^{4+}$) ions in an alkaline solution, hydrothermal synthesis at a temperature of 200° C. or higher for a long time, and the like have been known. However, there are problems that the obtained cerium oxide particles tend to become coarse, and it is difficult to obtain nanometer order magnetite having a primary particle size of 50 nm or less, and dry heat treatment or high temperature are required.

As characteristics of nanoparticles, particles generally tend to aggregate due to the influence of surface energy as the particle diameter decreases. For improving the dispersibility, high crystallinity is desirable, and particularly, single crystal oxide particles having the most stable surface state in their average particle size are most desirable. By the improvement of crystallinity or single crystals, improvement of durability against temperature, light or solvent and impact resistance and the like are expected, and further characteristics of the particles tend to be uniformized. Thus, methods of producing single crystal cerium oxide particles have been proposed for a long time as follows.

Patent Literature 5 discloses a method of mixing an alkali base with an aqueous solution of cerium (III) nitrate and, and after ripening, subjecting it to a dry heat treatment within a range of 650 to 1,000° C.

Patent Literature 6 discloses a method of precipitating a cerium salt in the presence of a mixed solvent of an organic solvent and water, and subjecting the obtained cerium hydroxide to hydrothermal reaction at 180° C. to 300° C.

In the method as described in Patent Literature 5 or Patent Literature 6, a high temperature and a long period of time are required to obtain single crystal cerium oxide. In addition, due to using a batch method, it is difficult to secure reaction uniformity. For this reason, it is difficult to control crystallinity of each particle because of formation of coarse particles by dry heat treatment, or ununiformity of temperature or concentration in hydrothermal reaction. Also, because of the batch method, it is very difficult to obtain nanoparticles having uniform particle size distribution and particle shape due to temperature gradient and concentration gradient in the reaction tank for mass production In order to solve the above problems, the present applicant proposed a method of producing magnetic microparticles by introducing at least two kinds of fluids to be processed in the space between the processing surfaces which are disposed so as to face each other, being capable of approaching to and separating from each other, at least one of which rotates relatively to the other, and mixing the fluids (Patent Literature 4). In the invention of Patent Literature 4, magnetic microparticles such as black iron oxide ($Fe_3O_4$: magnetite) and yellow iron oxide (FeOOH: goethite) are obtained by reacting a magnetic law material and a magnetic microparticle precipitation agent in the thin film fluid formed between the above processing surfaces. Because uniformity of temperature is high in the thin film fluid, and uniformity in stirring of the reaction tank is very high, Patent Literature 4 provides a method of producing magnetic microparticles which forms monodispersed magnetic microparticles, and does not have clogging of products due to self-discharging ability, does not require high pressure, and has high productivity.

In order to solve the above problems, the present applicant proposed a method of producing ceramic nanoparticles by introducing a fluid containing a ceramic raw material and a fluid containing a pH adjusting agent in the space between the processing surfaces which are disposed so as to face each other, being capable of approaching to and separating from each other, at least one of which rotates relatively to the other, and mixing the fluids (Patent Literature 7). In the invention of Patent Literature 7, ceramic nanoparticles are obtained by hydrolyzing a ceramic raw material in the thin film fluid formed between the above processing surfaces. Because uniformity of temperature is high in the thin film fluid, and uniformity in stirring of the reaction tank is very high, Patent Literature 7 provides a method of producing ceramic nanoparticles which forms monodispersed ceramic nanoparticles according to the purpose, and does not have clogging of products due to self-discharging ability, does not require high pressure, and has high productivity.

Patent Literature 4 discloses that control of particle diameter or monodispersity, or crystallinity or crystallinity index of the obtained magnetic microparticles can be adjusted by changing rotation speed of the processing surface, distance between the processing surfaces, and flow rate and temperature of the thin film fluid, or the raw material concentration. Patent Literature 7 discloses that control of particle diameter or monodispersity, or crystalline form of the obtained ceramic nanoparticles can be adjusted by changing rotation speed of the processing surface, distance between the processing surfaces, and flow rate of the thin film fluid, or the raw material concentration or temperature and the like.

Therefore, the present inventors have continued the study to improve the crystallinity of the oxide particles, and more desirably to obtain single crystal oxide particles by controlling these conditions. However, under relatively small pressure conditions (0.10 MPaG or less), single crystal oxide particles could not be obtained simply by controlling temperature of the thin film fluid. After that, as a result of intensive study by the present inventors after trial and error, the present inventors have found that crystallinity of the oxide particles can be remarkably improved by the conditions that the temperature of each fluid introduced between the processing surfaces or the temperature at the time of mixing each fluid is set to a temperature higher than a predetermined temperature, and particularly the conditions that under a relatively high pressure condition (higher than 0.10 MPaG), the temperature of each fluid introduced between the processing surfaces or the temperature at the time of mixing each fluid is set to a temperature higher than a predetermined temperature, and thus the present inventors have reached the present invention. For example, the present inventors have found in the production of magnetite particles that crystallinity of the magnetite particles can be remarkably improved by the conditions that the temperature of the magnetite raw material fluid introduced between the processing surfaces is set to a temperature higher than a predetermined temperature, and particularly the conditions that under a relatively high pressure condition (higher than 0.10 MPaG), the temperature of the magnetite raw material fluid introduced between the processing surfaces is set to a temperature higher than a predetermined temperature. In the production of the cerium oxide particles, the present inventors have found that crystallinity of the cerium oxide particles discharged from the space between the processing surfaces can be controlled by changing at least one of the temperature of the cerium oxide precipitation solvent introduced between the processing surfaces and the temperature at the time of mixing the cerium oxide raw material liquid and the cerium oxide precipitation solvent. Specifically, the present inventors have found that crystallinity of the cerium oxide particles discharged from the space between the processing surfaces can be controlled by setting at least one of the temperature of the cerium oxide precipitation solvent introduced between the processing surfaces and the temperature at the time of mixing the cerium oxide raw material liquid and the cerium oxide precipitation solvent higher than a predetermined temperature. Particularly, the present inventors have found that crystallinity of the cerium oxide particles can be remarkably improved by the conditions that the condition that under a relatively high pressure condition (higher than 0.10 MPaG), at least one of the temperature of the cerium oxide precipitation solvent introduced between the processing surfaces and the temperature at the time of mixing the cerium oxide raw material liquid and the cerium oxide precipitation solvent higher than a predetermined temperature.

CITATION LIST

Patent Literature

Patent Literature 1: JP 2006-219353
Patent Literature 2: JP H08-325098
Patent Literature 3: JP S61-081778
Patent Literature 4: JP 2009-132994
Patent Literature 5: JP 2011-511751
Patent Literature 6: JP 2005-519845
Patent Literature 7: WO 2009/008392

SUMMARY OF THE INVENTION

Technical Problem

An object of the present invention is to provide a method of producing oxide particles, which can improve crystallinity of the obtained oxide particles, more desirably can form single crystal oxide particles stably, in a method of precipitating and producing oxide particles in a thin film fluid formed between the processing surfaces which are disposed so as to face each other, being capable of approaching to and separating from each other, at least one of which rotates relatively to the other.

Solution to the Problem

The present invention provides a method of producing oxide particles, which comprises at least two fluids to be processed including the first fluid and the second fluid, wherein one of the first fluid and the second fluid is an oxide raw material liquid obtained by mixing at least an oxide particle raw material with a solvent, and the other of the first fluid and the second fluid is an oxide precipitation solvent obtained by mixing at least a basic substance with a solvent, and wherein the method comprises mixing the first fluid and the second fluid in the space between the processing surfaces which are disposed so as to face each other, being capable of approaching to and separating from each other, at least one of which rotates relatively to the other; and discharging the mixed fluid in which the oxide particles are precipitated from the space between the processing surfaces; and wherein the method controls crystallinity of the oxide particles discharged from the space between the processing surfaces, by changing at least one selected from the group consisting of the temperature of the first fluid to be introduced in the space between the processing surfaces, the temperature of the second fluid to be introduced in the space between the processing surfaces, and the temperature of the first fluid and the second fluid at the time of mixing.

In the present invention, the interval between the processing surfaces is preferably set by a pressure balance between the force applied in the direction of approximating the processing surfaces and the pressure of the mixed fluid.

The present invention may be performed so that the first fluid passes in the space between the processing surfaces while forming a thin film fluid, and the second fluid is introduced in the space between the processing surfaces from an opening formed in at least one of the processing surfaces through a separate independent introduction path from the flow path through which the first fluid is introduced in the space between the processing surfaces, and the first fluid and the second fluid are mixed in the space between the processing surfaces.

The present invention may be performed to control crystallinity of the obtained oxide particles, by changing at least one selected from the group consisting of the temperature of the first fluid passing in the space between the processing surfaces while forming a thin film fluid, the temperature of the second fluid to be introduced in the space between the processing surfaces from the opening, and the temperature of the first fluid and the second fluid at the time of mixing. The first fluid refers to a fluid to be introduced from the first introduction part of the fluid processing apparatus described later in the space between the processing surfaces, and the second fluid refers to a fluid to be introduced from the second introduction part of the fluid processing apparatus in the space between the processing surfaces.

In the present invention, the temperature of the first fluid to be introduced in the space between the processing surfaces is preferably 50° C. or higher. The temperature of the first fluid to be introduced in the space between the processing surfaces is more preferably a temperature higher than 100° C. Here, the temperature of the fluid which flow rate per unit time to be introduced in the space between the processing surfaces is higher among the first fluid and the second fluid, is preferably 50° C. or higher. The temperature of the fluid which flow rate per unit time to be introduced in the space between the processing surfaces is higher among the first fluid and the second fluid, is more preferably 100° C. or higher.

The present invention may be performed so that the first fluid contains one or a plurality of solvents, and the temperature of the first fluid to be introduced in the space between the processing surfaces is a temperature higher than the standard boiling point of the solvent having the lowest standard boiling point among one or a plurality of solvents contained in the first fluid.

In the production method of the present invention, the interval between the processing surfaces may be preferably set by the pressure balance between the force applied in the direction of approximating the processing surfaces and the pressure of the mixed fluid. The introduction pressure of the first fluid at the time of introduction in the space between the processing surfaces may exceed the standard pressure (i.e. 1 atm=0.101325 MPa). Under an introduction condition of relatively high pressure exceeding the standard pressure, the temperature of the first fluid to be introduced in the space between the processing surfaces may be a temperature higher than the standard boiling point of the first fluid, and lower than the boiling point under the introduction pressure.

In the present invention, the boiling point means the temperature when saturated vapor coexists with its liquid phase in equilibrium under a constant pressure, and the standard boiling point means the boiling point under the pressure of 1 atm.

The temperature of the oxide precipitation solvent, the temperature of the oxide raw material liquid, and the flow ratio of the oxide raw material liquid and the oxide precipitation solvent can be appropriately changed. It is desirable that the temperature at the time of mixing is the introduction temperature between the processing surfaces c (° C.) of the mixed fluid which is calculated by the following equation, and the introduction temperature between the processing surfaces c (° C.) is higher than 100° C.:

$$c = (a1 \times a2 + b1 \times b2)/(a2 + b2)$$

wherein a1: introduction temperature of the oxide raw material liquid (° C.)

a2: introduction flow rate of the oxide raw material liquid (ml/min)

b1: introduction temperature of the oxide precipitation solvent (° C.)

b2: introduction flow rate of the oxide precipitation solvent (ml/min).

More preferably, the temperature of the second fluid to be introduced in the space between the processing surfaces is a temperature higher than 100° C.

Further, the present invention may be performed so that the second fluid contains one or a plurality of solvents, and the temperature of the second fluid to be introduced in the space between the processing surfaces is a temperature higher than the standard boiling point of the solvent having the lowest standard boiling point among one or a plurality of solvents contained in the second fluid.

Here, in the case that the temperature of only one of the first fluid and the second fluid is raised, the fluid having the raised temperature may be any one of the first fluid and the second fluid. Preferably, the temperature of the fluid which flow rate per unit time to be introduced in the space between the processing surfaces is higher among the first fluid and the second fluid, is raised.

As described above, in the production method of the present invention, the interval between the processing surfaces may be preferably set by the pressure balance between the force applied in the direction of approximating the processing surfaces and the pressure of the mixed fluid. Both of the introduction pressure of the first fluid and the introduction pressure of the second fluid at the time of introduction in the space between the processing surfaces may exceed the standard pressure (i.e. 1 atm=0.101325 MPa). Under an introduction condition of relatively high pressure exceeding the standard pressure, the temperature of the first fluid to be introduced in the space between the processing surfaces may be to a temperature higher than the standard boiling point of the first fluid, and lower than the boiling point under the introduction pressure, and the temperature of the second fluid to be introduced in the space between the processing surfaces may be to a temperature higher than the standard boiling point of the second fluid, and lower than the boiling point under the introduction pressure.

The present invention may be performed so that the ratio d/D of the average crystal diameter (d) obtained by X-ray diffraction measurement of the oxide particles to the average particle diameter (D) obtained by transmission electron microscope observation of the oxide particles is 0.50 or more.

In addition, the present invention may be performed so that 90% or more of the obtained oxide particles are nano-size single crystal oxide particles. Further, the present invention may be performed so that a temperature of either one of the first fluid and the second fluid is 175° C. or lower.

In the present invention, the oxide particles have preferably a primary particle diameter of 20 nm or less. Further, the present invention may be performed so that the oxide particles are oxide particles which do not require a dry heat treatment. In the present invention, other elements may be solid-soluted in or compounded with the oxide particles.

Also, in the present invention, pH of the mixed fluid is preferably controlled within a predetermined range.

The present invention may be performed so that the oxide particle raw material is magnetite particle raw material, and the oxide particles are magnetite particles. In this case, in the present invention, pH of the oxide raw material liquid is preferably 4 or less, and pH of the oxide precipitation solvent may be preferably 12 or more. In the present invention, pH of the mixed fluid is preferably 9 or more.

In performing the present invention, it has been revealed by the present inventors that especially when pH of the mixed fluid is 9 or more, the shape of the magnetite particles is controlled so as to approach a spherical shape by decreasing pH of the mixed fluid, and the shape of the magnetite particles is controlled so as to approach a square shape by increasing pH of the mixed fluid.

Where the oxide particle raw material is the magnetite particle raw material and the oxide particles are magnetite particles, a molar ratio of $Fe^{2+}$ ion and $Fe^{3+}$ ion contained in the oxide raw material liquid: $Fe^{2+}/Fe^{3+}$ is preferably 0.500±0.010.

The present invention may be performed so that the magnetite particle raw material is at least one selected from the group consisting of iron (II) sulfate ($FeSO_4$), iron (III) sulfate ($Fe_2(SO_4)_3$) or a hydrate thereof.

The present invention may be performed so that the oxide particle raw material is cerium oxide particle raw material and the oxide particles are cerium oxide particles. Where the oxide particle raw material is the cerium oxide particle raw material and the oxide particles are cerium oxide particles, in the present invention, pH of the oxide raw material liquid is preferably 4 or less, and pH of the oxide precipitation solvent is preferably 10 or more. Further, in the present invention, pH of the mixed fluid is preferably in the range of 6.0 to 9.0.

The present invention may be performed so that the cerium oxide particle raw material is at least one selected from the group consisting of cerium (III) nitrate ($Ce(NO_3)_3$), ammonium cerium (IV) nitrate ($(NH_4)_2[Ce(NO_3)_6]$) or a hydrate thereof.

In the case that the oxide particles in the present invention are magnetite particles, the present invention may be understood as follows.

The present invention provides a method of producing magnetite particles, comprising mixing the magnetite raw material liquid in which at least a magnetite raw material is mixed with a solvent, and the magnetite precipitation solvent in which at least a basic substance is mixed with a solvent in the space between the processing surfaces which are disposed so as to face each other, being capable of approaching to and separating from each other, at least one of which rotates relatively to the other; and discharging the mixed fluid in which the magnetite particles are precipitated from the space between the processing surfaces. The present invention is characterized in that the temperature of the magnetite raw material to be introduced in the space between the processing surfaces is 50° C. or higher.

The interval between the processing surfaces may be preferably set by the pressure balance between the force applied in the direction of approximating the processing surfaces and the pressure of the mixed fluid.

More preferably, temperature of the magnetite raw material liquid to be introduced in the space between the processing surfaces is to a temperature higher than 100° C.

The present invention may be performed so that the magnetite raw material liquid contains one or a plurality of solvents, and the temperature of the magnetite raw material liquid to be introduced in the space between the processing surfaces is to a temperature higher than the standard boiling point of the solvent having the lowest standard boiling point among one or a plurality of solvents contained in the magnetite raw material liquid.

In the case that the oxide particles in the present invention are cerium oxide particles, the present invention may be understood as follows.

The present invention provides a method of producing cerium oxide particles, comprising mixing the cerium oxide raw material liquid in which at least a cerium oxide raw material is mixed with a solvent, and the cerium oxide precipitation solvent in which at least a basic substance is mixed with a solvent in the space between the processing surfaces which are disposed so as to face each other, being capable of approaching to and separating from each other, at least one of which rotates relatively to the other; and discharging the mixed fluid in which the cerium oxide particles are precipitated from the space between the processing surfaces; and wherein the method controls crystallinity of the cerium oxide particles discharged from the space between the processing surfaces, by changing at least one selected from the group consisting of the temperature of the cerium oxide precipitation solvent to be introduced in the space between the processing surfaces, and the temperature of the cerium oxide raw material liquid and the cerium oxide precipitation solvent at the time of mixing.

The interval between the processing surfaces may be preferably set by the pressure balance between the force applied in the direction of approximating the processing surfaces and the pressure of the mixed fluid.

In the present invention, temperature of the cerium oxide precipitation solvent to be introduced in the space between the processing surfaces is preferably 50° C. or higher, and temperature of the cerium oxide precipitation solvent to be introduced in the space between the processing surfaces is more preferably a temperature higher than 100° C.

The present invention may be performed so that the cerium oxide precipitation solvent contains one or a plurality of solvents, and the temperature of the cerium oxide precipitation solvent to be introduced in the space between the processing surfaces is higher than the standard boiling point of the solvent having the lowest standard boiling point among one or a plurality of solvents contained in the cerium oxide precipitation solvent.

Advantageous Effects of the Invention

The present invention provides a production method which can supply continuously and stably oxide particles (particularly, nanosize particles) having a high crystallinity and a relatively high purity by a method suitable for mass production without requiring complicated chemical reactions or heat treatment. The production method also enables that other an element is solid-soluted in or compounded with the oxide particles.

Specifically, the present invention provides a production method which can supply stably magnetite particles (particularly, nanosize particles) having a high crystallinity and a relatively high purity without containing substantially iron oxides other than magnetite ($Fe_3O_4$) by a method suitable for mass production without requiring complicated chemical reactions using oxidizing agents or reducing agents or heat treatment.

The present invention provides a production method which can supply continuously and stably cerium oxide particles (particularly, nanosize particles) having a high crystallinity and a relatively high purity without containing substantially cerium hydroxide ($Ce(OH)_2$, $Ce(OH)_3$, $Ce(OH)_4$) by a method suitable for mass production without requiring complicated chemical reactions or heat treatment. The production method also enables that another element such as iron is solid-soluted in or compounded with the cerium oxide particles.

DESCRIPTION OF THE INVENTION

Hereinafter, an embodiment of the present invention is explained with reference to the FIGs.

(Single Crystal Oxide Particles)

Figure 6:
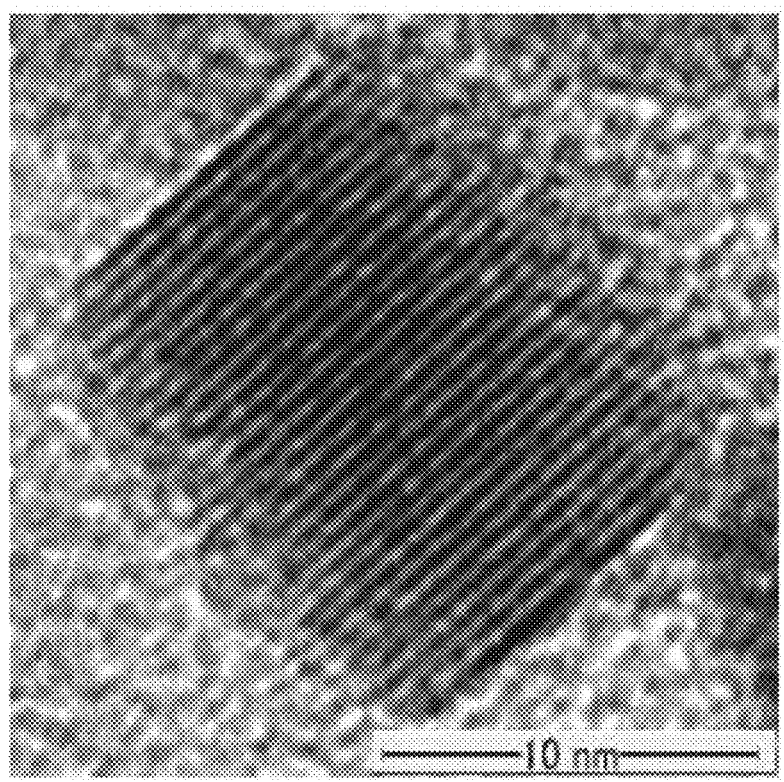
FIG. 6 shows a TEM photograph of the single crystal magnetite particles obtained in Example X10 of the present invention.
Figure 12:
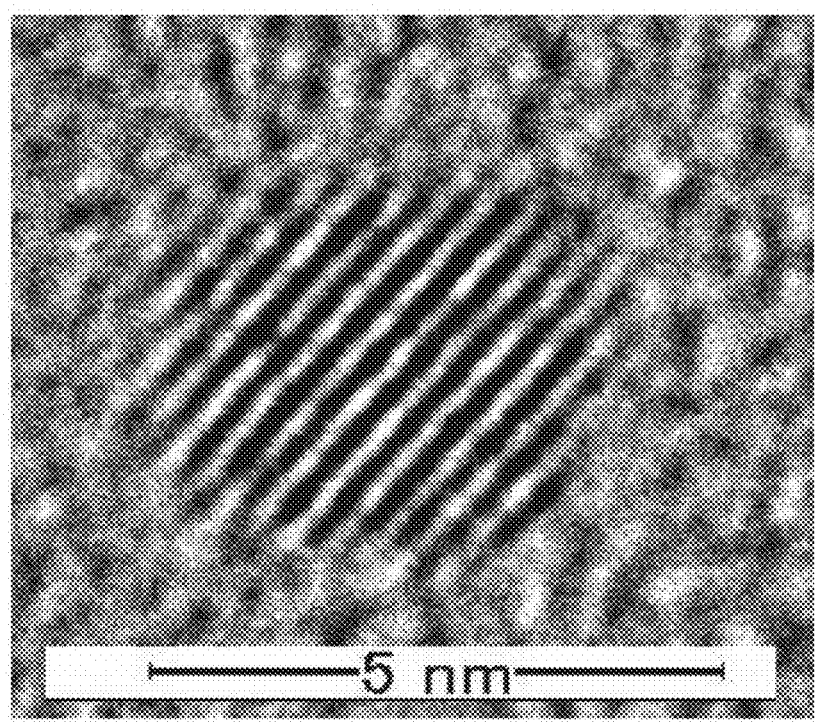
FIG. 12 shows a TEM photograph of the single crystal cerium oxide particles obtained in Example Y9 of the present invention.

Single crystal oxide particles in the present invention refers to the oxide particles, in a transmission electron microscope (TEM) photograph of which interference fringes of the crystal lattice (atomic arrangement in the crystal, hereinafter, also referred to as "lattice stripe") are observed in one direction as shown in, for example, those of the oxide particles obtained in the examples of the present application in FIG. 6 and FIG. 12. The oxide particles, in a TEM photograph of which lattice stripes are disturbed or the grain boundaries are observed are not single crystals. As a method of evaluating that the obtained oxide particles are single crystals, it can be confirmed by a method of direct observation by TEM or scanning transmission electron microscope (STEM), or a method of calculating the ratio d/D of the average crystal diameter (d) obtained by X-ray diffraction measurement (XRD measurement) to the average particle diameter (D) obtained by TEM, STEM or scanning electron microscope (SEM), or the like.

(Oxide)

The oxide in the present invention is not particularly limited, but includes, for example, a metal oxide or a nonmetal oxide represented by the formula $M_xO_y$, wherein x and y are each an arbitrary number, and various solvates thereof, and a composition containing these as a main component. The above oxides include peroxides or super oxides and the like.

The metal or nonmetal constituting the oxide is not particularly limited, but includes preferably all elements on the chemical periodic table. Examples of the metal elements include Ti, Fe, Ce, W, Pt, Au, Cu, Ag, Pd, Ni, Mn, Co, Ru, V, Zn, Zr, Al, Mg, Y, Cd, Cr, Mo, In and the like. Examples of the nonmetallic elements include B, Si, Ge, N, C and the like. Each of these elements may form an oxide individually, or a complex oxide may be formed with a plurality of elements.

Examples of the metal oxide or nonmetal oxide represented by the formula $M_xO_y$, include $TiO_2$, $FeO$, $Fe_2O_3$, $Fe_3O_4$, $CeO_2$, $SnO$, $SnO_2$, $Al_2O_3$, $SiO_2$, $ZnO$, $CoO$, $Co_3O_4$, $Cu_2O$, $CuO$, $Ni_2O_3$, $NiO$, $MgO$, $Y_2O_3$, $VO$, $VO_2$, $V_2O_3$, $V_2O_5$, $MnO$, $MnO_2$, $CdO$, $ZrO_2$, $PdO$, $PdO_2$, $MoO_3$, $MoO_2$, $Cr_2O_3$, $CrO_3$, $In_2O_3$, $RuO_2$, $WO_3$ and the like.

(Oxide Particle Raw Material)

The oxide particle raw material in the present invention is not particularly limited. Any substances can be used as long as the substances become the oxide in a method such as a reaction, crystallization, precipitation, co-precipitation or the like. In the present invention, hereinafter, the above method is referred to as precipitation. The oxide particle raw material includes, for example, an elemental metal or nonmetal, and a compound such as a salt of metal or nonmetal, and the like. The oxide particle raw material is preferably a substance which generates a metal or nonmetal ion in a solution. The above metal or nonmetal is not particularly limited, but may be, for example, the same element as the metal or nonmetal constituting the above oxide. The above metal or nonmetal may be a single element, or an alloy composed of a plurality of elements, or a substance containing a nonmetal element in a metal element. In the present invention, the above metal compound is referred to as a metal compound. The metal compound or the nonmetal compound is not particular limited, but includes, for example, a salt, an oxide, a hydroxide, a hydroxide oxide, a nitride, a carbide, a complex, an organic salt, an organic complex, an organic compound of the metal or nonmetal, or a hydrate thereof, an organic solvate thereof and the like. The metal salt or nonmetal salt is not limited, but includes a nitrate, a nitrite, a sulfate, a sulfite, a formate, an acetate, a citrate, a phosphate, a phosphite, a hypophosphite, a chloride, an oxy salt, or an acetylacetonate of the metal or nonmetal, or a hydrate thereof, an organic solvate thereof and the like. The organic compound includes an alkoxide of the metal or nonmetal, and the like. These metal compounds or nonmetal compounds may be used alone or in combination of two or more thereof.

(Basic Substance)

A basic substance in the present invention includes a metal hydroxide such as sodium hydroxide, potassium hydroxide and the like, a metal alkoxide such as sodium methoxide, sodium isopropoxide and the like, an amine compound such as triethylamine, diethylaminoethanol, diethylamine and the like, ammonia, and the like.

(Acidic Substance)

An acidic substance in the present invention includes an inorganic acid such as aqua regia, hydrochloric acid, nitric acid, fuming nitric acid, sulfuric acid, fuming sulfuric acid, and an organic acid such as formic acid, acetic acid, chloroacetic acid, dichloroacetic acid, oxalic acid, trifluoroacetic acid, trichloroacetic acid and the like.

(Preparation of Oxide Raw Material Liquid and Preparation of Oxide Precipitation Solvent)

In the present invention, the oxide raw material liquid may be prepared by mixing, dissolving or molecularly dispersing at least an oxide particle raw material in a solvent. The oxide precipitation solvent may be prepared by mixing, dissolving or molecularly dispersing a basic substance in a solvent. A solvent used in them includes, for example, water or an organic solvent, or a mixed solvent consisting of a plurality of these solvents. Water includes tap water, ion-exchanged water, pure water, ultrapure water, RO water and the like. An organic solvent includes an alcohol compound solvent, an amide compound solvent, a ketone compound solvent, an ether compound solvent, an aromatic compound solvent, carbon disulfide, an aliphatic compound solvent, a nitrile compound solvent, a sulfoxide compound solvent, a halogen compound solvent, an ester compound solvent, an ionic liquid, a carboxylic acid compound, and a sulfonic acid compound, and the like. The solvent may be used alone or in combination of two or more thereof. An alcohol compound solvent includes a monohydric alcohol such as methanol and ethanol, a polyol such as ethylene glycol and propylene glycol, and the like. As described later, water or a mixed solvent of water and polyol is preferably used to prepare the oxide raw material liquid and the oxide precipitation solvent, because the introduction pressure of the oxide raw material liquid and/or the oxide precipitation solvent at the time of introduction in the space between processing surfaces and the boiling point of the oxide raw material liquid and/or the oxide precipitation solvent are easily adjusted. Further, these solvents may be used after removing oxygen in the solvent by a method such as nitrogen bubbling. Further, if necessary, the acidic substance may be mixed with the oxide raw material liquid, as long as it does not adversely affect production of the oxide particles. It is effective when increase of neutralization heat is desired at the time of precipitation. In this way, when the processing between the processing surfaces at a higher temperature by reaction heat is desired, an oxide particle raw material, a basic substance, and an acidic substance, and the like may be used preferably so that the reaction of combination of a strong acid such as nitric acid and sulfuric acid and a strong base such as a metal hydroxide occurs. In contrast to the above case, when it is desired to minimize reaction heat as much as possible, an oxide particle raw material, a basic substance, and an acidic substance, and the like may be used preferably so that the reaction of combination of a weak acid such as acetic acid and a weak base such as dimethylaminoethanol occurs.

(Preparation Apparatus)

For preparation of the oxide raw material liquid or the oxide precipitation solvent in the present invention, it is desirable to use a machine to achieve homogeneous mixing by adding a shearing force or the like to the fluid, for example, a machine to rotate a stirrer of various shapes including rod like, plate like and propeller like shapes in a tank, a machine equipped with a screen which rotates relative to a stirrer, or the like. As a preferable example of a rotary dispersing machine, the stirring machine disclosed in JP 5147091 can be applied.

Further, the rotary dispersing machine may be a batch type machine or a continuous type machine. When carried out in continuous mode, the continuous type machine may be a machine in which fluids are continuously supplied to and discharged from a stirring tank, or a machine using a continuous mixer without using a stirring tank, or a machine controlling mixing energy appropriately using a known stirrer or stirring means. The stirring energy is explained in detail in JP H04-114725 filed by the present applicant. Stirring methods in the present invention are not particularly limited, and various stirring machines such as a shearing type machine, a friction type machine, a high pressure jet type machine, an ultrasonic machine, and a dissolver, an emulsifier, a dispersing machine, a homogenizer and the like can be used in the present invention. Examples of the rotary dispersing machine include continuous emulsification machines such as Ultra-Turrax (IKA Works, Inc.), Polytron (Kinematica AG), TK Homomixer (Primix Corporation), Ebara Milder (Ebara Corporation), TK Homomic Line Flow (Primix Corporation), Colloid Mill (Shinko-Pantech Co., Ltd.), Thrasher (Nippon Coke & Engineering Co., Ltd.), Trigonal Wet Type Micropulverizer (Mitsui Miike Machinery Co., Ltd.), Cavitron (Eurotech, Ltd.), Fineflow Mill (Pacific Machinery & Engineering Co., Ltd.) and the like; and batch type or dual type emulsification machines such as CLEARMIX (M technique Co., Ltd.), CLEARMIX Dissolver (M technique Co., Ltd.), Filmix (Primix Corporation) and the like. Further, preparation of the oxide raw material liquid or the oxide precipitation solvent is preferably performed by using a stirring machine equipped with a rotating stirring blade, especially above mentioned CLEARMIX (M Technique Co., Ltd.) and CLEARMIX Dissolver (M Technique Co., Ltd.).

(Dispersing Agent, Etc.)

In the present invention, various dispersing agents and surfactants may be used depending on the purpose and necessity. Not particularly limited, as a surfactant or dispersant, various generally used commercially available products, a finished product, a newly synthesized product and the like may be used. The examples are an anionic surfactant, a cationic surfactant, a nonionic surfactant, a dispersant such as various polymers and the like. These may be used alone or in combination of two or more thereof. The surfactant or dispersant may be included in either or both of the oxide raw material liquid and the oxide precipitation solvent. In addition, the surfactant or dispersant may be included in the third fluid different from the oxide raw material liquid and the oxide precipitation solvent which is explained later.

Further, in the present invention, single crystal ratio of the oxide particles obtained by mixing the oxide raw material liquid and the oxide precipitation solvent can be increased, by preparing the oxide raw material liquid or the oxide precipitation solvent so as to increase the thermal energy when mixing the oxide raw material liquid and the oxide precipitation solvent. For example, in the case that the oxide raw material liquid is acidic and the oxide precipitation solvent is basic, oxide particles can be easily obtained, because the heat generated by the reaction heat such as neutralization heat increases when mixing the oxide raw material liquid and the oxide precipitation solvent.

As described above, the present invention is not limited to (X) method of producing magnetite particles and (Y) method of producing cerium oxide particles. In order to enhance the understanding more specifically, their production methods are explained in the order of (X) and (Y).

(X) Method of Producing Magnetite Particles

First, a method of producing magnetite particles which is one of embodiments of the present invention, is specifically described. Hereinafter, in the method of producing magnetite particles, the oxide raw material liquid is referred to as the magnetite raw material liquid, the oxide precipitation solvent is referred to as the magnetite precipitation solvent, and the oxide particle raw material is referred to as the magnetite particle raw material.

(Single Crystal Magnetite Particles)

Single crystal magnetite particles in the present invention are the magnetite particles, in a transmission electron microscope (TEM) photograph of which interference fringes of the crystal lattice (atomic arrangement in the crystal, hereinafter, also referred to as "lattice stripe") are observed in one direction as shown in, for example, those of the magnetite particles obtained in Example X1 of the present application shown in FIG. 6. The magnetite particles, in a TEM photograph of which lattice stripes are disturbed or the grain boundaries are observed are not single crystals. As a method of evaluating that the obtained magnetite particles are single crystals, it can be confirmed by a method of direct observation by TEM or scanning transmission electron microscope (STEM), or a method of calculating the ratio d/D of the average crystal diameter (d) obtained by X-ray diffraction measurement (XRD measurement) to the average particle diameter (D) obtained by TEM, STEM or scanning electron microscope (SEM), or the like.

(Magnetite Particle Raw Material)

The magnetite raw material used in producing magnetite particles in the present invention is not particularly restricted, but a substance which generates $Fe^{2+}$ ion or $Fe^{3+}$ ion may be used in a solution. Such substance is not particularly restricted, but a substance which generates $Fe^{2+}$ ion in a solution includes an elementary iron, an iron compound such as an iron salt and the like. Examples of a substance which generates $Fe^{2+}$ ion in a solution, are an inorganic iron (II) salt such as iron (II) sulfate ($FeSO_4$), iron (II) nitrate ($Fe(NO_3)_2$), iron (II) chloride ($FeCl_2$) and the like, an organic iron (II) salt such as iron (II) acetate ($Fe(CH_3COO)_2$), iron (II) citrate ($Fe(C_6H_5O_7M_2)$: M is an alkali metal or ammonium, etc.) and the like, and the like. A hydrate or solvate of the substance which generates $Fe^{2+}$ ion in a solution may be also used. The substance may be used alone, or a plurality of the substances may be mixed and used. A substance which generates $Fe^{3+}$ ion in a solution includes an elementary iron, an iron compound such as an iron salt and the like similarly to a substance which generates $Fe^{2+}$ ion in a solution. More specifically, for example, examples of a substance which generates $Fe^{3+}$ ion in a solution, are an inorganic iron (III) salt such as iron (III) sulfate ($Fe_2(SO_4)_3$), iron (III) nitrate ($Fe(NO_3)_3$), iron (III) chloride ($FeCl_3$) and the like, an organic iron (III) salt such as iron (III) acetate ($Fe(CH_3COO)_3$ and $Fe(OH)(CH_3COO)_2$), iron (III) citrate ($C_6H_5FeO_7$) and the like, and the like. A hydrate or solvate of the substance which generates $Fe^{3+}$ ion in a solution may be also used. The substance may be used alone, or a plurality of the substances may be mixed and used. Because of easy improvement of crystallinity of the produced magnetite, at least one selected from the group of iron (II) sulfate ($FeSO_4$), iron (III) sulfate ($Fe_2(SO_4)_3$), or a hydrate thereof is preferably used as the above magnetite particle raw material.

(Basic Substance)

A basic substance in the present invention includes a metal hydroxide such as sodium hydroxide, potassium hydroxide and the like, a metal alkoxide such as sodium methoxide, sodium isopropoxide and the like, an amine compound such as triethylamine, diethylaminoethanol, diethylamine and the like, ammonia, and the like. It is preferable to use sodium hydroxide, potassium hydroxide or ammonia as a basic substance because of easy improvement of crystallinity of the produced magnetite.

(Acidic Substance)

An acidic substance in the present invention includes an inorganic acid such as aqua regia, hydrochloric acid, nitric acid, fuming nitric acid, sulfuric acid, fuming sulfuric acid, and an organic acid such as formic acid, acetic acid, chloroacetic acid, dichloroacetic acid, oxalic acid, trifluoroacetic acid, trichloroacetic acid and the like.

(Preparation of Magnetite Raw Material Liquid and Preparation of Magnetite Precipitation Solvent)

In the present invention, the magnetite raw material liquid may be prepared by mixing, dissolving or molecularly dispersing at least a magnetite particle raw material in a solvent. The magnetite precipitation solvent may be prepared by mixing, dissolving or molecularly dispersing a basic substance in a solvent. A solvent used in them includes, for example, water or an organic solvent, or a mixed solvent consisting of a plurality of these solvents. Water includes tap water, ion-exchanged water, pure water, ultrapure water, RO water and the like. An organic solvent includes an alcohol compound solvent, an amide compound solvent, a ketone compound solvent, an ether compound solvent, an aromatic compound solvent, carbon disulfide, an aliphatic compound solvent, a nitrile compound solvent, a sulfoxide compound solvent, a halogen compound solvent, an ester compound solvent, an ionic liquid, a carboxylic acid compound, and a sulfonic acid compound, and the like. The solvent may be used alone or in combination of two or more thereof. An alcohol compound solvent includes a monohydric alcohol such as methanol and ethanol, a polyol such as ethylene glycol and propylene glycol, and the like. As described later, water or a mixed solvent of water and polyol is preferably used to prepare the magnetite raw material liquid and the magnetite precipitation solvent, because the introduction pressure of the magnetite raw material liquid and/or the magnetite precipitation solvent and the boiling point of the magnetite raw material liquid and/or the magnetite precipitation solvent at the time of introduction in the space between processing surfaces are easily adjusted. Further, these solvents may be used after removing oxygen in the solvent by a method such as nitrogen bubbling. Further, if necessary, the acidic substance may be mixed with the magnetite raw material liquid, as long as it does not adversely affect production of the magnetite particles. It is effective when increase of neutralization heat is desired at the time of precipitation.

The preparation apparatus and the like used for preparing the magnetite raw material liquid or the magnetite precipitation solvent are the same as those described above, more specifically, those explained for "Preparation Apparatus", "Dispersing agent, etc.", which explanation is omitted.

(Preparation Liquid Conditions)

In the present invention, magnetite particles are precipitated by mixing the magnetite raw material liquid and the magnetite precipitation solvent. The magnetite raw material liquid preferably contains $Fe^{2+}$ and $Fe^{3+}$ in the molar ratio $Fe^{2+}/Fe^{3+}$ of $0.500\pm0.010$, more preferably in the molar ratio $Fe^{2+}/Fe^{3+}$ of $0.500\pm0.005$, further preferably in the molar ratio $Fe^{2+}/Fe^{3+}$ of $0.500\pm0.003$. The excess or deficiency of $Fe^{2+}$ or $Fe^{3+}$ is not preferable because it causes formation of iron oxide or iron compound other than magnetite. When mixing the above mentioned magnetite precipitation solvent containing at least a basic substance and the above magnetite raw material liquid, in the case that $Fe^{2+}$ is excessive in the magnetite raw material liquid, possibility of formation of iron (II) hydroxide ($Fe(OH)_2$) increases, and in the case that $Fe^{3+}$ is excessive, possibility of formation of hematite ($\alpha$-$Fe_2O_3$), goethite ($\alpha$-FeOOH) or the like increases, which causes high possibility of decreasing purity of the magnetite particles of the present application. The method of calculating the molar ratio $Fe^{2+}/Fe^{3+}$ of $Fe^{2+}$ to $Fe^{3+}$ in the magnetite raw material liquid is not particularly limited. For example, first, the total concentration of iron ions ($Fe^{3+}$ and $Fe^{2+}$) in the magnetite raw material liquid can be measured by high frequency inductively coupled heat plasma emission spectrometry (ICP); and then the concentration of $Fe^{2+}$ can be determined by the titration amount of dichromic acid at the point that $Fe^{2+}$ is changed to $Fe^{3+}$ while dichromic acid is added to a solution of a part of the above magnetite raw material liquid collected; and the concentration of $Fe^{3+}$ can be calculated by subtracting the concentration of $Fe^{2+}$ from the total concentration of iron ions obtained by the previous ICP measurement. The method of measuring the molar ratio $Fe^{2+}/Fe^{3+}$ of $Fe^{2+}$ to $Fe^{3+}$ is not limited to the above method, and any known method may be applied, and, for example, analysis using ion chromatography or the like may be used for calculation.

(PH of Magnetite Raw Material Liquid and Magnetite Precipitation Solvent)

In the present invention, pH of the magnetite raw material liquid is preferably 4 or less, more preferably 3 or less in order to increase single crystal ratio of the magnetite particles obtained by mixing the magnetite raw material liquid and the magnetite precipitation solvent by preparing the magnetite raw material liquid or the magnetite precipitation solvent so as to increase the thermal energy at the time of mixing the magnetite raw material liquid and the magnetite precipitation solvent. Further, pH of the magnetite precipitation solvent is preferably 12 or more, and more preferably 14 or more. Single crystal magnetite particles can be easily obtained, because the heat generated by the reaction heat such as neutralization heat increases when mixing the magnetite raw material liquid and the magnetite precipitation solvent.

Here, a method for producing magnetite particles which is one kind of iron oxide particles, has been specifically described as an example of the embodiment of the present invention. However, iron oxide may be magnetite particles represented by $Fe_3O_4$, or iron (III) oxide such as $\alpha$-hematite represented by $Fe_2O_3$, or iron (II) oxide represented by FeO.

(Y) Method of Producing Cerium Oxide Particles

Next, a method of producing cerium oxide particles which is another of embodiments of the present invention, is specifically described. Hereinafter, in the method of producing cerium oxide particles, the oxide raw material liquid is referred to as the cerium oxide raw material liquid, the oxide precipitation solvent is referred to as the cerium oxide precipitation solvent, and the oxide particle raw material is referred to as the cerium oxide particle raw material.

(Single Crystal Cerium Oxide Particles)

Single crystal cerium oxide particles in the present invention are the cerium oxide particles, in a transmission electron microscope (TEM) photograph of which interference fringes of the crystal lattice (atomic arrangement in the crystal, hereinafter, also referred to as "lattice stripe") are observed in one direction as shown in, for example, those of the cerium oxide particles obtained in Example Y9 of the present application shown in FIG. 12. The cerium oxide particles, in a TEM photograph of which lattice stripes are disturbed or the grain boundaries are observed are not single crystals. As a method of evaluating that the obtained cerium oxide particles are single crystals, it can be confirmed by a method of direct observation by TEM or scanning transmission electron microscope (STEM), or a method of calculating the ratio d/D of the average crystal diameter (d) obtained by X-ray diffraction measurement (XRD measurement) to the average particle diameter (D) obtained by TEM, STEM or scanning electron microscope (SEM), or the like.

(Cerium Oxide Particle Raw Material)

The cerium oxide raw material in the present invention is not particularly restricted, but a substance which generates $Ce^{3+}$ ion or $Ce^{4+}$ ion in a solution may be used. Such substance is not particularly restricted, but a substance which generates $Ce^{3+}$ ion in a solution includes an elementary cerium, a cerium compound such as a cerium salt and the like. The cerium compound includes an inorganic salt of cerium (III) (Ce (III)) such as cerium (III) nitrate ($Ce(NO_3)_3$), cerium (III) chloride ($CeCl_3$), cerium (III) sulfate ($Ce_2(SO_4)_3$), cerium (III) hydroxide ($Ce(OH)_3$) and the like, and an organic salt of cerium (III) (Ce (III)) such as cerium (III) acetate ($Ce(CH_3COO)_3$), cerium (III) citrate ($C_6H_5CeO_7$) and the like, and the like. A substance which generates $Ce^{4+}$ ion in a solution includes an elementary cerium, a cerium compound such as a cerium salt and the like similarly to a substance which generates $Ce^{3+}$ ion in a solution. The cerium compound includes an organic or inorganic salt of cerium (IV) (Ce (IV)) such as ammonium cerium (IV) nitrate (($NH_4)_2[Ce(NO_3)_6]$), cerium (IV) sulfate ($Ce(SO_4)_2$), ammonium cerium (IV) sulfate ($Ce(NH_4)_4(SO_4)_4$), cerium (IV) hydroxide ($Ce(OH)_4$), and the like. A hydrate or solvate of the substance which generates $Ce^{3+}$ ion, $Ce^{4+}$ ion, or $Ce^{2+}$ ion in a solution may be also used. The substance may be used alone, or a plurality of the substances may be mixed and used. Because of easy improvement of crystallinity of the produced cerium oxide, at least one selected from the group of cerium (III) nitrate ($Ce(NO_3)_3$), ammonium cerium (IV) nitrate (($NH_4)_2[Ce(NO_3)_6]$), or a hydrate thereof is preferably used as the above cerium oxide particle raw material, and cerium (III) nitrate ($Ce(NO_3)_3$) is more preferably used.

(Basic Substance)

A basic substance in the present invention includes a metal hydroxide such as sodium hydroxide, potassium hydroxide and the like, a metal alkoxide such as sodium methoxide, sodium isopropoxide and the like, an amine compound such as triethylamine, diethylaminoethanol, diethylamine and the like, ammonia, and the like. It is preferable to use sodium hydroxide, potassium hydroxide or ammonia as a basic substance because of easy improvement of crystallinity of the produced cerium oxide.

(Acidic Substance)

An acidic substance in the present invention includes an inorganic acid such as aqua regia, hydrochloric acid, nitric acid, fuming nitric acid, sulfuric acid, fuming sulfuric acid, and an organic acid such as formic acid, acetic acid, chloroacetic acid, dichloroacetic acid, oxalic acid, trifluoroacetic acid, trichloroacetic acid and the like.

(Preparation of Cerium Oxide Raw Material Liquid and Preparation of Cerium Oxide Precipitation Solvent)

In the present invention, the cerium oxide raw material liquid may be prepared by mixing, dissolving or molecularly dispersing at least cerium oxide particle raw material in a solvent. The cerium oxide precipitation solvent may be prepared by mixing, dissolving or molecularly dispersing a basic substance in a solvent. A solvent used in them includes, for example, water or an organic solvent, or a mixed solvent consisting of a plurality of these solvents. Water includes tap water, ion-exchanged water, pure water, ultrapure water, RO water and the like. An organic solvent includes an alcohol compound solvent, an amide compound solvent, a ketone compound solvent, an ether compound solvent, an aromatic compound solvent, carbon disulfide, an aliphatic compound solvent, a nitrile compound solvent, a sulfoxide compound solvent, a halogen compound solvent, an ester compound solvent, an ionic liquid, a carboxylic acid compound, and a sulfonic acid compound, and the like. The solvent may be used alone or in combination of two or more thereof. An alcohol compound solvent includes a monohydric alcohol such as methanol and ethanol, a polyol such as ethylene glycol and propylene glycol, and the like. As described later, water or a mixed solvent of water and polyol is preferably used to prepare the cerium oxide raw material liquid and the cerium oxide precipitation solvent, because the introduction pressure of the cerium oxide raw material liquid and/or the cerium oxide precipitation solvent and the boiling point of the cerium oxide raw material liquid and/or the cerium oxide precipitation solvent at the time of introduction in the space between processing surfaces are easily adjusted. Further, these solvents may be used after removing oxygen in the solvent by a method such as nitrogen bubbling. Further, if necessary, the acidic substance may be mixed with the cerium oxide raw material liquid, as long as it does not adversely affect production of the cerium oxide particles. It is effective when increase of neutralization heat is desired at the time of precipitation.

The preparation apparatus and the like used for preparing the cerium oxide raw material liquid or the cerium oxide precipitation solvent are the same as those described above, more specifically, those explained for "Preparation Apparatus", "Dispersing agent, etc.", which explanation is omitted.

(pH of Cerium Oxide Raw Material Liquid and Cerium Oxide Precipitation Solvent)

In the present invention, pH of the cerium oxide raw material liquid is preferably 4 or less, more preferably 3 or less in order to increase single crystal ratio of the cerium oxide particles obtained by mixing the cerium oxide raw material liquid and the cerium oxide precipitation solvent by preparing the cerium oxide raw material liquid or the cerium oxide precipitation solvent so as to increase the thermal energy at the time of mixing the cerium oxide raw material liquid and the cerium oxide precipitation solvent. Further, pH of the cerium oxide precipitation solvent is preferably 10 or more, and more preferably 12 or more. Single crystal cerium oxide particles can be easily obtained, because the heat generated by the reaction heat such as neutralization heat increases when mixing the cerium oxide raw material liquid and the cerium oxide precipitation solvent.

(Reaction Method: Apparatus)

Figure 1:
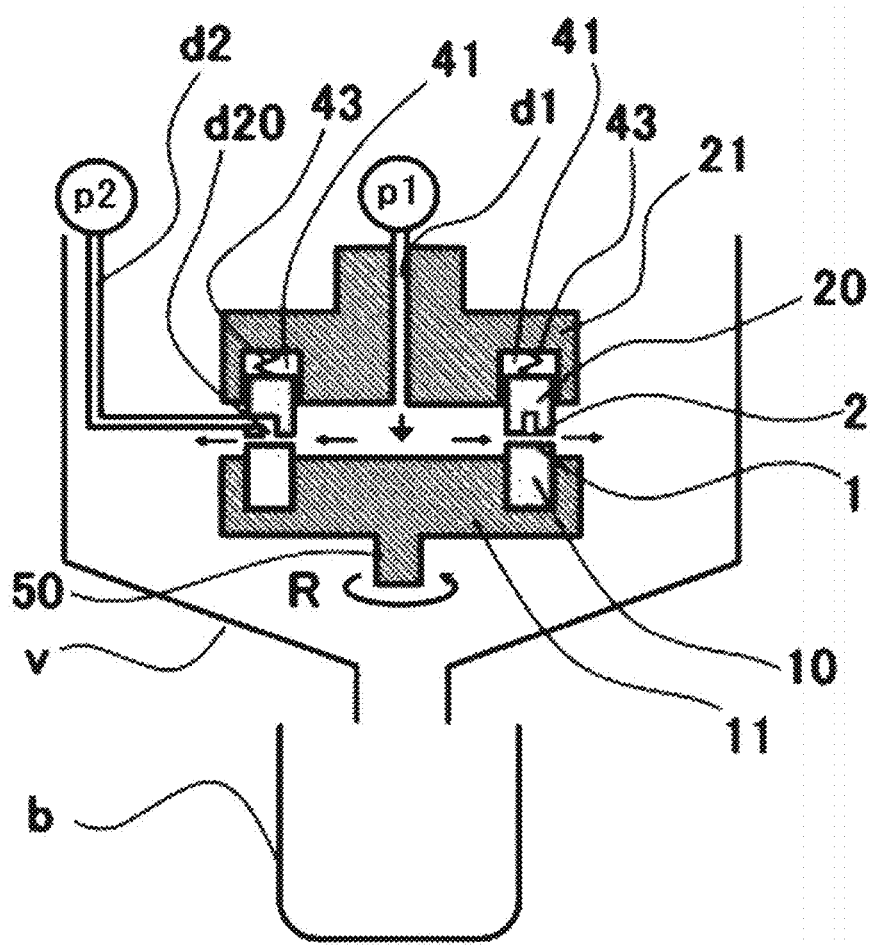
FIG. 1 shows an approximate cross sectional view of a fluid processing apparatus according to the embodiment of the present invention.
Figure 2:
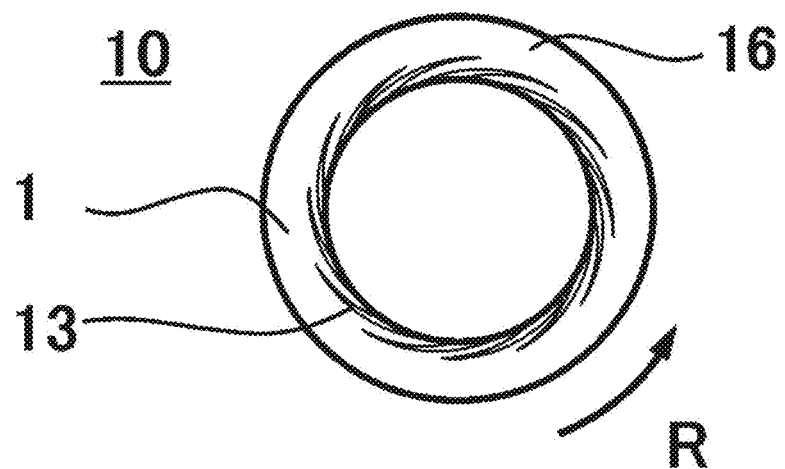
FIG. 2 shows a schematic plan view of the first processing surface of the fluid processing apparatus of FIG. 1.

In the present invention, a microreactor is preferably used for mixing the oxide raw material liquid and the oxide precipitation solvent. Among microreactors, the same apparatus as the apparatus described in Patent Literatures 4 or 7, shown in FIG. 1 is preferably used. The microreactor is explained in detail hereinafter. In FIG. 1 and FIG. 2, R indicates the rotation direction.

The microreactor in the present embodiment (hereinafter also referred to as a fluid processing apparatus) includes the first and second processing units 10 and 20 facing each other, and the first processing unit 10 rotates. The facing surfaces of the processing units 10 and 20 are respectively the processing surfaces. The first processing unit 10 has the first processing surface 1, and the second processing unit 20 has the second processing surface 2.

Both processing surfaces 1 and 2 are connected to the flow paths d1 and d2 of the first and second fluids to be processed, and constitute a part of the sealed flow path of the fluid to be processed. The distance between the processing surfaces 1 and 2 is usually adjusted to a minute interval of 1 mm or less, for example, about 0.1 to 50 μm. As a result, the fluid to be processed passing between the processing surfaces 1 and 2 becomes a forced thin film fluid forced by the processing surfaces 1 and 2.

This apparatus performs fluid processing between the processing surfaces 1 and 2 to react the first and second fluids to be processed and to precipitate oxide particles.

More specifically, the apparatus comprises the first holder 11 holding the first processing unit 10, the second holder 21 holding the second processing unit 20, the surface approaching pressuring mechanism 43, the rotation drive mechanism (not shown in drawing), the first introduction part d1, the second introduction part d2, and the fluid pressuring mechanisms p1 and p2. As the fluid pressuring mechanisms p1 and p2, a compressor or other pumps may be used. A thermometer and a pressure gauge are provided in each of the first introduction part d1 and the second introduction part d2, and the introduction pressure of the first and second fluids to be processed and the temperature under the introduction pressure can be measured.

In the above embodiment, the first processing unit 10 and the second processing unit 20 are ring shaped disks. As a material of the first and second processing units 10 and 20, metal, carbon, ceramic, sintered metal, abrasion resistant steel, sapphire, hardened metal, and hard material treated with lining, coating, plating or the like may be used. In the above embodiment, the first and second opposing processing surfaces 1 and 2 in the first and second processing units 10 and 20 are mirror polished, and the arithmetic mean roughness is 0.01 to 1.0 μm.

In the above embodiment, the second holder 21 is fixed to the machine, and the first holder 11 rotates which is attached to a rotating shaft 50 of the rotation drive mechanism similarly fixed to the machine, and the first processing unit 10 supported on the first holder 11 rotates relative to the second processing unit 20. Of course, the second processing unit 20 may rotate instead, or both may rotate.

Further, in the present invention, the above rotation speed may be, for example, 350 to 5,000 rpm.

In the above embodiment, the second processing unit 20 approaches to and separates from the first processing unit 10 in the direction of the rotation shaft 50, and the part opposite to the processing surface 2 side of the second processing unit 20 is retractably housed in the housing portion 41 provided in the second holder 21. However, on the contrary, the first processing unit 10 may approach to and separate from the second processing unit 20, or both processing units 10 and 20 may approach to and separate from each other.

The housing portion 41 is a concavity housing the part opposite to the processing surface 2 side of the second processing unit 20, and is a groove formed in a ring shape. The housing portion 41 houses the second processing unit 20, with sufficient clearance that the part opposite to the processing surface 2 side of the second processing unit 20 can appear and disappear.

The surface approaching pressuring mechanism is a mechanism for generating a pushing force in the direction of approximating the first processing surface 1 of the first processing unit 10 and the second processing surface 2 of the second processing unit 20 (hereinafter, referred to as surface approaching pressure). By a balance between this surface approaching pressure and the force of separating both processing surfaces 1 and 2 by the fluid pressure of the magnetite raw material liquid and the magnetite precipitation solvent (hereinafter, referred to as separation force), the interval between both processing surfaces 1 and 2 is maintained minute, to generate a thin film fluid with a minute film thickness of nm unit to m unit. In the above embodiment, the surface approaching pressuring mechanism gives a surface approaching pressure with a spring 43 provided in the second holder 21 by energizing the second processing unit 20 toward the first processing unit 10.

Further, pressure of a fluid for back pressure such as air may be applied in addition to the spring 43. The sum of all these pressures is the above surface approaching pressure, and this surface approaching pressure is balanced with the separation force due to the fluid pressure of the oxide raw material liquid and the oxide precipitation solvent. In the present invention, it is preferable to set the fluid pressure of the oxide raw material liquid and the oxide precipitation solvent high. Specifically, the fluid pressure of the oxide raw material liquid and the oxide precipitation solvent exceeds the standard pressure, and the surface approaching pressure is also set high to be balanced with the fluid pressure. Specifically, the pressure of the fluid for back pressure may be set to 0.020 to 0.050 MPaG, preferably 0.050 to 0.400 MPaG, more preferably 0.100 to 0.350 MpaG, and the pressure of the spring 43 may be set to 0.007 to 0.300 MPa, preferably 0.010 to 0.200 MPa.

The first fluid to be processed which is pressurized by the surface approaching pressuring mechanism p1 is introduced into the space between the processing units 10 and 20 from the first introduction part d1.

On the other hand, the second fluid to be processed which is pressurized by the surface approaching pressuring mechanism p2 is introduced into the space between the processing units 10 and 20 from the opening d20 formed on the second processing surface through a passage provided from the second introduction part d2 in the interior of the second processing unit 20.

In the opening d20, the first fluid to be processed and the second fluid to be processed are merged and mixed.

At that time, the mixed fluids to be processed become a thin film fluid forced by the processing surfaces 1 and 2 to maintain the above minute interval, and are forced to move outside of the ring shape of both processing surfaces 1 and 2. Since the first processing unit 10 rotates, the mixed fluids to be processed do not move linearly from the inside of the ring shape of both processing surfaces 1 and 2 to the outside, but move in a substantially spiral shape from the inside to the outside by the combination vector of the mobile vector in the radial direction and the mobile vector in the circumferential direction acting on the fluid to be processed.

Here, as shown in FIG. 2, a groove like concavity 13 may be formed on the first processing surface 1 of the first processing unit 10, which extends from the center side of the first processing unit 10 to the outside, or in the radial direction. The planar shape of the concavity 13 may be one extending curvingly or spirally on the first processing surface 1, and although not shown, one extending straight outward, one bending or curving in an L shape or the like, continuous one, intermittent one, one having branches. Further, the concavity 13 formed on the second processing surface 2 may be performed, and also the concavity 13 formed on both the first and second processing surfaces 1 and 2 may be performed. Formation of such concavity 13 may give a micropump effect, and also an effect to transfer the fluids to be processed between the first and second processing surfaces 1 and 2.

The base end of the concavity 13 desirably reaches the inner periphery of the first processing unit 10. The tip end of the concavity 13 extends towards the outer peripheral surface of the first processing surface 1, and the depth gradually decreases from the base end to the tip end. A flat surface 16 without concavity 13 is provided between the tip end of the concavity 13 and the outer peripheral surface of the first processing surface 1.

The above opening d20 is preferably provided at a position facing the flat surface of the first processing surface 1. In particular, the opening d20 is preferably provided at a position facing the flat surface 16, which is a downstream side from the position where the flow direction of the fluids to be processed as introduced is converted into the flow direction of the spiral laminar flow formed between both processing surfaces by the micropump effect. Thereby, it is possible to mix a plurality of fluids to be processed at a laminar flow condition, and to precipitate microparticles.

It is preferred to provide directionality to the second introduction part d2. For example, the introduction direction from the opening d20 of the second processing surface 2 may be inclined at a predetermined elevation angle relative to the second processing surface 2. The introduction direction from the opening d20 of the second processing surface 2 may have directionality on the plane along the above second processing surface 2, and the introduction direction of the second fluid to be processed may be the radially outward direction from the center in the radial direction component, and the forward direction in the rotation direction component of the fluids between the rotating processing surfaces. Thus, the flow of the first fluid to be processed at the opening d20 is a laminar flow, and the second introduction part d2 has directionality, and thereby the second fluid to be processed can be introduced between the processing surfaces 1 and 2 while suppressing occurrence of turbulence against the first fluid to be processed.

The mixed fluid to be processed which is discharged outside both processing units 10 and 20 is collected in the beaker b as a discharged liquid through the vessel v. In the embodiment of the present invention, the discharged fluid includes oxide microparticles as described below.

Kinds of the above fluids to be processed and number of the flow paths are two in the example of FIG. 1, but may be three or more. Shape, size and number of the openings for the introduction provided in respective processing units, may be changed and carried out appropriately without any particular restriction. For example, as shown in FIG. 1, shape of the opening d20 may be a concentric circular ring shape surrounding the central opening of the processing surface 2 which is a ring shape disc, and the ring shape opening may be continuous or discontinuous. The introduction opening may be provided just ahead of or at further upstream side of the space between the above first and second processing surfaces 1 and 2.

In case of producing the oxide particles using the above fluid processing machine, as an example, the first fluid to be processed is introduced from the first introduction part d1, and the second fluid to be processed is introduced from the second introduction part d2, and both fluids are mixed between the processing surfaces 1 and 2, and thereby the oxide particles can be to precipitated.

In the present invention, the second fluid to be processed may be introduced from the first introduction part d1, and the first fluid to be processed may be introduced from the second introduction part d2, as long as the above mentioned fluid processing can be performed between the processing surfaces 1 and 2. For example, the expressions first and second regarding fluids, only have implications for identification as the fluid is the n th fluid among a plurality of fluids present, and the third or later fluids may be present as described above.

(Reaction Conditions and Conditions of Liquid after Reaction)

In the present invention, crystallinity of the oxide particles to be discharged from the space between the processing surfaces 1 and 2 is controlled, by changing at least one selected from the group consisting of the temperature of the first fluid to be processed which is introduced between the processing surfaces 1 and 2 and the temperature of the second fluid to be processed which is introduced between the processing surfaces 1 and 2, and the temperature at the time of mixing the first fluid to be processed and the second fluid to be processed. In the present invention, the single crystal ratio of the oxide particles to be discharged from between the processing surfaces 1 and 2 is controlled to be increased, by raising at least one selected from the group consisting of the temperature of the first fluid to be processed which is introduced between the processing surfaces 1 and 2 and the temperature of the second fluid to be processed which is introduced between the processing surfaces 1 and 2, and the temperature at the time of mixing the first fluid to be processed and the second fluid to be processed. It is preferable to control so that the temperature of the first fluid to be processed which is introduced between the processing surfaces 1 and 2 is equal to or higher than a predetermined temperature in order to make the single crystal ratio of the obtained oxide particles equal to or more than a predetermined ratio. The "predetermined ratio" and the "predetermined temperature" are determined by the kind of oxide particles to be obtained. For example, when the obtained oxide particles are cerium oxide particles, the temperature of the first fluid to be processed which is introduced between the processing surfaces 1 and 2 is preferably set to 50° C. or higher in order to make the single crystal ratio of the obtained cerium oxide particles be 10% or more. The temperature of the first fluid to be processed which is introduced between the processing surfaces 1 and 2 is preferably set to a temperature higher than 100° C. in order to make the single crystal ratio of the obtained cerium oxide particles be 90% or more. It is most preferable to set both the introduction temperatures of the first fluid to be processed and the second fluid to be processed which are introduced between the processing surfaces 1 and 2 to a temperature higher than 100° C. At that time, it is preferable to control the pH of the mixed fluid in which the oxide particles are precipitated between the processing surfaces 1 and 2 to a predetermined range described later. Here, the single crystal ratio is a ratio calculated from the equation: "Single crystal ratio"=Y/X×100(%) based on the number X of the observed oxide particles and the number Y of the oxide particles observed as single crystals in the observed oxide particles, by observing the obtained oxide particles with an electron microscope.

The single crystal ratio of the obtained oxide particle is dramatically improved, when the introduction pressure of the first fluid to be processed at the time of introduction between the processing surfaces 1 and 2 exceeds the standard pressure, and the temperature of the first fluid to be processed which is introduced between the processing surfaces 1 and 2 is set to a temperature higher than the standard boiling point of the first fluid to be processed and lower than the boiling point under the introduction pressure. In particular, it is preferable that both of the introduction pressure of the first fluid to be processed and the introduction pressure of the second fluid to be processed at the time of introduction between the processing surfaces 1 and 2 exceed the standard pressure, and the temperature of the first fluid to be processed which is introduced between the processing surfaces 1 and 2 is set to a temperature higher than the standard boiling point of the first fluid to be processed and lower than the boiling point under the introduction pressure, and the temperature of the second fluid to be processed which is introduced between the processing surfaces 1 and 2 is set to a temperature higher than the standard boiling point of the second fluid to be processed and lower than the boiling point under the introduction pressure. The standard boiling point of the oxide raw material liquid varies depending on the kind of the oxide particle raw material used in the oxide raw material liquid, and substances contained in the oxide raw material liquid such as a solvent, an acidic substance, and the like, and the blending ratio thereof. However, in practice, the standard boiling point of the oxide raw material liquid may be calculated, and the temperature of the supplied oxide raw material liquid may be set to a temperature higher than the calculated value. Similarly, the standard boiling point of the oxide precipitation solvent varies depending on the kind of the basic substance used in the oxide precipitation solvent, and substances contained in the oxide precipitation solvent such as a basic substance, a solvent and the like, and the blending ratio thereof. However, in practice, the standard boiling point of the oxide precipitation solvent may be calculated, and the temperature of the supplied oxide precipitation solvent may be set to a temperature higher than the calculated value.

The standard boiling point T (° C.) of the oxide raw material liquid and the oxide precipitation solvent is calculated by the following equation:

$$T=(T_0+k_b \times m)-273$$

wherein
T: standard boiling point (° C.)
$T_0$: standard boiling point of solvent (K)
$k_b$: molar ebullioscopic constant (K·kg/mol)
m: molality (mol/kg)

In the present application, ionization and association are ignored when calculating the standard boiling point.

Next, the boiling point under the introduction pressure can be obtained from the vapor pressure curve of each solvent and the standard boiling point calculated by the above equation.

By controlling the pressure condition in the space between the processing surfaces which are disposed so as to face each other, being capable of approaching to and separating from each other, at least one of which rotates relatively to the other, the oxide raw material liquid and the oxide precipitation solvent can be introduced between the processing surfaces 1 and 2 under the introduction pressure of both liquids beyond the standard atmospheric pressure. Therefore, the fluids do not boil even at a temperature higher than the standard boiling point of the fluids, and the oxide raw material liquid and the oxide precipitation solvent can be mixed in the reaction space of several micrometer order formed between the processing surfaces, and thereby the reaction can be stably carried out at a temperature higher than the standard boiling point. In such a space, instantaneous mixing, diffusion and reaction are possible, and in addition a large amount of energy such as heat and the like can be given instantaneously to the precipitated nanoparticles. Thus, the present applicant believes that it is particularly effective when obtaining nanoparticles of single crystals.

From the viewpoint of improvement of the single crystal ratio, it is desirable that the introduction temperature between two processing surfaces c (° C.) of the mixed fluid obtained by the following equation using the temperature and flow rate of the oxide raw material liquid and the temperature and flow rate of the oxide precipitation solvent, is higher than 100° C.

$$c=(a1 \times a2+b1 \times b2)/(a2+b2)$$

wherein
a1: introduction temperature of the oxide raw material liquid (° C.)
a2: introduction flow rate of the oxide raw material liquid (ml/min)
b1: introduction temperature of the oxide precipitation solvent (° C.)
b2: introduction flow rate of the oxide precipitation solvent (ml/min)

Although it cannot be directly measured, it is thought that the thermal energy in which heat generation due to reaction heat such as neutralization heat and the like described above is added to the introduction temperature between two processing surfaces c (° C.) of this mixed fluid while satisfying the above pressure condition, influences from the oxide particles precipitation to the crystal growth, and drastically improves the single crystal ratio.

As described above, Patent Literature 4 discloses that control of particle diameter or monodispersity, or crystallinity or crystallinity index of the obtained magnetic microparticles can be adjusted by changing rotation speed of the processing surface, distance between the processing surfaces, and flow rate and temperature of the thin film fluid, or the raw material concentration. Patent Literature 7 discloses that control of particle diameter or monodispersity, or crystalline form of the obtained ceramic nanoparticles can be adjusted by changing rotation speed of the processing surface, distance between the processing surfaces, and flow rate of the thin film fluid, or the raw material concentration or temperature and the like.

Therefore, the present inventors have continued the study to improve the crystallinity of the oxide particles, and more desirably to obtain single crystal oxide particles by controlling these conditions. However, under relatively small pressure conditions (0.10 MPaG or less), single crystal oxide particles could not be obtained simply by controlling temperature of the thin film fluid. After that, as a result of intensive study by the present inventors after trial and error, the present inventors have found that crystallinity of the oxide particles can be remarkably improved by the conditions that the temperature of each fluid introduced between the processing surfaces and the temperature at the time of mixing respective fluids are set to a temperature higher than a predetermined temperature, and particularly the conditions that under a relatively high pressure condition (higher than 0.10 MPaG), the temperature of each fluid introduced between the processing surfaces and the temperature at the time of mixing respective fluids are set to a temperature higher than a predetermined temperature, and thus the present inventors have achieved the present invention.

In this way, control in a high crystallinity region in which high crystallinity could not be achieved by conventional methods of preparing microparticles between processing surfaces, has become possible not only by changing simply conditions such as the temperature of the thin film fluid and the rotational speed of the processing surface, but also by using a fluid having a temperature higher than its boiling point as a fluid for performing the reaction between the processing surfaces without substantially boiling the fluid. In this regard, it is considered that the temperature of each fluid introduced between the processing surfaces and the temperature at the time of mixing the respective fluids are related to the crystallinity of the obtained oxide particles. Therefore, it is considered that the crystallinity of the obtained oxide particles discharged from the space between processing surfaces can be controlled, by changing at least one selected from the group consisting of the temperature of the first fluid to be processed which is introduced between the processing surfaces 1 and 2, the temperature of the second fluid to be processed which is introduced between the processing surfaces 1 and 2, and the temperature at the time of mixing the first fluid to be processed and the second fluid to be processed, regardless of the kind of particles.

As described above, the mixed fluid in which oxide particles are precipitated between the processing surfaces 1 and 2 is discharged outside both processing units 10 and 20, and is collected in the beaker b as a discharged liquid through the vessel v. In the present invention, it is preferable to control the pH of the discharged liquid to a predetermined range. Here, the "predetermined range" is determined depending on the kind of the obtained oxide particles, and is a pH range which does not lead the situation that crystallinity of the oxide particles contained in the discharged liquid decreases, or yield of the oxide particles decreases. For example, when the obtained oxide particles are α-hematite particles, the pH of the discharged liquid is preferably 6 to 14, and further preferably 8 to 12. In the present invention, crystallization of the particles is improved further more by combining control of the temperature of the oxide raw material liquid or the oxide precipitation solvent introduced between the processing surfaces 1 and 2, or the temperature of them at the time of mixing them, and control of the pH of the discharged liquid. The pH of the discharged liquid can be controlled by controlling the concentration of the oxide particle raw material, a basic substance, an acidic substance or the like contained in the oxide raw material liquid or the oxide precipitation solvent, and the introduction flow rate of the above oxide raw material liquid or the oxide precipitation solvent. By controlling the pH of the discharged liquid, the shape of oxide particles such as a spherical shape and a square shape can be also controlled, and particles having a shape required according to the use of the oxide particles can be obtained. Here, a square shape means a quadrangle, a rhombus, or a polygon. The shape of the oxide particles can be specified using various microscopes. In the observation using a transmission electron microscope, the shape is observed in a plan view. The above mentioned square shape is a shape observed in a plan view.

In collecting the oxide particles from the discharged liquid, the oxide particles may be collected after the discharged liquid is allowed to stand to be cooled to room temperature, or the oxide particles may be collected after the discharged liquid is rapidly cooled to room temperature. The oxide particles may be collected from the discharged liquid immediately after the discharge. By using these methods, it is also an advantage of the present invention that aging treatment taking a long time is not required particularly for obtaining the single crystal oxide particles.

(State of Particles)

The oxide particles obtained by the above method have a nanosize primary particle diameter of 100 nm or less, preferably 50 nm or less, further preferably 20 nm or less, and CV value (standard deviation/average particle diameter×100[%]) is 40% or less, preferably 30% or less, further preferably 20% or less. In addition, the ratio d/D of the average crystal diameter (d) obtained by XRD measurement of the oxide particles to the average particle diameter (D) obtained by particle size distribution measurement, transmission electron microscope observation (TEM observation), scanning electron microscope observation (SEM observation), or scanning transmission electron microscope observation (STEM observation) of the oxide particles is 0.50 to 1.00, preferably 0.70 to 1.00.

As described above, the solvent contained in the oxide raw material liquid and the solvent contained in the oxide precipitation solvent may be used alone or in combination of two or more thereof. Then, the temperature of the oxide raw material liquid introduced between the processing surfaces 1 and 2 may be set to a temperature higher than the standard boiling point of the solvent having the lowest standard boiling point among the single or plural solvents contained in the oxide raw material liquid, and the temperature of the oxide precipitation solvent introduced between the processing surfaces 1 and 2 may be set to a temperature higher than the standard boiling point of the solvent having the lowest standard boiling point among the single or plural solvents contained in the oxide precipitation solvent. For example, when a mixed solvent of water and polyol is used as the solvent contained in the oxide raw material liquid, the temperature of the oxide raw material liquid introduced between the processing surfaces 1 and 2 may be set to a temperature higher than 100° C. of the standard boiling point of water.

The standard boiling point of propylene glycol which is one of polyols, is 188° C. By using a mixed solvent of water and propylene glycol as the solvent contained in the oxide raw material liquid, it is possible to introduce the oxide raw material in a non-boiling state at 100° C. or higher under a pressure lower than the standard pressure between the processing surfaces 1 and 2. The same applies when a mixed solvent of water and propylene glycol is used as the solvent contained in the oxide precipitation solvent. In setting the temperature of the oxide raw material liquid or the oxide precipitation solvent introduced between the processing surfaces 1 and 2 as described above, the setting may be adjusted by setting both of the introduction pressure of the oxide raw material liquid and the introduction pressure of the oxide precipitation solvent to a pressure exceeding the standard pressure, and also by the kind of solvent or combination thereof. It is desirable that the temperature of either of the oxide raw material liquid and the oxide precipitation solvent is 175° C. or lower. This makes it easier to control the reaction speed in the fluid processing apparatus of this embodiment, and this greatly contributes producing stably the single crystal oxide particles having uniform particle characteristics and fine size (for example, primary particle diameter of 20 nm or less).

(Other Elements)

By using the production method of the present invention, another element may be solid-soluted in or compounded with the oxide particles. Specifically, a compound containing an element other than the elements (metal or nonmetal, and oxygen) constituting the oxide particles may be mixed, dissolved or molecularly dispersed in either of the oxide raw material liquid or the oxide precipitation solvent or any other solvent different therefrom, and then mixed between the processing surfaces to precipitate the other element together with the oxide particles. The other element is not particularly limited. It can be applied to all elements on the chemical periodic table different from elements constituting oxide particles. The compound containing an element different from the elements constituting the oxide particles is not particularly limited, but may be an elemental substance or a compound of the element. The substance may be used in the form of hydrates or solvates. The substance may be used alone or in combination.

When an element other than the elements constituting the oxide particles is solid-soluted in or compounded with the oxide particles by the production method of the present invention, expected are the possibility of incorporation into the particles as crystallinity of an oxide or hydroxide of the element which is inherently difficult to obtain crystallinity in the liquid phase method, and the effect such as new characteristics other than the characteristics generated or improved by the oxide particle becoming single crystals.

Hereinafter, an example of the specific embodiment of a method of producing magnetite particles carried out using the above apparatus is explained.

In case of producing the magnetite particles using the above fluid processing machine, the magnetite raw material liquid as the first fluid to be processed is introduced from the first introduction part d1, and the magnetite precipitation solvent as the second fluid to be processed is introduced from the second introduction part d2, and both fluids are mixed between the processing surfaces 1 and 2, and thereby the magnetite particles can be to precipitated.

In the present invention, the second fluid to be processed may be introduced from the first introduction part d1, and the first fluid to be processed may be introduced from the second introduction part d2, as long as the above mentioned processing can be performed between the processing surfaces 1 and 2. For example, the expressions first and second regarding fluids, only have implications for identification as the fluid is the n th fluid among a plurality of fluids present, and the third or later fluids may be present as described above.

(Reaction Conditions and Conditions of Liquid after Reaction)

When the magnetite raw material liquid is introduced as the first fluid to be processed from the first introduction part d1 in the space between the processing surfaces 1 and 2, and the magnetite precipitation solvent is introduced as the second fluid to be processed from the second introduction part d2 in the space between the processing surfaces 1 and 2, it is preferable to set the introduction temperatures of the magnetite raw material liquid introduced between the processing surfaces 1 and 2 to 50° C. or higher in order to make the single crystal ratio of the obtained magnetite particles 20% or more. It is more preferable to set the introduction temperatures of the magnetite raw material liquid introduced between the processing surfaces 1 and 2 to a temperature higher than 100° C. in order to make the single crystal ratio of the obtained magnetite particles 70% or more. It is further preferable to set both of the introduction temperature of the magnetite raw material liquid introduced between the processing surfaces 1 and 2 and the introduction temperature of the magnetite precipitation solvent introduced between the processing surfaces 1 and 2 to a temperature higher than 100° C. in order to make the single crystal ratio of the obtained magnetite particles 90% or more. At that time, it is preferable that the pH of the mixed fluid in which the magnetite particles are precipitated between the processing surfaces 1 and 2 is 8 or more. Here, the single crystal ratio is a ratio calculated from the equation: "Single crystal ratio"=Y/X×100(%) based on the number X of the observed magnetite particles and the number Y of the magnetite particles observed as single crystals in the observed magnetite particles, by observing the obtained magnetite particles with an electron microscope.

The single crystal ratio of the obtained magnetite particle is dramatically improved, when both of the introduction pressure of the magnetite raw material liquid and the introduction pressure of the magnetite precipitation solvent at the time of introduction between the processing surfaces 1 and 2 exceeds the standard pressure, and the temperature of the magnetite raw material liquid introduced between the processing surfaces 1 and 2 is set to a temperature higher than the standard boiling point of the magnetite raw material liquid and lower than the boiling point under the introduction pressure. The standard boiling point of the magnetite raw material liquid varies depending on the kind of the magnetite particle raw material used in the magnetite raw material liquid, and substances contained in the magnetite raw material liquid such as a solvent, an acidic substance, and the like, and the blending ratio thereof. However, in practice, the standard boiling point of the magnetite raw material liquid may be calculated, and the temperature of the supplied magnetite raw material liquid may be set to a temperature higher than the calculated value. It is preferable that the temperature at the time of introduction of the magnetite precipitation solvent is a temperature higher than 100° C. It is more preferable that both of the introduction pressure of the magnetite raw material liquid and the introduction pressure of the magnetite precipitation solvent at the time of introduction between the processing surfaces 1 and 2 exceed the standard pressure, and the temperature of the magnetite precipitation solvent introduced between the processing surfaces 1 and 2 is set to a temperature higher than the standard boiling point of the magnetite precipitation solvent and lower than the boiling point under the introduction pressure.

Regarding magnetite precipitation solvent, similarly to the magnetite raw material liquid, in practice, the standard boiling point of the magnetite precipitation solvent may be calculated, and the temperature of the supplied magnetite precipitation solvent may be set to a temperature higher than the calculated value.

The standard boiling point of the magnetite raw material liquid and the magnetite precipitation solvent is calculated by the following equation:

$$T=(T_0+k_b \times m)-273$$

wherein
T: standard boiling point (° C.)
$T_0$: standard boiling point of solvent (K)
$k_b$: molar ebullioscopic constant (K·kg/mol)
m: molality (mol/kg)

In the present application, ionization and association are ignored when calculating the standard boiling point.

Next, the boiling point under the introduction pressure can be obtained from the vapor pressure curve of each solvent and the standard boiling point calculated by the above equation.

By controlling the pressure condition in the space between the processing surfaces which are disposed so as to face each other, being capable of approaching to and separating from each other, at least one of which rotates relatively to the other, the magnetite raw material liquid and the magnetite precipitation solvent can be introduced under the processing surfaces 1 and 2 under the introduction pressure of both liquids beyond the standard atmospheric pressure. Therefore, the fluids do not boil even at a higher temperature than the standard boiling point of the fluids, and the magnetite raw material liquid and the magnetite precipitation solvent can be mixed in the reaction space of several micrometer order formed between the processing surfaces, and thereby the reaction can be stably carried out at a temperature higher than the standard boiling point. In such a space, instantaneous mixing, diffusion and reaction are possible, and in addition a large amount of energy such as heat and the like can be given instantaneously to the precipitated nanoparticles. Thus, the applicant believes that it is particularly effective when obtaining nanoparticles of single crystals such as those of the present invention.

From the viewpoint of improvement of the single crystal ratio, it is desirable that the introduction temperature between two processing surfaces c (° C.) of the mixed fluid obtained by the following equation using the temperature and flow rate of the magnetite raw material liquid and the temperature and flow rate of the magnetite precipitation solvent, is higher than 100° C.

$$c=(a1 \times a2+b1 \times b2)/(a2+b2)$$

wherein a1: introduction temperature of the magnetite raw material liquid (° C.)

a2: introduction flow rate of the magnetite raw material liquid (ml/min)

b1: introduction temperature of the magnetite precipitation solvent (° C.)

b2: introduction flow rate of the magnetite precipitation solvent (ml/min)

Although it cannot be directly measured, it is thought that the thermal energy in which heat generation due to reaction heat such as neutralization heat and the like described above is added to the introduction temperature between two processing surfaces c (° C.) of this mixed fluid while satisfying the above pressure condition, influences from the magnetite particles precipitation to the crystal growth, and drastically improves the single crystal ratio.

As described above, the mixed fluid in which magnetite particles are precipitated between the processing surfaces 1 and 2 is discharged outside both processing units 10 and 20, and is collected in the beaker b as a discharged liquid through the vessel v. In the present invention, the pH of the discharged liquid is preferably 8 or more, further preferably 9 or more. In addition, the single crystal ratio of the obtained magnetite particles is remarkably and desirably improved to 70% or more, when the introduction temperature of the magnetite raw material liquid between the processing surfaces 1 and 2 is a temperature higher than 100° C., or the introduction temperature between two processing surfaces c is a temperature higher than 100° C., and the pH of the discharged liquid is 9 or more. In particular, all of the obtained magnetite particles are single crystals desirably, when the introduction temperature of the magnetite raw material liquid between the processing surfaces 1 and 2 is 120° C. or higher, or the introduction temperature between two processing surfaces c is 120° C. or higher, and the pH of the discharged liquid is 9 or more. The pH of the discharged liquid can be controlled by controlling the concentration of the magnetite particle raw material, a basic substance, an acidic substance or the like contained in the magnetite raw material liquid or the magnetite precipitation solvent, and the introduction flow rate of the above magnetite raw material liquid or the magnetite precipitation solvent. Further, the shape of the magnetite particles can be also controlled by controlling the pH of the discharged liquid. Specifically, the shape of the magnetite particles can be controlled so as to approach a spherical shape by decreasing the pH of the mixed fluid within the pH range of 9 or more and, and the shape of the magnetite particles can be controlled so as to approach a square shape by increasing the pH of the mixed fluid, and particles having a shape required for the use of magnetite particles can be obtained. Here, a square shape means a quadrangle, a rhombus, or a polygon. Magnetite particles are used in a wide range of fields of a magnetic fluid, coloring material and cosmetics. When the shape of the magnetite particles is a spherical shape, the dispersibility of the magnetite particles in the dispersion medium is improved, and when the shape of the magnetite particles is a square shape, the concealment is improved. Therefore, in the case that the magnetite particles are used as a magnetic fluid, the shape is preferably a spherical shape, and in the case that the magnetite particles are used as a coloring material, the shape is preferably a square shape. The shape of the magnetite particles can be specified using various microscopes. In the observation using a transmission electron microscope, the shape is observed in a plan view. The above mentioned square shape is a shape observed in a plan view.

In collecting the magnetite particles from the discharged liquid, the magnetite particles may be collected after the discharged liquid is allowed to stand to be cooled to room temperature, or the magnetite particles may be collected after the discharged liquid is rapidly cooled to room temperature. The magnetite particles may be collected from the discharged liquid immediately after the discharge. By using these methods, it is also an advantage of the present invention that aging treatment taking a long time is not required particularly for obtaining the single crystal magnetite particles.

(State of Particles)

The magnetite particles obtained by the above method have a nanosize primary particle diameter of 100 nm or less, preferably 50 nm or less, further preferably 20 nm or less, and CV value (standard deviation/average particle diameter×100 [%]) is 40% or less, preferably 30% or less, further preferably 20% or less. In addition, the ratio d/D of the average crystal diameter (d) obtained by XRD measurement of the magnetite particles to the average particle diameter (D) obtained by particle size distribution measurement, transmission electron microscope observation (TEM observation), scanning electron microscope observation (SEM observation), or scanning transmission electron microscope observation (STEM observation) of the magnetite particles is 0.50 to 1.00, preferably 0.70 to 1.00.

As described above, the solvent contained in the magnetite raw material liquid and the solvent contained in the magnetite precipitation solvent may be used alone or in combination of two or more thereof. Then, the temperature of the magnetite raw material liquid introduced between the processing surfaces 1 and 2 may be set to a temperature higher than the standard boiling point of the solvent having the lowest standard boiling point among the single or plural solvents contained in the magnetite raw material liquid, and the temperature of the magnetite precipitation solvent introduced between the processing surfaces 1 and 2 may be set to a temperature higher than the standard boiling point of the solvent having the lowest standard boiling point among the single or plural solvents contained in the magnetite precipitation solvent. For example, when a mixed solvent of water and polyol is used as the solvent contained in the magnetite raw material liquid, the temperature of the magnetite raw material liquid introduced between the processing surfaces 1 and 2 may be set to a temperature higher than 100° C. of the standard boiling point of water.

The standard boiling point of propylene glycol which is one of polyols, is 188° C. By using a mixed solvent of water and propylene glycol as the solvent contained in the magnetite raw material liquid, it is possible to introduce the magnetite raw material in a non-boiling state at 100° C. or higher under a pressure lower than the standard pressure between the processing surfaces 1 and 2. The same applies when a mixed solvent of water and propylene glycol is used as the solvent contained in the magnetite precipitation solvent. In setting the temperature of the magnetite raw material liquid or the magnetite precipitation solvent introduced between the processing surfaces 1 and 2, the setting may be adjusted by setting both of the introduction pressure of the magnetite raw material liquid and the introduction pressure of the magnetite precipitation solvent to a pressure exceeding the standard pressure, and also by the kind of solvent or combination thereof. It is desirable that the temperature of either of the magnetite raw material liquid and the magnetite precipitation solvent is 175° C. or lower. This makes it easier to control the reaction speed in the fluid processing apparatus of this embodiment, and this greatly contributes producing stably the single crystal magnetite particles having uniform particle characteristics and fine size (for example, primary particle diameter of 20 nm or less).

Next, an example of the specific embodiment of a method for producing cerium oxide particles carried out using the above apparatus is explained.

In case of producing the cerium oxide particles using the above fluid processing machine, as an example, the cerium oxide precipitation solvent as the first fluid to be processed is introduced from the first introduction part d1, and the cerium oxide raw material liquid as the second fluid to be processed is introduced from the second introduction part d2, and both fluids are mixed between the processing surfaces 1 and 2, and thereby the cerium oxide particles can be to precipitated.

In the present invention, the second fluid to be processed may be introduced from the first introduction part d1, and the first fluid to be processed may be introduced from the second introduction part d2, as long as the above mentioned fluid processing can be performed between the processing surfaces 1 and 2. For example, the expressions first and second regarding fluids, only have implications for identification as the fluid is the n th fluid among a plurality of fluids present, and the third or later fluids may be present as described above.

(Reaction Conditions and Conditions of Liquid after Reaction)

When the cerium oxide precipitation solvent is introduced as the first fluid to be processed from the first introduction part d1 in the space between the processing surfaces 1 and 2, and the cerium oxide raw material liquid is introduced as the second fluid to be processed from the second introduction part d2 in the space between the processing surfaces 1 and 2, it is preferable to set the introduction temperatures of the cerium oxide precipitation solvent introduced between the processing surfaces 1 and 2 to 50° C. or higher in order to make the single crystal ratio of the obtained cerium oxide particles 10% or more. It is more preferable to set the introduction temperatures of the cerium oxide precipitation solvent introduced between the processing surfaces 1 and 2 to a temperature higher than 80° C. in order to make the single crystal ratio of the obtained cerium oxide particles 50% or more. It is further preferable to set the introduction temperatures of the cerium oxide precipitation solvent introduced between the processing surfaces 1 and 2 to a temperature higher than 100° C. in order to make the single crystal ratio of the obtained cerium oxide particles 90% or more. It is most preferable to set both of the introduction temperature of the cerium oxide raw material liquid introduced between the processing surfaces 1 and 2 and the introduction temperature of the cerium oxide precipitation solvent introduced between the processing surfaces 1 and 2 to a temperature higher than 100° C. At that time, it is preferable that the pH of the mixed fluid in which the cerium oxide particles are precipitated between the processing surfaces 1 and 2 is in the range of 6.0 to 9.0. Here, the single crystal ratio is a ratio calculated from the equation:

$$\text{``Single crystal ratio''} = Y/X \times 100(\%)$$

based on the number X of the observed cerium oxide particles and the number Y of the cerium oxide particles observed as single crystals in the observed cerium oxide particles, by observing the obtained oxide particles with an electron microscope.

The single crystal ratio of the obtained cerium oxide particle is dramatically improved, when the introduction pressure of the cerium oxide precipitation solvent at the time of introduction between the processing surfaces 1 and 2 exceeds the standard pressure, and the temperature of the cerium oxide precipitation solvent introduced between the processing surfaces 1 and 2 is set to a temperature higher than the standard boiling point of the cerium oxide precipitation solvent and lower than the boiling point under the introduction pressure.

In particular, it is preferable that both of the introduction pressure of the cerium oxide raw material liquid and the introduction pressure of the cerium oxide precipitation solvent at the time of introduction between the processing surfaces 1 and 2 exceed the standard pressure, and the temperature of the cerium oxide raw material liquid introduced between the surfaces 1 and 2 is set to a temperature higher than the standard boiling point of the cerium oxide raw material liquid and lower than the boiling point under the introduction pressure, and the temperature of the cerium oxide precipitation solvent introduced between the surfaces 1 and 2 is set to a temperature higher than the standard boiling point of the cerium oxide precipitation solvent and lower than the boiling point under the introduction pressure. The standard boiling point of the cerium oxide raw material liquid varies depending on the kind of the cerium oxide particle raw material used in the cerium oxide raw material liquid, and substances contained in the cerium oxide raw material liquid such as a solvent, an acidic substance, and the like, and the blending ratio thereof. However, in practice, the standard boiling point of the cerium oxide raw material liquid may be calculated, and the temperature of the supplied cerium oxide raw material liquid may be set to a temperature higher than the calculated value. Similarly, the standard boiling point of the cerium oxide precipitation solvent varies depending on the kind of substances contained in the cerium oxide precipitation solvent such as a basic substance, a solvent and the like, and the blending ratio thereof. However, in practice, the standard boiling point of the cerium oxide precipitation solvent may be calculated, and the temperature of the supplied cerium oxide precipitation solvent may be set to a temperature higher than the calculated.

The standard boiling point T (° C.) of the cerium oxide raw material liquid and the cerium oxide precipitation solvent is calculated by the following equation:

$$T=(T_0+k_b \times m)-273$$

wherein

T: standard boiling point (° C.)
$T_0$: standard boiling point of solvent (K)
$k_b$: molar ebullioscopic constant (K·kg/mol)
m: molality (mol/kg)

In the present application, ionization and association are ignored when calculating the standard boiling point.

Next, the boiling point under the introduction pressure can be obtained from the vapor pressure curve of each solvent and the standard boiling point calculated by the above equation.

By controlling the pressure condition in the space between the processing surfaces which are disposed so as to face each other, being capable of approaching to and separating from each other, at least one of which rotates relatively to the other, the cerium oxide raw material liquid and the cerium oxide precipitation solvent can be introduced between the processing surfaces 1 and 2 under the introduction pressure of both liquids beyond the standard atmospheric pressure. Therefore, the fluids do not boil even at a higher temperature than the standard boiling point of the fluids, and the cerium oxide raw material liquid and the cerium oxide precipitation solvent can be mixed in the reaction space of several micrometer order formed between the processing surfaces, and thereby the reaction can be stably carried out at a higher temperature than the standard boiling point. In such a space, instantaneous mixing, diffusion and reaction are possible, and in addition a large amount of energy such as heat and the like can be given instantaneously to the precipitated nanoparticles. Thus, the applicant believes that it is particularly effective when obtaining nanoparticles of single crystals such as those of the present invention.

From the viewpoint of improvement of the single crystal ratio, it is desirable that the introduction temperature between two processing surfaces c (° C.) of the mixed fluid obtained by the following equation using the temperature and flow rate of the cerium oxide raw material liquid and the temperature and flow rate of the cerium oxide precipitation solvent, is higher than 100° C.

$$c=(a1 \times a2+b1 \times b2)/(a2+b2)$$

wherein a1: introduction temperature of the cerium oxide raw material liquid (° C.)
a2: introduction flow rate of the cerium oxide raw material liquid (ml/min)
b1: introduction temperature of the cerium oxide precipitation solvent (° C.)
b2: introduction flow rate of the cerium oxide precipitation solvent (ml/min)

Although it cannot be directly measured, it is thought that the thermal energy in which heat generation due to reaction heat such as neutralization heat and the like described above is added to the introduction temperature between two processing surfaces c (° C.) of this mixed fluid while satisfying the above pressure condition, influences from the cerium oxide particles precipitation to the crystal growth, and drastically improves the single crystal ratio.

As described above, the mixed fluid in which cerium oxide particles are precipitated between the processing surfaces 1 and 2 is discharged outside both processing units 10 and 20, and is collected in the beaker b as a discharged liquid through the vessel v. In the present invention, the pH of the discharged liquid is preferably in the range of 6.0 to 9.0, further preferably in the range of 6.5 to 9.0. When the pH of the discharged liquid exceeds 9.0, the crystallinity decreases, and when it is lower than 6.0, the crystallinity decreases and the yield decreases, which are not preferable. In addition, the single crystal ratio of the obtained cerium oxide particles is remarkably and desirably improved to 90% or more, when the introduction temperature of the cerium oxide precipitation solvent as the first fluid to be processed between the processing surfaces 1 and 2 is a temperature higher than 100° C., or the introduction temperature between two processing surfaces c is a temperature higher than 100° C., and the pH of the discharged liquid is in the range of 6.0 to 9.0. In particular, all of the obtained cerium oxide particles are single crystals desirably, when the introduction temperature of the cerium oxide precipitation solvent between the processing surfaces 1 and 2 is 120° C. or higher, or the introduction temperature between two processing surfaces c is 120° C. or higher, and the pH of the discharged liquid is in the range of 6.0 to 9.0. The pH of the discharged liquid can be controlled by controlling the concentration of the cerium oxide particle raw material, a basic substance, an acidic substance or the like contained in the cerium oxide raw material liquid or the cerium oxide precipitation solvent, and the introduction flow rate of the cerium oxide raw material liquid or the cerium oxide precipitation solvent. The shape of the cerium oxide particles such as a spherical shape and a square shape can be controlled by controlling the pH of the discharged liquid, and the particles having a shape required according to the use of the cerium oxide particles can be obtained. Here, a square shape means a quadrangle, a rhombus, or a polygon. Cerium oxide particles have been widely used as abrasives for a long time. In recent years, not only abrasives but also new applications such as ultraviolet absorbing agents, solid electrolytes, catalyst supports and the like have being used. When the shape of the cerium oxide particles is a spherical shape, the dispersibility of the cerium oxide particles in the dispersion medium is improved, and when the shape of the cerium oxide particles is a square shape, the concealment is improved. Therefore, in the case that the cerium oxide particles are used as an ink or the like, the shape is preferably a spherical shape, and in the case that the cerium oxide particles are used as an abrasive or the like, the shape is preferably a square shape. In the case of using cerium oxide particles as a co-catalyst or the like, the shape of the cerium oxide particles is required to be controlled according to the catalyst particle to be supported and the objective characteristics. The shape of the cerium oxide particles can be specified using various microscopes. In the observation using a transmission electron microscope, the shape is observed in a plan view. The above mentioned square shape is a shape observed in a plan view.

In collecting the cerium oxide particles from the discharged liquid, the cerium oxide particles may be collected after the discharged liquid is allowed to stand to be cooled to room temperature, or the cerium oxide particles may be collected after the discharged liquid is rapidly cooled to room temperature. The cerium oxide particles may be collected from the discharged liquid immediately after the discharge. By using these methods, it is also an advantage of the present invention that aging treatment taking a long time is not required particularly for obtaining the single crystal cerium oxide particles.

(State of Particles)

The cerium oxide particles obtained by the above method have a nanosize primary particle diameter of 100 nm or less, preferably 50 nm or less, further preferably 20 nm or less, and CV value (standard deviation/average particle diameter×100 [%]) is 40% or less, preferably 30% or less, further preferably 20% or less. In addition, the ratio d/D of the average crystal diameter (d) obtained by XRD measurement of the cerium oxide particles to the average particle diameter (D) obtained by particle size distribution measurement, transmission electron microscope observation (TEM observation), scanning electron microscope observation (SEM observation), or scanning transmission electron microscope observation (STEM observation) of the cerium oxide particles is 0.50 to 1.00, preferably 0.70 to 1.00.

As described above, the solvent contained in the cerium oxide raw material liquid and the solvent contained in the cerium oxide precipitation solvent may be used alone or in combination of two or more thereof. Then, the temperature of the cerium oxide raw material liquid introduced between the processing surfaces 1 and 2 may be set to a temperature higher than the standard boiling point of the solvent having the lowest standard boiling point among the single or plural solvents contained in the cerium oxide raw material liquid, and the temperature of the cerium oxide precipitation solvent introduced between the processing surfaces 1 and 2 may be set to a temperature higher than the standard boiling point of the solvent having the lowest standard boiling point among the single or plural solvents contained in the cerium oxide precipitation solvent. For example, when a mixed solvent of water and polyol is used as the solvent contained in the cerium oxide raw material liquid, the temperature of the cerium oxide raw material liquid introduced between the processing surfaces 1 and 2 may be set to a temperature higher than 100° C. of the standard boiling point of water.

The standard boiling point of propylene glycol which is one of polyols, is 188° C. By using a mixed solvent of water and propylene glycol as the solvent contained in the cerium oxide raw material liquid, it is possible to introduce the cerium oxide raw material in a non-boiling state at 100° C. or higher under a pressure lower than the standard pressure between the processing surfaces 1 and 2. The same applies when a mixed solvent of water and propylene glycol is used as the solvent contained in the cerium oxide precipitation solvent. In setting the temperature of the cerium oxide raw material liquid or the cerium oxide precipitation solvent introduced between the processing surfaces 1 and 2, the setting may be adjusted by setting both of the introduction pressure of the cerium oxide raw material liquid and the introduction pressure of the cerium oxide precipitation solvent to a pressure exceeding the standard pressure, and also by the kind of solvent or combination thereof. It is desirable that the temperature of either of the cerium oxide raw material liquid and the cerium oxide precipitation solvent is 175° C. or lower. This makes it easier to control the reaction speed in the fluid processing apparatus of this embodiment, and this greatly contributes producing stably the single crystal cerium oxide particles having uniform particle characteristics and fine size (for example, primary particle diameter of 20 nm or less).

(Elements Other than Cerium)

By using the production method of the present invention, an element other than cerium and oxygen may be solid-soluted in or compounded with the cerium oxide particles. Specifically, a compound containing an element other than cerium and oxygen may be mixed, dissolved or molecularly dispersed in either of the cerium oxide raw material liquid or the cerium oxide precipitation solvent or any other solvent different therefrom, and then mixed between the processing surfaces to precipitate the element other than cerium and oxygen together with the cerium oxide particles. The other element is not particularly limited. It can be applied to all elements on the chemical periodic table different from cerium and oxygen. The compound containing an element different from cerium and oxygen is not particularly limited, but may be an elemental substance or a compound of the element. Examples of iron (Fe) include elemental iron and an iron compound such as an iron salt and the like. The iron compounds include an inorganic iron (II) salt such as iron (II) sulfate ($FeSO_4$), iron (II) nitrate ($Fe(NO_3)_2$), iron (II) chloride ($FeCl_2$) and the like, an organic iron (II) salt such as iron (II) acetate ($Fe(CH_3COO)_2$), iron (II) citrate ($Fe(C_6H_5O_7M_2)$: M is an alkali metal or ammonium, etc.) and the like, and the like. The iron compounds further include an inorganic iron (III) salt such as iron (III) sulfate ($Fe_2(SO_4)_3$), iron (III) nitrate ($Fe(NO_3)_3$), iron (III) chloride ($FeCl_3$) and the like, an organic iron (III) salt such as iron (III) acetate ($Fe(CH_3COO)_3$ and $Fe(OH)(CH_3COO)_2$), iron (III) citrate ($C_6H_5FeO_7$) and the like, and the like. A hydrate or solvate of these substances may be also used. These substances may be used alone, or a plurality of the substances may be mixed and used.

When an element other than cerium and oxygen is solid-soluted in or compounded with the cerium oxide particles by the production method of the present invention, expected are the possibility of incorporation into the particles as crystallinity of an oxide or hydroxide of an element which is inherently difficult to obtain crystallinity in the liquid phase method, and the effect such as new characteristics other than the characteristics generated or improved by the cerium oxide particle becoming single crystals.

EXAMPLE

Hereinafter, the present invention is explained in more detail with reference to examples, but the present invention is not limited only to these examples. In the following examples, liquid A refers to the first fluid to be processed which is introduced from the first introduction part d1 of the apparatus shown in FIG. 1, and similarly, liquid B refers to the second fluid to be processed which is introduced from the second introduction part d2 of the apparatus.

In order to specify each example, "X" is added before the number of the examples relating to (X) method of producing magnetite particles. "Y" is added before the number of the examples relating to (Y) method of producing cerium oxide particles. "Z" is added before the number of the examples relating to (Z) method of producing α-hematite particles. However, "X", "Y" and "Z" are omitted in Tables 1 to 5 and the legend of each FIGs.

(X) Method of Producing Magnetite Particles

First, the method of producing magnetite particles is specifically explained with reference to examples.

Example X1

The magnetite precipitation solvent and the magnetite raw material liquid were prepared using the high-speed rotary dispersion emulsification apparatus CLEARMIX (product name: CLM-2.2 S, M. Technique Co., Ltd.).

Specifically, based on the formulation of the magnetite precipitation solvent shown in Example X1 of Table 1, the basic substance and pure water were mixed homogeneously by stirring using CLEARMIX at preparation temperature of 45° C. and at the rotor rotational speed of 10,000 rpm for 30 min to prepare the magnetite precipitation solvent.

Based on the formulation of the magnetite raw material liquid shown in Example X1 of Table 1, the magnetite particle raw material and pure water were mixed homogeneously by stirring using CLEARMIX at preparation temperature of 50° C. and at the rotor rotational speed of 20,000 rpm for 30 min to make the magnetite particle raw material be dissolved in pure water and to prepare the magnetite raw material liquid. Table 1 shows the substance name and concentration of the magnetite particle raw material which generates $Fe^{2+}$ ions in a solution, the substance name of the magnetite particle raw material which generates $Fe^{3+}$ ions in a solution, and the molar ratio $Fe^{2+}/Fe^{3+}$ of $Fe^{2+}$ to $Fe^{3+}$ in the magnetite raw material liquid, which were used in the magnetite raw material liquid. Also in Table 1, $FeSO_4.7H_2O$ represents iron (II) sulfate heptahydrate (Kanto Chemical Co., Inc., Special grade reagent), and $Fe_2(SO_4)_3.nH_2O$ represents iron (III) sulfate n hydrate (Kanto Chemical Co., Inc., Special grade reagent). The molar ratio $Fe^{2+}/Fe^{3+}$ of $Fe^{2+}$ to $Fe^{3+}$ in the magnetite raw material liquid was calculated by the method that first, the total concentration of iron ions ($Fe^{3+}$ and $Fe^{2+}$) in the magnetite raw material liquid was measured by high frequency inductively coupled heat plasma emission spectrometry (ICP); and then the concentration of $Fe^{2+}$ was determined by the titration amount of dichromic acid at the point that $Fe^{2+}$ is changed to $Fe^{3+}$ while dichromic acid is added to a solution of a part of the above magnetite raw material liquid collected; and the concentration of $Fe^{3+}$ was calculated by subtracting the concentration of $Fe^{2+}$ from the total concentration of iron ions obtained by the previous ICP measurement.

Then, the prepared magnetite precipitation solvent and the prepared magnetite raw material liquid were mixed using the fluid processing apparatus described in FIG. 1. Specifically, the magnetite raw material liquid as the first fluid to be processed (liquid A) was introduced from the first introduction part d1 of the fluid processing apparatus described in FIG. 1 into the space between the processing surfaces, and while driving the processing member 10 at a rotational speed of 1,700 rpm, the magnetite precipitation solvent as the second fluid to be processed (liquid B) was introduced into the space between the processing surfaces 1 and 2, and were mixed in the thin film fluid. The magnetite particles were precipitated in the space between the processing surfaces 1 and 2. The discharged liquid containing the magnetite particles (hereinafter, the magnetite particle dispersion liquid) was discharged from the space between the processing surfaces 1 and 2 of the fluid processing apparatus. The discharged magnetite particle dispersion liquid was collected in the beaker b through the vessel v.

The introduction temperatures (liquid sending temperatures) and the introduction pressures (liquid sending pressures) of liquid A and liquid B were measured using a thermometer and a pressure gauge provided in a sealed introduction path leading to the space between the processing surfaces 1 and 2 (the first introduction part d1 and the second introduction part d2). The introduction temperature of liquid A shown in Table 1 is the actual temperature of liquid A under the introduction pressure in the first introduction part d1. Similarly, the introduction temperature of liquid B shown in Table 1 is the actual temperature of liquid B under the introduction pressure in the second introduction part d2.

For the pH measurement, the pH meter, model number D-51 (HORIBA Ltd.) was used. The pH of the first and second fluids to be processed were measured at room temperature prior to introduction of the first and second fluids to be processed into the fluid processing apparatus. Further, it is difficult to measure the pH of the mixed fluid immediately after mixing the magnetite raw material liquid and the magnetite precipitation solvent. Therefore, the magnetite particle dispersion liquid was discharged from the apparatus and collected in the beaker b, and the pH of the liquid was measured at room temperature.

Dry powders and wet cake samples were prepared from the magnetite particle dispersion liquid which was discharged from the fluid processing apparatus, and collected in the beaker b. The preparation method was conducted according to a conventional method of this type of processing. The discharged magnetite particle dispersion liquid was collected, and the magnetite particles were settled, and the supernatant was removed. Thereafter, the magnetite particles were washed and settled seven times. A part of the finally obtained wet cake of the magnetite particles was dried to obtain the dry powders. The rest was the wet cake sample.

(Preparation of TEM Observation Sample and TEM Observation Result)

A part of the wet cake samples of the magnetite particles after the washing process obtained in Examples was dispersed in propylene glycol, and further was diluted to 100-fold by isopropyl alcohol (IPA). The resulting diluted liquid was dropped to a collodion membrane, and dried to prepare a TEM observation sample or an STEM observation sample.

(Transmission Electron Microscope)

For transmission electron microscope (TEM) observation, the transmission electron microscopy JEM-2100 (JEOL Ltd.). The observation condition was the acceleration voltage of 80 kV, and the observation magnification of 10,000 times.

The average particle diameters (D) shown in Table 1 are primary particle diameters, and the average values of the measured particle diameters of 100 particles by TEM observation were shown.

(X-Ray Diffraction Measurement)

For the X-ray diffraction (XRD) measurement, the powder X-ray diffractometer X'Pert PROMPD (XRD Spectris Co., Ltd., PANalytical Division) was used. The measurement condition was measurement range of 10 to 100 [° 2Theta], Cu anticathode, tube voltage of 45 kV, tube current of 40 mA, and scanning speed of 0.3°/min.

(XRD Measurement Result)

Figure 8:
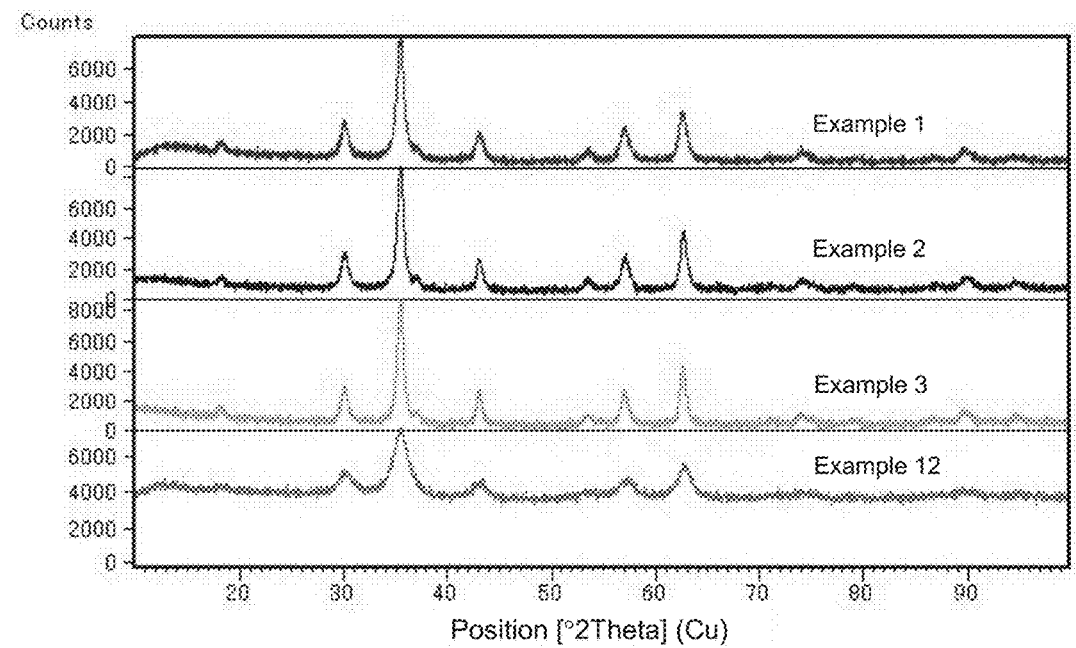
FIG. 8 shows an XRD measurement result of the magnetite particles obtained in Example X1, X2, X3 and X12 of the present invention.

XRD measurement was performed using the dry powders of the magnetite particles obtained in each example. FIG. 8 shows an XRD measurement result of Example X1. As a result of the XRD measurement, a peak corresponding to the peak of magnetite was observed, and it was confirmed that magnetite was prepared. The crystal diameter was calculated by the Scherrer's equation using the measurement result of the silicon polycrystalline plate using the obtained peak at around 35°.

(Evaluation of Single Crystal)

As a method of evaluating that the magnetite particles obtained by the examples are single crystals, the obtained magnetite particles were observed by a TEM, and from the number X (number) of the magnetite particles and the number Y (number) of the magnetite particles observed as single crystals among them, the single crystal ratio was calculated by Y/X×100(%) and was evaluated. In the TEM observation, as a criterion for judging whether or not an individual particle is a single crystal, one in which lattice stripes (atomic arrangement in the crystal) are observed in one direction is recognized as a single crystal, and one in which the lattice stripes are disturbed or grain boundaries are observed is not a single crystal.

Examples X2 to X12

In the same manner as in Example X1, magnetite particles were precipitated between the processing surfaces 1 and 2 by the reaction performed using the formulations of the magnetite precipitation solvent and the magnetite raw material liquid, the introduction flow rate, the introduction temperature and the introduction pressure described in Table 1. Dry powders and a wet cake sample were prepared from the magnetite particle dispersion liquid discharged from the fluid processing apparatus and collected in the beaker b through the vessel v. TEM observation and XRD measurement were carried out in the same manner as in Example X1, and the results shown in Table 1 were obtained. Conditions not described in Table 1 are the same as those in Example X1. The introduction temperature between the processing surfaces c (° C.) described in Table 1 is a temperature obtained by the calculation of a mixed fluid of the magnetite raw material liquid and the magnetite precipitation solvent by the following equation, using the introduction flow rate and the introduction temperature of the magnetite raw material liquid and the magnetite precipitation solvent introduced in the space between the processing surfaces 1 and 2.

$$c=(a1 \times a2+b1 \times b2)/(a2+b2)$$

wherein each symbol indicates the following meaning,
a1: introduction temperature of the magnetite raw material liquid (° C.)
a2: introduction flow rate of the magnetite raw material liquid (ml/min)
b1: introduction temperature of the magnetite precipitation solvent (° C.)
b2: introduction flow rate of the magnetite precipitation solvent (ml/min)

Figure 9:
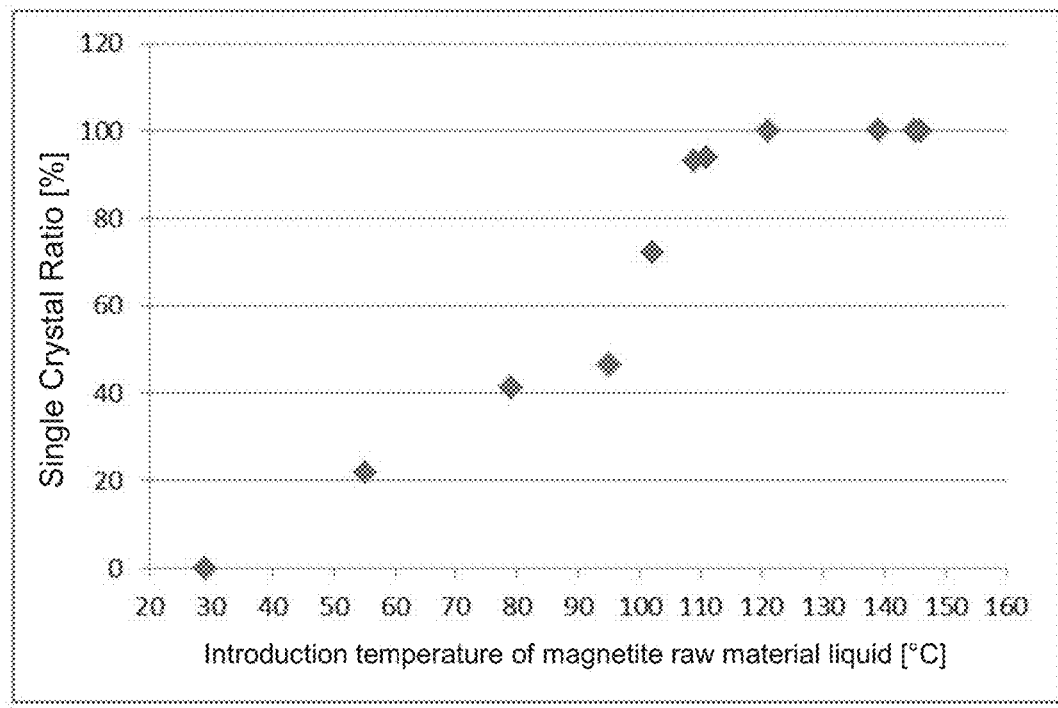
FIG. 9 shows a graph of the single crystal ratios of the magnetite particles to the introduction temperature of a magnetite law material liquid in Examples X1 to X10 and X12.
Figure 10:
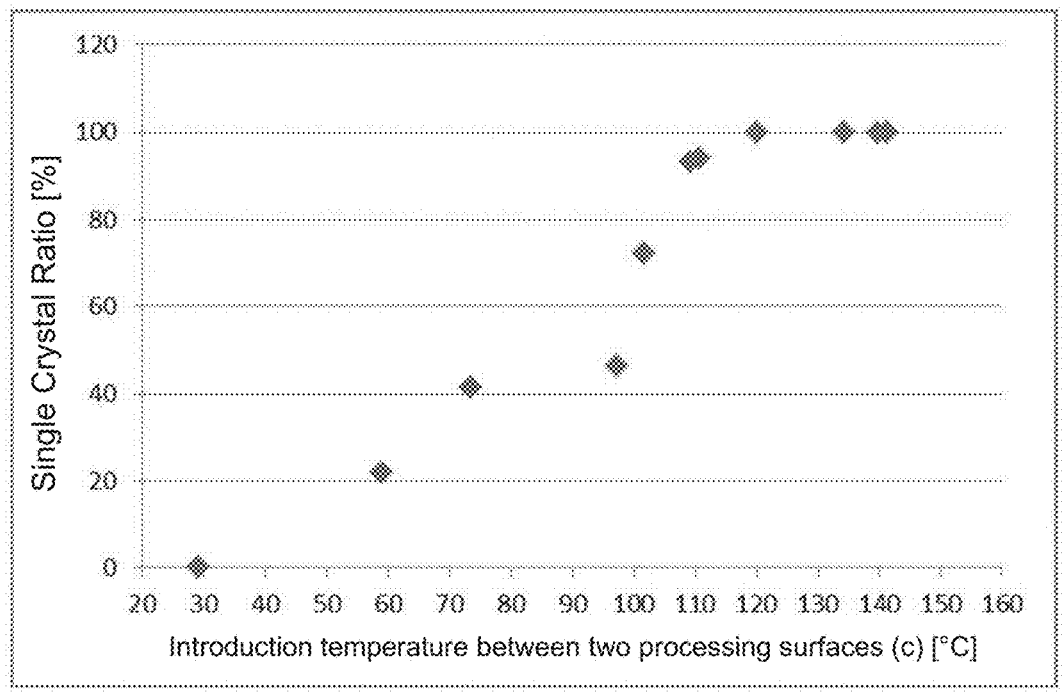
FIG. 10 shows a graph of single crystal ratios of the magnetite particles to the introduction temperature between two processing surfaces (c) in Examples X1 to X10 and X12.

FIG. 9 shows a graph of the single crystal ratios of the magnetite particles to the introduction temperature of a magnetite precipitation solvent of liquid A in Examples X1 to X10 and X12. FIG. 10 shows a graph of single crystal ratios of the magnetite particles to the introduction temperature between two processing surfaces (c) in Examples X1 to X10 and X12.

As shown in Table 1 and FIG. 9 and FIG. 10, in Examples X1 to X10 and Example X12 in which the discharged liquid was basic, the single crystal ratio was found to be improved as the temperature of the magnetite raw material liquid or the introduction temperature between two surfaces (c) increased. Further, it was found that the single crystal ratio was remarkably improved when the liquid sending temperature (introduction temperature) of the magnetite raw material liquid or the introduction temperature between the processing surfaces (c) was higher than 100° C. In Examples X1 to X10 and Example X12 in which the discharged liquid was basic, the ratio (d/D) of the crystal diameter (d) relative to the particle diameter of the magnetite (D) was improved as the liquid sending temperature (introduction temperature) of the magnetite raw material liquid or the introduction temperature between two surfaces (c) increased, and the ratio (d/D) was remarkably improved when the liquid sending temperature (introduction temperature) of the magnetite raw material liquid or the introduction temperature between two surfaces (c) was higher than 100° C. As described above, by controlling the pressure condition in the space between the processing surfaces which are disposed so as to face each other, being capable of approaching to and separating from each other, at least one of which rotates relatively to the other, the magnetite raw material liquid and the magnetite precipitation solvent can be introduced between the processing surfaces 1 and 2 under the introduction pressure of both liquids beyond the standard atmospheric pressure. Therefore, the fluids do not boil even at a temperature higher than the standard boiling point of the fluids, and the magnetite raw material liquid and the magnetite precipitation solvent can be mixed in the reaction space of several micrometer order formed between the processing surfaces, and thereby there is an advantage that the reaction can be stably carried out at a temperature higher than the standard boiling point. In such a space, instantaneous mixing, diffusion and reaction are possible, and in addition a large amount of energy such as heat and the like can be given instantaneously to the precipitated nanoparticles. Thus, the present applicant believes that it is particularly effective when obtaining nanoparticles of single crystals such as those of the present invention. Further, the pressure condition between the processing surfaces can be controlled by the liquid sending pressure (introduction pressure) of the fluids, specifically, the liquid sending pressure of the first fluid to be processed which is sent from the first introduction part d1 on the processing surface to the space between the processing surfaces, and the liquid sending pressure of the second fluid to be processed which is sent from the second introduction part d2.

Figure 3:
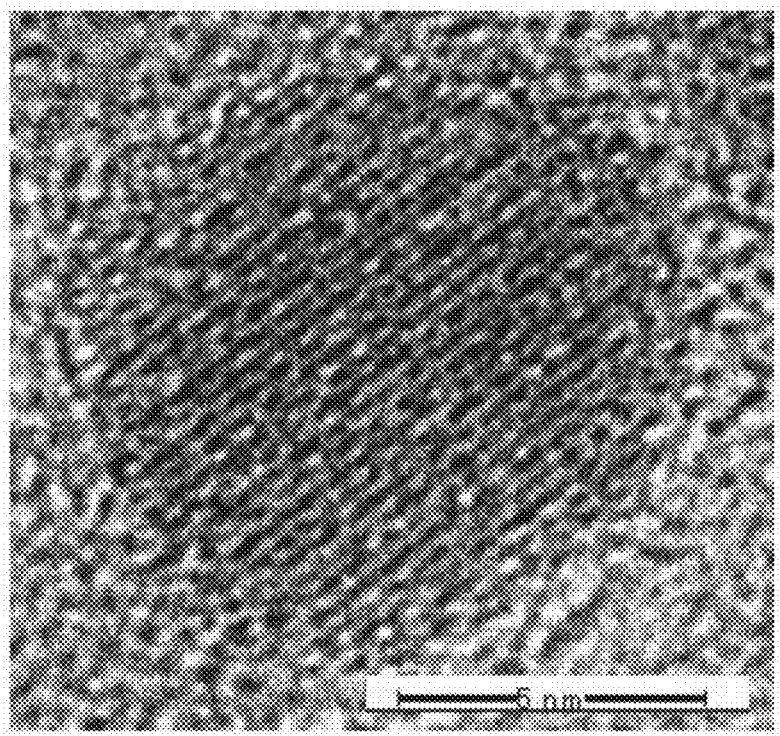
FIG. 3 shows a TEM photograph of the single crystal magnetite particles obtained in Example X1 of the present invention.
Figure 4:
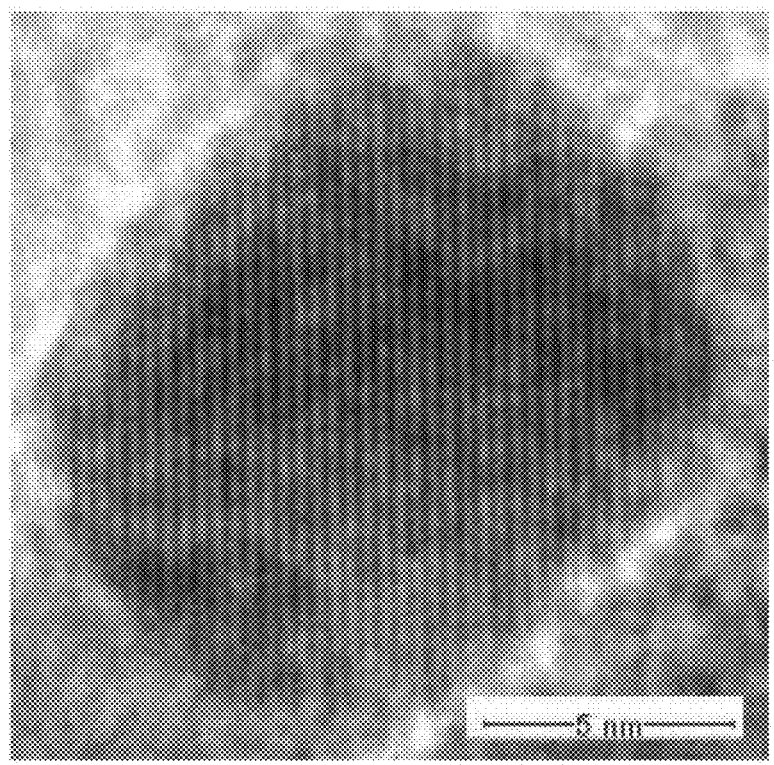
FIG. 4 shows a TEM photograph of the single crystal magnetite particles obtained in Example X2 of the present invention.
Figure 5:
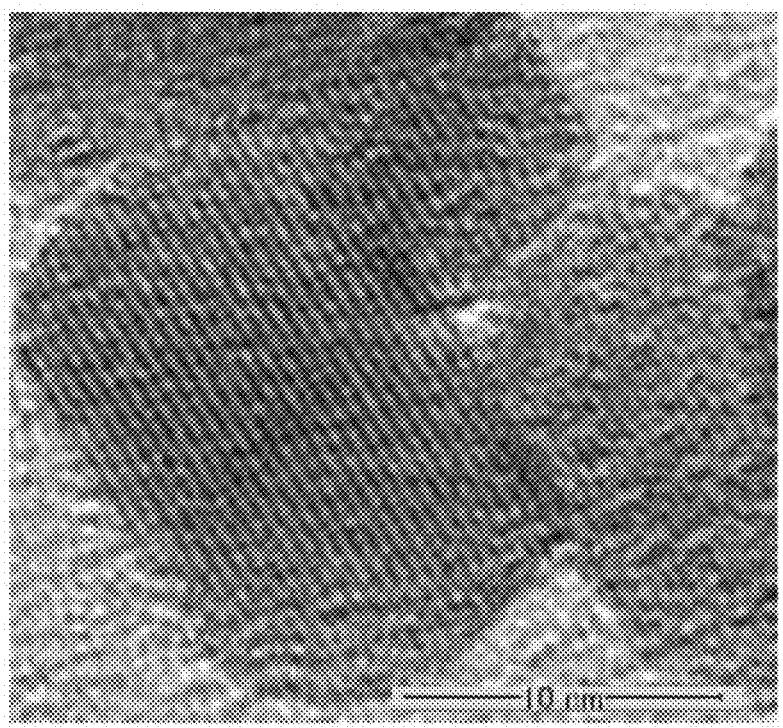
FIG. 5 shows a TEM photograph of the single crystal magnetite particles obtained in Example X3 of the present invention.
Figure 7:
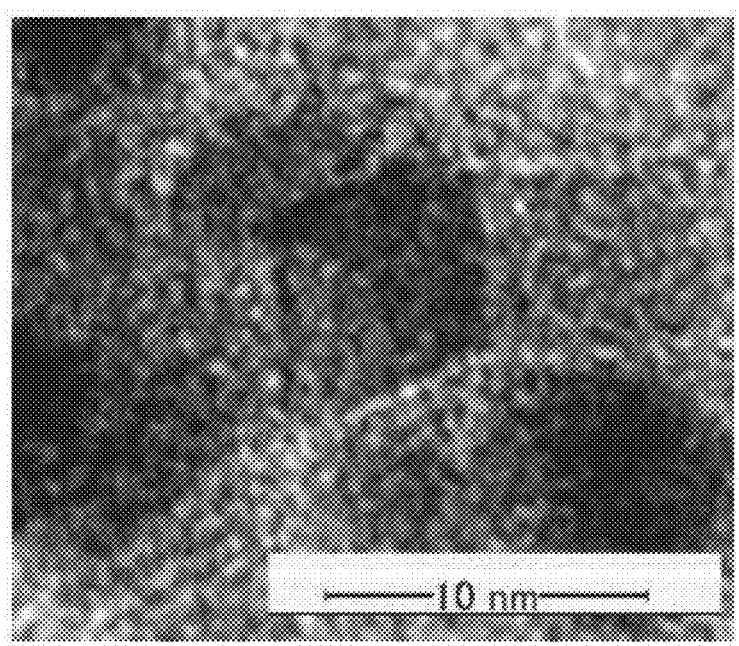
FIG. 7 shows a TEM photograph of the magnetite particles obtained in Example X12 of the present invention.

Particularly, as shown in Examples X1 to X3 and X10, all of the observed magnetite particles were single crystals when the liquid sending temperature (introduction temperature) of the magnetite raw material liquid or the introduction temperature between the processing surfaces (c) was 120° C. or higher and the pH of the discharged liquid was 9 or more. FIG. 3 shows a TEM photograph of the magnetite particles obtained in Example X1. It was found that the magnetite particles obtained in Example X1 which was prepared at pH 9.53 of the discharged liquid was single crystals and the shape was a substantially spherical shape. FIG. 4 and FIG. 5 show respectively a TEM photograph of the magnetite particles obtained in Example X2 and Example X3. The pH of the discharged liquid in Example X2 (FIG. 4) was 12.69, the pH of the discharged liquid in Example X3 (FIG. 5) was 13.34, and the pH of the discharged liquid in Example X10 (FIG. 6) was 14.00. As the pH of the discharged liquid was higher, the shape of the particles became from a substantially spherical shape to a polygonal shape. In other words, this means that the particle shape can be controlled by the pH of the discharged liquid (mixed fluid). Next, FIG. 7 shows a TEM photograph of the magnetite particles obtained in Example X12. As seen in FIG. 7, the magnetite particles obtained in Example X12 were not only single crystals, but also almost no interference fringes of the crystal lattice were confirmed. FIG. 8 shows XRD measurement results of the magnetite particles obtained in Examples X1, X2, X3 and X12. In all of Examples X1, X2, X3 and X12 shown in FIG. 8, only peaks derived substantially from magnetite were detected, but it was confirmed that the peaks of Example X12 was broad, their crystallinity was low and their crystallite diameter was small in comparison with Examples X1, X2 and X3. In addition, the condition of Example X11 was that both of the introduction temperature of the magnetite raw material liquid and the introduction temperature between the processing surfaces (c) were 120° C. or higher, but the introduction flow rate of the magnetite precipitation solvent of the B liquid was changed, and the pH of the discharged liquid was 4.16. It was found that the single crystal ratio was lower as compared with Example X in which the pH of the discharged liquid was 9 or more.

TABLE 1

| | | Formulation of magnetite raw material liquid (Liquid A) | | | | | |
|---|---|---|---|---|---|---|---|
| | | Solvent/ Formulation [wt %] | $Fe^{2+}$/ Formulation [wt %] | $Fe^{3+}$/ Formulation [wt %] | Molar ratio $Fe^{2+}/Fe^{3+}$ | pH | pH measurement temperature [° C.] |
| Example | 1 | Pure water 98.00 | $Fe(SO_4)_2 \cdot 7H_2O$ 0.65 | $Fe_2(SO_4)_3 \cdot nH_2O$ 1.35 | 0.499 | 2.01 | 27.1 |
| | 2 | Pure water 98.00 | $Fe(SO_4)_2 \cdot 7H_2O$ 0.65 | $Fe_2(SO_4)_3 \cdot nH_2O$ 1.35 | 0.499 | 2.01 | 27.1 |
| | 3 | Pure water 98.00 | $Fe(SO_4)_2 \cdot 7H_2O$ 0.65 | $Fe_2(SO_4)_3 \cdot nH_2O$ 1.35 | 0.495 | 1.99 | 26.9 |
| | 4 | Pure water 98.00 | $Fe(SO_4)_2 \cdot 7H_2O$ 0.65 | $Fe_2(SO_4)_3 \cdot nH_2O$ 1.35 | 0.497 | 2.00 | 27.0 |
| | 5 | Pure water 98.00 | $Fe(SO_4)_2 \cdot 7H_2O$ 0.65 | $Fe_2(SO_4)_3 \cdot nH_2O$ 1.35 | 0.501 | 2.02 | 27.0 |
| | 6 | Pure water 98.00 | $Fe(SO_4)_2 \cdot 7H_2O$ 0.65 | $Fe_2(SO_4)_3 \cdot nH_2O$ 1.35 | 0.502 | 2.01 | 26.4 |
| | 7 | Pure water 98.00 | $Fe(SO_4)_2 \cdot 7H_2O$ 0.65 | $Fe_2(SO_4)_3 \cdot nH_2O$ 1.35 | 0.501 | 2.02 | 27.0 |
| | 8 | Pure water 98.00 | $Fe(SO_4)_2 \cdot 7H_2O$ 0.65 | $Fe_2(SO_4)_3 \cdot nH_2O$ 1.35 | 0.500 | 2.01 | 24.9 |
| | 9 | Pure water 98.00 | $Fe(SO_4)_2 \cdot 7H_2O$ 0.65 | $Fe_2(SO_4)_3 \cdot nH_2O$ 1.35 | 0.501 | 2.02 | 27.0 |
| | 10 | Pure water 98.00 | $Fe(SO_4)_2 \cdot 7H_2O$ 0.65 | $Fe_2(SO_4)_3 \cdot nH_2O$ 1.35 | 0.502 | 2.01 | 26.4 |
| | 11 | Pure water 98.00 | $Fe(SO_4)_2 \cdot 7H_2O$ 0.65 | $Fe_2(SO_4)_3 \cdot nH_2O$ 1.35 | 0.501 | 2.02 | 27.0 |
| | 12 | Pure water 98.00 | $Fe(SO_4)_2 \cdot 7H_2O$ 0.65 | $Fe_2(SO_4)_3 \cdot nH_2O$ 1.35 | 0.498 | 1.97 | 25.9 |

| | | Formulation of magnetite precipitation solvent (liquid B) | | | | Introduction flow rate | | Introduction temperature (liquid ending temperature) | | Introduction pressure (liquid sending pressure) | |
|---|---|---|---|---|---|---|---|---|---|---|---|
| | | Basic solvent/ Formulation [wt %] | | | pH | Liquid A [ml/min] | Liquid B | Liquid A [° C.] | Liquid B | Liquid A [MPaG] | Liquid B |
| Example | 1 | NaOH 9.0 | Pure water | 91.0 | >14 | 400 | 50 | 146 | 102 | 0.401 | 0.42 |
| | 2 | NaOH 9.0 | Pure water | 91.0 | >14 | 400 | 60 | 145 | 104 | 0.410 | 0.43 |
| | 3 | NaOH 18.0 | Pure water | 82.0 | >14 | 400 | 50 | 121 | 113 | 0.252 | 0.32 |
| | 4 | NaOH 18.0 | Pure water | 82.0 | >14 | 400 | 60 | 111 | 109 | 0.209 | 0.42 |
| | 5 | NaOH 18.0 | Pure water | 82.0 | >14 | 400 | 80 | 109 | 110 | 0.198 | 0.32 |
| | 6 | NaOH 18.0 | Pure water | 82.0 | >14 | 400 | 70 | 95 | 110 | 0.110 | 0.41 |
| | 7 | NaOH 18.0 | Pure water | 82.0 | >14 | 400 | 50 | 79 | 30 | 0.104 | 0.21 |
| | 8 | NaOH 36.0 | Pure water | 64.0 | >14 | 400 | 80 | 55 | 78 | 0.103 | 0.15 |
| | 9 | KOH 36.0 | Pure water | 64.0 | >14 | 400 | 80 | 102 | 99.1 | 0.291 | 0.41 |
| | 10 | KOH 36.0 | Pure water | 64.0 | >14 | 400 | 80 | 139 | 110 | 0.356 | 0.41 |
| | 11 | NaOH 18.0 | Pure water | 82.0 | >14 | 400 | 30 | 124 | 110 | 0.241 | 0.32 |
| | 12 | NaOH 18.0 | Pure water | 82.0 | >14 | 400 | 50 | 29 | 30 | 0.085 | 0.34 |

TABLE 1-continued

|  |  | Introduction temperature between processing surfaces (c) [° C.] | Discharged liquid pH | Discharged liquid [° C.] | Single crystal ratio [%] | Average particle diameter (D) [nm] | Crystal diameter (d) [nm] | d/D | CV value [%] | XRD pattern |
|---|---|---|---|---|---|---|---|---|---|---|
| Example | 1 | 141.11 | 9.53 | 23.9 | 100.0 | 11.4 | 11.4 | 1.00 | 8.90 | $Fe_3O_4$ only |
|  | 2 | 139.65 | 12.69 | 26.4 | 100.0 | 12.9 | 12.9 | 1.00 | 11.10 | $Fe_3O_4$ only |
|  | 3 | 120.11 | 13.34 | 24.1 | 100.0 | 13.4 | 13.4 | 1.00 | 10.20 | $Fe_3O_4$ only |
|  | 4 | 110.74 | 13.35 | 23.9 | 94.1 | 14.1 | 12.7 | 0.90 | 13.40 | $Fe_3O_4$ only |
|  | 5 | 109.17 | 13.49 | 23.8 | 93.1 | 20.1 | 17.8 | 0.89 | 19.40 | $Fe_3O_4$ only |
|  | 6 | 97.23 | 13.48 | 25.9 | 46.4 | 9.9 | 5.1 | 0.52 | 29.30 | $Fe_3O_4$ only |
|  | 7 | 73.56 | 13.34 | 23.8 | 41.3 | 31.4 | 13.4 | 0.43 | 24.50 | $Fe_3O_4$ only |
|  | 8 | 58.83 | 13.94 | 25.5 | 21.9 | 33.2 | 7.8 | 0.23 | 26.40 | $Fe_3O_4$ only |
|  | 9 | 101.52 | 13.90 | 25.7 | 72.1 | 46.5 | 37.1 | 0.80 | 21.20 | $Fe_3O_4$ only |
|  | 10 | 134.17 | 14.00 | 25.7 | 100.0 | 13.1 | 13.1 | 1.00 | 10.10 | $Fe_3O_4$ only |
|  | 11 | 123.02 | 4.16 | 27.9 | 51.4 | 11.4 | 6.2 | 0.52 | 45.90 | $Fe_3O_4$ only |
|  | 12 | 29.11 | 13.20 | 24.0 | 0.0 | 7.1 | 0.3 | 0.04 | 41.90 | $Fe_3O_4$ only |

(Y) Method of Producing Cerium Oxide Particles

Next, a method for producing cerium oxide particles is specifically explained with reference to examples.

Example Y1

The cerium oxide precipitation solvent and the cerium oxide raw material liquid were prepared using the high-speed rotary dispersion emulsification apparatus CLEAR-MIX (product name: CLM-2.2 S, M. Technique Co., Ltd.).

Specifically, based on the formulation of the cerium oxide precipitation solvent shown in Example Y1 of Table 2, the basic substance and pure water were mixed homogeneously by stirring using CLEARMIX at preparation temperature of 45° C. and at the rotor rotational speed of 10,000 rpm for 30 min to prepare the cerium oxide precipitation solvent.

Based on the formulation of the cerium oxide raw material liquid shown in Example Y1 of Table 2, the cerium oxide particle raw material and pure water were mixed homogeneously by stirring using CLEARMIX at preparation temperature of 50° C. and at the rotor rotational speed of 20,000 rpm for 30 min to make the cerium oxide particle raw material be dissolved in pure water and to prepare the cerium oxide raw material liquid. In Table 2, $Ce(NO_3)_3 \cdot 6H_2O$ represents cerium (III) nitrate hexahydrate, $NH_3$ represents ammonia, and NaOH represents sodium hydroxide. As $Ce(NO_3)_3 \cdot 6H_2O$, a special grade reagent (Wako Pure Chemical Industries, Ltd.) was used, as $NH_3$, a special grade reagent (containing 28 wt % of $NH_3$, Kanto Kagaku Co., Inc.) was used, and as NaOH, a special grade reagent (Kanto Kagaku Co., Inc.) was used.

Then, the prepared cerium oxide precipitation solvent and the prepared cerium oxide raw material liquid were mixed in the process condition described in Table 2 using the fluid processing apparatus shown in FIG. 1. Specifically, the cerium oxide precipitation solvent as the first fluid to be processed (liquid A) was introduced from the first introduction part d1 of the fluid processing apparatus shown in FIG. 1 into the space between the processing surfaces, and while driving the processing member 10 at a rotational speed of 1,700 rpm, the cerium oxide raw material liquid as the second fluid to be processed (liquid B) was introduced from the second introduction part d2 of the fluid processing apparatus shown in FIG. 1 into the space between the processing surfaces 1 and 2, and were mixed in the thin film fluid. The cerium oxide particles were precipitated in the space between the processing surfaces 1 and 2. The discharged liquid containing the cerium oxide particles (hereinafter, the cerium oxide particle dispersion liquid) was discharged from the space between the processing surfaces 1 and 2 of the fluid processing apparatus. The discharged cerium oxide particle dispersion liquid was collected in the beaker b through the vessel v.

The introduction temperatures (liquid sending temperatures) and the introduction pressures (liquid sending pressures) of liquid A and liquid B were measured using a thermometer and a pressure gauge provided in a sealed introduction path leading to the space between the processing surfaces 1 and 2 (the first introduction part d1 and the second introduction part d2). The introduction temperature of liquid A shown in Table 2 is the actual temperature of liquid A under the introduction pressure in the first introduction part d1. Similarly, the introduction temperature of liquid B shown in Table 2 is the actual temperature of liquid B under the introduction pressure in the second introduction part d2.

For the pH measurement, the pH meter, model number D-51 (HORIBA Ltd.) was used. The pH of the first and second fluids to be processed and the temperature at measuring the pH were measured at room temperature prior to introduction of the first and second fluids to be processed into the fluid processing apparatus. Further, it is difficult to measure the pH of the mixed fluid immediately after mixing the cerium oxide raw material liquid and the cerium oxide precipitation solvent. Therefore, the cerium oxide particle dispersion liquid was discharged from the apparatus and collected in the beaker b, and the pH of the liquid was measured at room temperature.

Dry powders and wet cake samples were prepared from the cerium oxide particle dispersion liquid which was discharged from the fluid processing apparatus, and collected in the beaker b. The preparation method was conducted according to a conventional method of this type of processing. The discharged cerium oxide particle dispersion liquid was collected, and the cerium oxide particles were settled, and the supernatant was removed. Thereafter, the cerium oxide particles were washed and settled seven times by pure water (pH 5.94, conductivity: 0.84 µS/cm). A part of the finally obtained wet cake of the cerium oxide particles was dried to obtain the dry powders. The rest was the wet cake sample.

(Production of TEM Observation Sample)

A part of the wet cake samples of the cerium oxide particles after the washing process obtained in Examples was dispersed in propylene glycol, and further was diluted to 100-fold by isopropyl alcohol (IPA). The resulting diluted liquid was dropped to a collodion membrane, and dried to prepare a TEM observation sample or an STEM observation sample.

(Transmission Electron Microscope)

For transmission electron microscope (TEM) observation, the transmission electron microscopy JEM-2100 (JEOL Ltd.). The observation condition was the acceleration voltage of 200 kV, and the observation magnification of 10,000 times.

The average particle diameters (D) shown in Tables 2 and 3 are average values of primary particle diameters, and the average values of the measured particle diameters of 100 particles by TEM observation were shown.

(X-ray Diffraction Measurement)

For the X-ray diffraction (XRD) measurement, the powder X-ray diffractometer X'Pert PROMPD (XRD Spectris Co., Ltd., PANalytical Division) was used. The measurement condition was measurement range of 10 to 100 [° 2Theta], Cu anticathode, tube voltage of 45 kV, tube current of 40 mA, and scanning speed of 0.3°/min.

(Calculation of Crystal Diameter)

XRD measurement was performed using the dry powders of the cerium oxide particles obtained in each example. The crystal diameter was calculated by the Scherrer's equation using the measurement result of the silicon polycrystalline plate using the obtained peak at around 28.5°, which is referred to as the average crystal diameter (d).

(Evaluation of Single Crystal)

As a method of evaluating that the cerium oxide particles obtained by the examples are single crystals, the obtained cerium oxide particles were observed by TEM, and from the number X (number) of the cerium oxide particles and the number Y (number) of the cerium oxide particles observed as single crystals among them, the single crystal ratio was calculated by Y/X×100(%) and was evaluated. In the TEM observation, as a criterion for judging whether or not an individual particle is a single crystal, one in which lattice stripes (atomic arrangement in the crystal) is observed in one direction is recognized as a single crystal, and one in which the lattice stripes are disturbed or grain boundaries are observed is not a single crystal.

Examples Y2 to Y16

In the same manner as in Example Y1, the reaction was performed in Examples Y2 to Y16 using the formulations of the cerium oxide precipitation solvent and the cerium oxide raw material liquid, and other processing conditions described in Table 2, and cerium oxide particles were precipitated between the processing surfaces 1 and 2. Dry powders and a wet cake sample were prepared from the cerium oxide particle dispersion liquid discharged from the fluid processing apparatus and collected in the beaker b through the vessel v. TEM observation and XRD measurement were carried out in the same manner as in Example Y1, and Table 2 shows the results of Examples Y1 to Y16. Conditions not described in Table 2 are the same as those in Example Y1. The introduction temperature between the processing surfaces c (° C.) described in Table 2 is a temperature obtained by the calculation of a mixed fluid of the cerium oxide raw material liquid and the cerium oxide precipitation solvent by the following equation, using the introduction flow rate and the introduction temperature of the cerium oxide raw material liquid and the cerium oxide precipitation solvent introduced in the space between the processing surfaces 1 and 2.

$$c=(a1 \times a2+b1 \times b2)/(a2+b2)$$

wherein each symbol indicates the following meaning,
a1: introduction temperature of the cerium oxide raw material liquid (° C.)
a2: introduction flow rate of the cerium oxide raw material liquid (ml/min)
b1: introduction temperature of the cerium oxide precipitation solvent (° C.)
b2: introduction flow rate of the cerium oxide precipitation solvent (ml/min)

Figure 17:
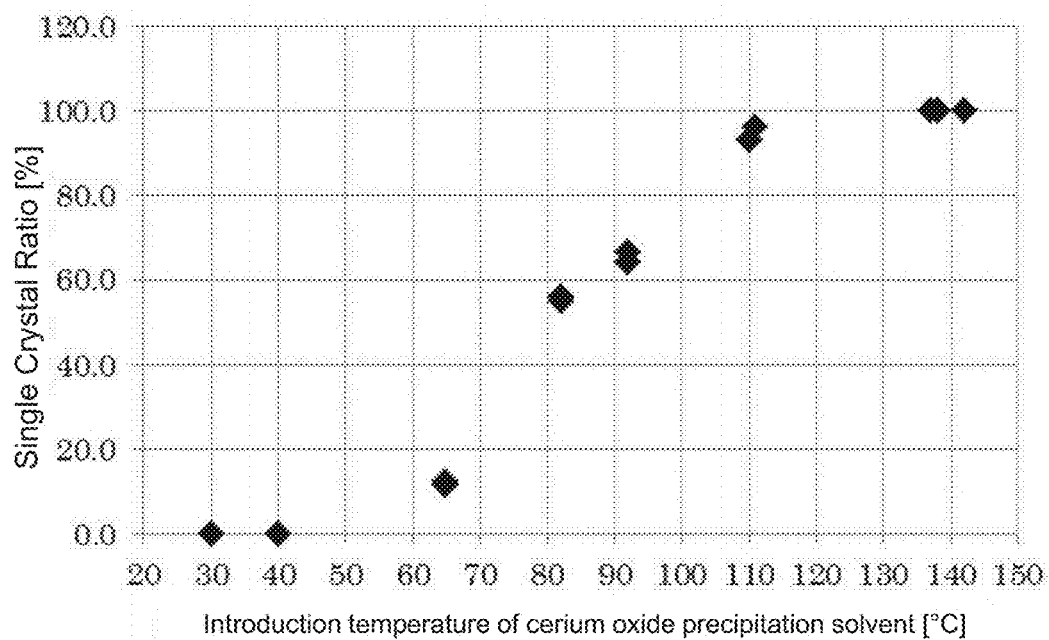
FIG. 17 shows a graph of the single crystal ratios of the cerium oxide particles to the introduction temperature of a cerium oxide precipitation solvent in Examples Y1 to Y12, Y15 and Y16.
Figure 18:
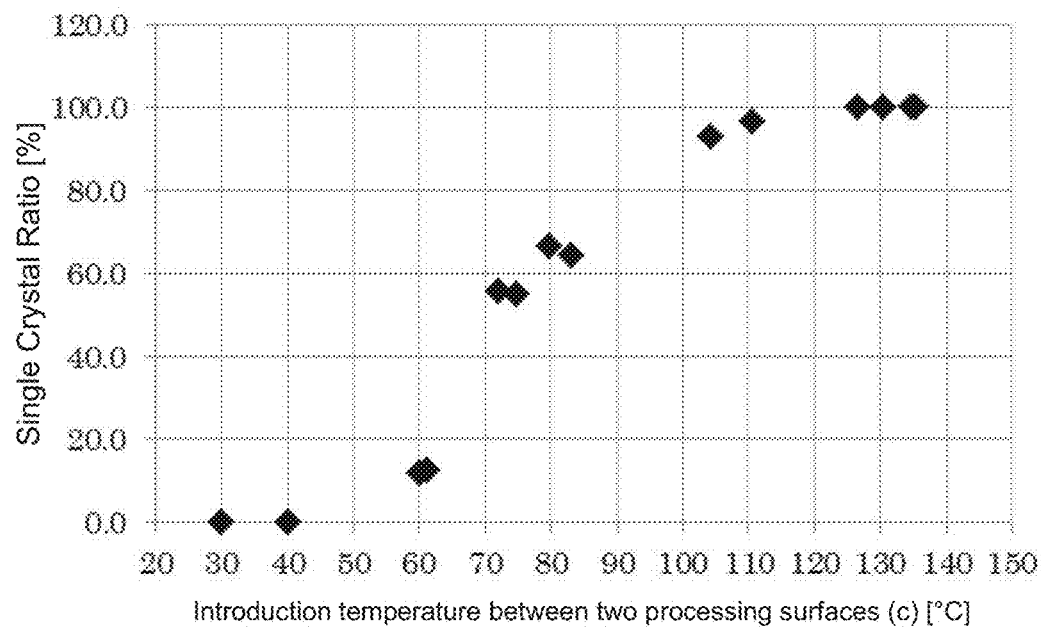
FIG. 18 shows a graph of single crystal ratios of the cerium oxide particles to the introduction temperature between two processing surfaces (c) in Examples Y1 to Y12, Y15 and Y16.

FIG. 17 shows a graph of the single crystal ratios of the cerium oxide particles to the introduction temperature of a cerium oxide precipitation solvent of liquid A in Examples Y1 to Y12, Y15 and Y16. FIG. 18 shows a graph of single crystal ratios of the cerium oxide particles to the introduction temperature between the processing surfaces (c) in Examples Y1 to Y12, Y15 and Y16.

As shown in Table 2 and FIG. 17 and FIG. 18, in Examples Y1 to Y12 in which the single crystal ratio exceeded 0 and the pH of the discharged liquid was in the range of 6.0 to 9.0, it was revealed that the single crystal ratio was improved, as the liquid sending temperature (introduction temperature) of cerium oxide precipitation solvent and the introduction temperature between processing surfaces (c) increased. Furthermore, it was found that the single crystal ratio was markedly improved when the liquid sending temperature (introduction temperature) of the cerium oxide precipitation solvent or the introduction temperature between the processing surfaces (c) was higher than 100° C. Further, in Examples Y1 to Y12 in which the single crystal ratio exceeded 0 and the pH of the discharged liquid was in the range of 6.0 to 9.0, the ratio (d/D) of the crystallite diameter (d) to the cerium oxide particle diameter (D) was improved, as the liquid sending temperature (introduction temperature) of cerium oxide precipitation solvent or the introduction temperature between processing surfaces (c) increased, and the above ratio (d/D) was markedly improved when the liquid sending temperature (introduction temperature) of the cerium oxide precipitation solvent or the introduction temperature between the processing surfaces (c) was higher than 100° C. As described above, by controlling the pressure condition in the space between the processing surfaces which are disposed so as to face each other, being capable of approaching to and separating from each other, at least one of which rotates relatively to the other, the cerium oxide raw material liquid and the cerium oxide precipitation solvent can be introduced between the processing surfaces 1 and 2 under the introduction pressure of both liquids beyond the standard atmospheric pressure. Therefore, the fluids do not boil even at a temperature higher than the standard boiling point of the fluids, and the cerium oxide raw material liquid and the cerium oxide precipitation solvent can be mixed in the reaction space of several micrometer order formed between the processing surfaces, and thereby there is an advantage that the reaction can be stably carried out at a temperature higher than the standard boiling point. In such a space, instantaneous mixing, diffusion and reaction are possible, and in addition a large amount of energy such as heat and the like can be given instantaneously to the precipitated nanoparticles. Thus, the present applicant believes that it is particularly effective when obtaining nanoparticles of single crystals such as those of the present invention. Further, the pressure condition between the processing surfaces can be controlled by the liquid sending pressure (introduction pressure) of the fluids, specifically, the liquid sending pressure of the first fluid to be processed which is sent from the first introduction part d1 on the processing surface to the space between the processing surfaces, and the liquid sending pressure of the second fluid to be processed which is sent from the second introduction part d2.

Figure 11:
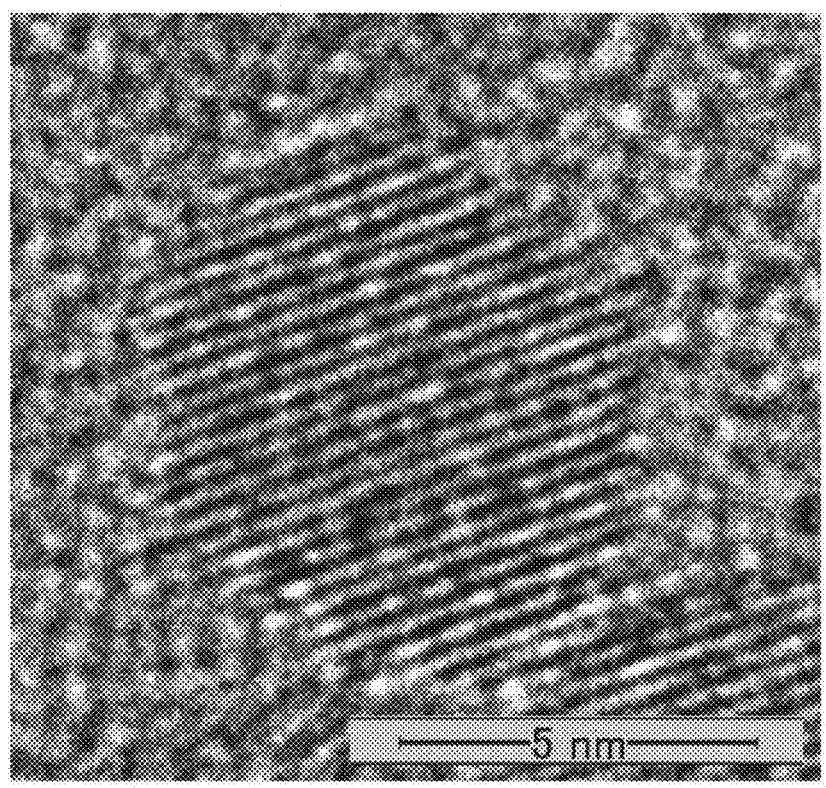
FIG. 11 shows a TEM photograph of the single crystal cerium oxide particles obtained in Example Y8 of the present invention.
Figure 13:
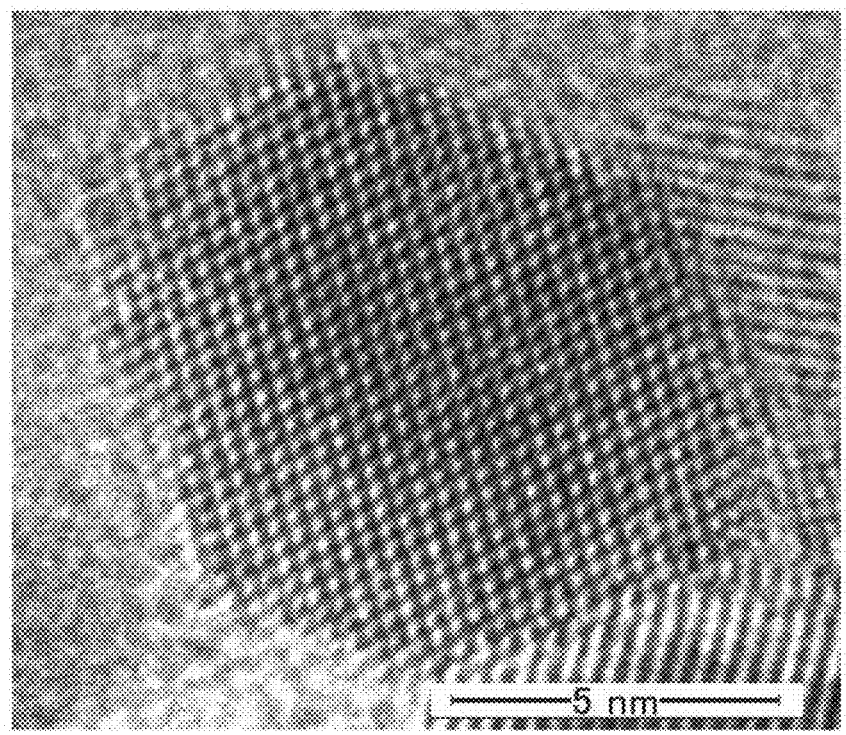
FIG. 13 shows a TEM photograph of the single crystal cerium oxide particles obtained in Example Y10 of the present invention.
Figure 14:
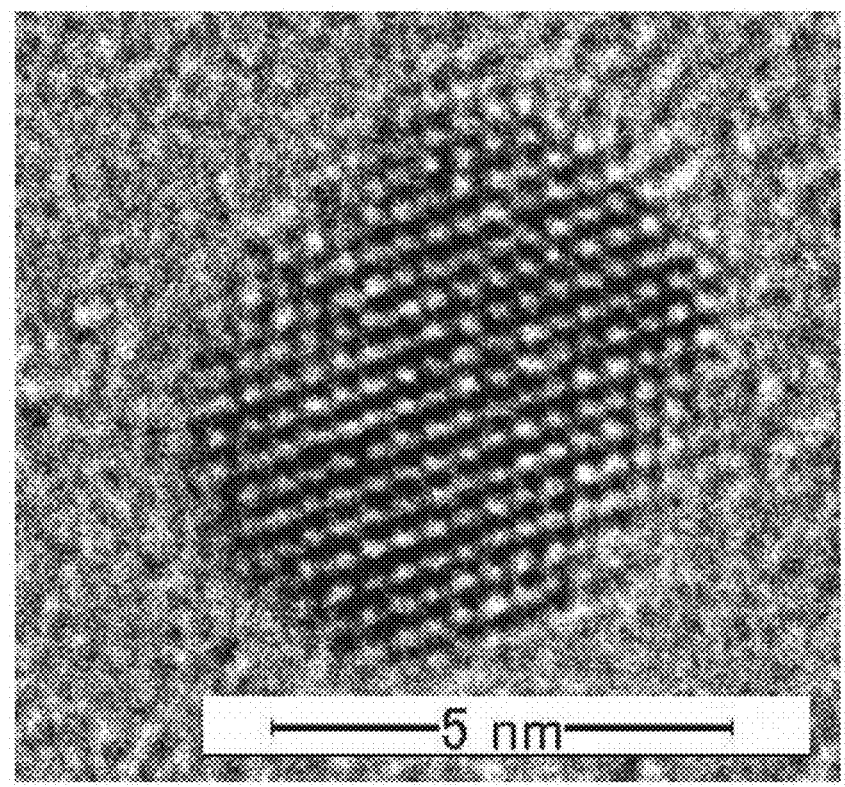
FIG. 14 shows a TEM photograph of the single crystal cerium oxide particles obtained in Example Y11 of the present invention.
Figure 15:
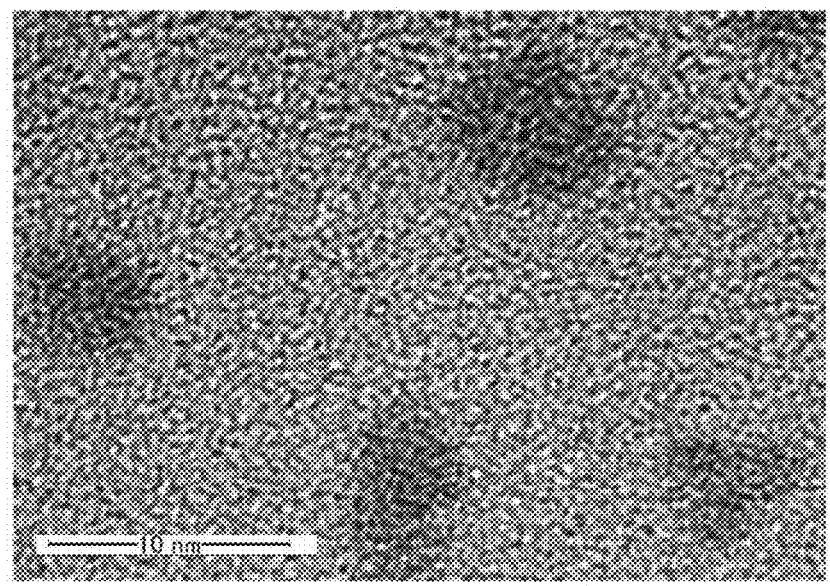
FIG. 15 shows a TEM photograph of the cerium oxide particles obtained in Example Y15 of the present invention.
Figure 16:
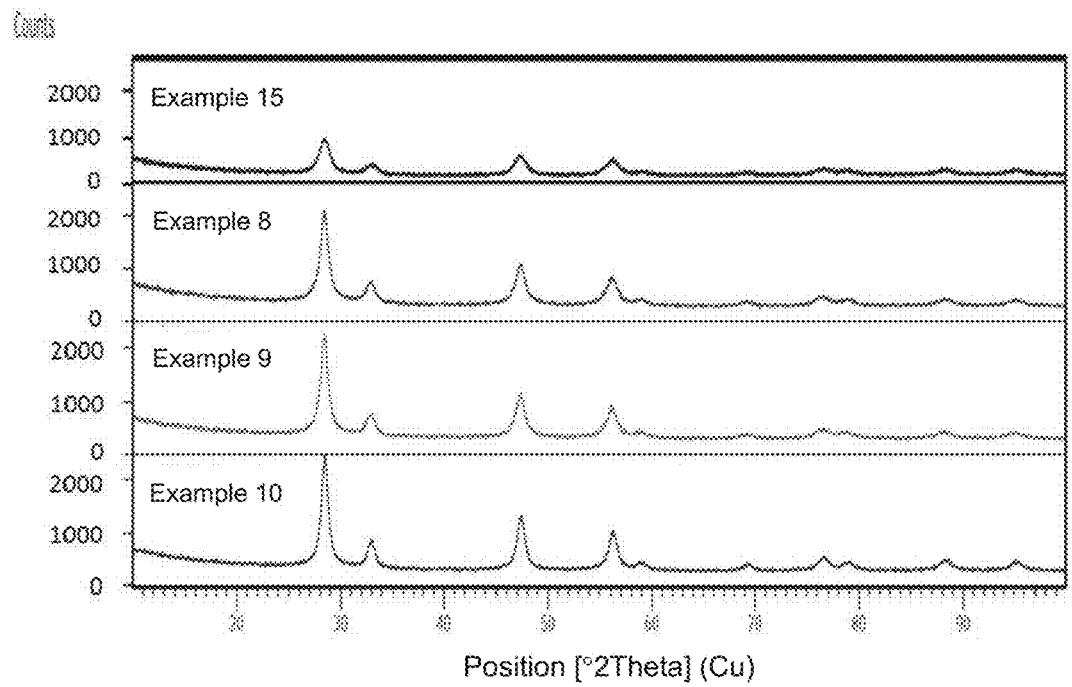
FIG. 16 shows an XRD measurement result of the cerium oxide particles obtained in Example Y8, Y9, Y10 and Y15 of the present invention.
Figure 21:
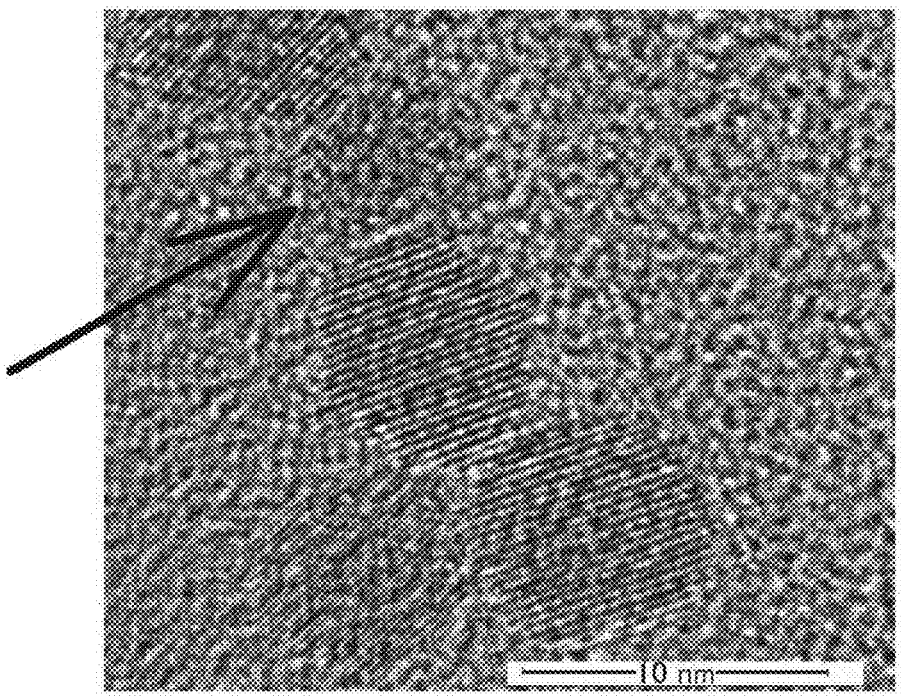
FIG. 21 shows a TEM photograph of the cerium oxide particles obtained in Example Y6 of the present invention.

Particularly, as shown in Examples Y9 to Y12, all of the observed cerium oxide particles were single crystals when both of the liquid sending temperature (introduction temperature) of the cerium oxide raw material liquid and the introduction temperature between the processing surfaces (c) was 120° C. or higher and the pH of the discharged liquid was in the range of 6.0 to 9.0. FIG. 11 shows a TEM photograph of the cerium oxide particles obtained in Example Y8. In Example Y8, ammonia was used as the basic substance of the cerium oxide precipitation solvent, and the pH of the discharged liquid was 8.10. It was found that the cerium oxide particles obtained in Example Y8 included single crystals as shown in FIG. 11, and the shape was a substantially spherical shape. FIG. 12, FIG. 13 and FIG. 14 show respectively a TEM photograph of the cerium oxide particles obtained in Example Y9, Y10 and Y11. In FIG. 11 to FIG. 14, lattice stripes were observed in one direction. In Example Y9 (FIG. 12), ammonia was used as the basic substance of the cerium oxide precipitation solvent, and the pH of the discharged liquid was 7.14. The cerium oxide particles obtained in Example Y9 were single crystals and were found to be a square (rectangular) shape. In Example Y10 (FIG. 13), ammonia was used as the basic substance of the cerium oxide precipitation solvent, and the pH of the discharged liquid was 8.79. The cerium oxide particles obtained in Example Y10 were single crystals and were found to be a polygonal shape. In Example Y11 (FIG. 14), sodium hydroxide was used as the basic substance of the cerium oxide precipitation solvent, and the pH of the discharged liquid was 6.91. The cerium oxide particles obtained in Example Y11 were single crystals and were found to be a polygonal shape. FIG. 21 shows a TEM photograph of the cerium oxide particles obtained in Example Y6. Most of the cerium oxide particles obtained in Example Y6 were single crystals, but particles in which interference fringes of the crystal lattice were partially unclearly observed in the particles, and particles in which interference fringes of the crystal lattice were hardly observed were also confirmed. In FIG. 21 in which five cerium oxide particles are shown, no crystal lattice was observed in three lower particles and one upper particle (particles indicated by arrows in FIG. 21). However, when focusing on the particles in which the crystal lattice was not observed, lattice stripes were observed in the particles. Therefore, all cerium oxide particles shown in FIG. 21 were single crystals. In the TEM observation, in order to observe all of a plurality of particles as single crystal particles, it is necessary to make uniform the particle thickness, the height at observation, and the like for all the particles. Almost all of the cerium oxide particles obtained in Example Y7 were single crystals, but particles in which interference fringes of the crystal lattice were partially unclearly observed in the particles were rarely confirmed. Next, FIG. 15 shows a TEM photograph of the cerium oxide particles obtained in Example Y15. As seen in FIG. 15, the cerium oxide particles obtained in Example Y15 were not single crystals, and almost no interference fringes of the crystal lattice were confirmed. FIG. 16 shows XRD measurement results of the cerium oxide particles obtained in Examples Y8, Y9, Y10 and Y15. In all the XRD measurement results of Examples Y1 to Y16 including Examples Y8 to Y10 and Y15 shown in FIG. 16, only peaks substantially derived from cerium oxide were detected, but it was confirmed that the peaks of Examples Y15 and Y16 were broad, and their crystallinity was low and their crystallite diameter was small in comparison with Examples Y1 to Y14. In Examples Y13 and Y14, both of the introduction temperature of the cerium oxide precipitation solvent and the introduction temperature between the processing surfaces (c) were 120° C. or higher, but the pH of the discharged liquids were respectively 10.30 and 11.84. It was found that the cerium oxide particles obtained in Examples Y13 and Y14 had lower single crystal ratios than those of Examples Y9 to Y12 in which the pH of the discharged liquid was in the range of 6.0 to 9.0.

TABLE 2

| | | Formulation of cerium oxide precipitation solvent (liquid A) | | | | | Formulation of cerium oxide raw material liquid (Liquid B) | | | | | | Introduction flow rate | |
|---|---|---|---|---|---|---|---|---|---|---|---|---|---|---|
| | | Formulation [wt %] | | | pH | pH measurement temperature [° C.] | Formulation [wt %] | | | | pH | pH measurement temperature [° C.] | Liquid A [ml/min] | Liquid B [ml/min] |
| Example | 1 | Pure water | 99.75 | NH$_3$ | 0.25 | 10.15 | 26.9 | Ce(NO$_3$)$_3$ 6H$_2$O | 9.0 | Pure water | 91.0 | 3.14 | 31.2 | 100 | 30 |
| | 2 | Pure water | 99.75 | NH$_3$ | 0.25 | 10.15 | 26.9 | Ce(NO$_3$)$_3$ 6H$_2$O | 9.0 | Pure water | 91.0 | 3.14 | 31.2 | 150 | 30 |
| | 3 | Pure water | 99.75 | NH$_3$ | 0.25 | 10.15 | 26.9 | Ce(NO$_3$)$_3$ 6H$_2$O | 9.0 | Pure water | 91.0 | 3.14 | 31.2 | 150 | 30 |

TABLE 2-continued

| | | | | | | | | | | | | | | |
|---|---|---|---|---|---|---|---|---|---|---|---|---|---|---|
| 4 | Pure water | 99.75 | NH$_3$ | 0.25 | 10.15 | 26.9 | Ce(NO$_3$)$_3$ 6H$_2$O | 9.0 | Pure water | 91.0 | 3.14 | 31.2 | 100 | 30 |
| 5 | Pure water | 99.75 | NH$_3$ | 0.25 | 10.15 | 26.9 | Ce(NO$_3$)$_3$ 6H$_2$O | 9.0 | Pure water | 91.0 | 3.14 | 31.2 | 100 | 30 |
| 6 | Pure water | 99.75 | NH$_3$ | 0.25 | 10.15 | 26.9 | Ce(NO$_3$)$_3$ 6H$_2$O | 9.0 | Pure water | 91.0 | 3.14 | 31.2 | 150 | 30 |
| 7 | Pure water | 99.75 | NH$_3$ | 0.25 | 10.15 | 26.9 | Ce(NO$_3$)$_3$ 6H$_2$O | 9.0 | Pure water | 91.0 | 3.14 | 31.2 | 100 | 30 |
| 8 | Pure water | 99.75 | NH$_3$ | 0.25 | 10.15 | 26.9 | Ce(NO$_3$)$_3$ 6H$_2$O | 9.0 | Pure water | 91.0 | 3.14 | 31.2 | 150 | 30 |
| 9 | Pure water | 99.75 | NH$_3$ | 0.25 | 10.15 | 26.9 | Ce(NO$_3$)$_3$ 6H$_2$O | 9.0 | Pure water | 91.0 | 3.14 | 31.2 | 150 | 30 |
| 10 | Pure water | 99.75 | NH$_3$ | 0.25 | 10.15 | 26.9 | Ce(NO$_3$)$_3$ 6H$_2$O | 9.0 | Pure water | 91.0 | 3.14 | 31.2 | 200 | 30 |
| 11 | Pure water | 99.41 | NaOH | 0.59 | 12.93 | 26.9 | Ce(NO$_3$)$_3$ 6H$_2$O | 9.0 | Pure water | 91.0 | 3.14 | 31.2 | 200 | 60 |
| 12 | Pure water | 99.41 | NaOH | 0.59 | 12.93 | 26.9 | Ce(NO$_3$)$_3$ 6H$_2$O | 9.0 | Pure water | 91.0 | 3.14 | 31.2 | 240 | 60 |
| 13 | Pure water | 99.41 | NaOH | 0.59 | 12.93 | 26.9 | Ce(NO$_3$)$_3$ 6H$_2$O | 9.0 | Pure water | 91.0 | 3.14 | 31.2 | 260 | 60 |
| 14 | Pure water | 99.41 | NaOH | 0.59 | 12.93 | 26.9 | Ce(NO$_3$)$_3$ 6H$_2$O | 9.0 | Pure water | 91.0 | 3.14 | 31.2 | 300 | 60 |
| 15 | Pure water | 99.75 | NH$_3$ | 0.25 | 10.15 | 26.9 | Ce(NO$_3$)$_3$ 6H$_2$O | 9.0 | Pure water | 91.0 | 3.14 | 31.2 | 100 | 30 |
| 16 | Pure water | 99.75 | NH$_3$ | 0.25 | 10.15 | 26.9 | Ce(NO$_3$)$_3$ 6H$_2$O | 9.0 | Pure water | 91.0 | 3.14 | 31.2 | 100 | 30 |

| | | Introduction temperature (liquid sending temperature) | | Introduction pressure (liquid sending pressure) | | Introduction temperature between processing surfaces (c) | Discharged liquid | | Single crystal ratio | Average particle diameter (D) | Crystal diameter (d) | | CV value |
|---|---|---|---|---|---|---|---|---|---|---|---|---|---|
| | | Liquid A | Liquid B | Liquid A | Liquid B | | pH | [°C.] | | | | | |
| | | [°C.] | | [MPaG] | | [°C.] | | | [%] | [nm] | [nm] | d/D | [%] |
| Example | 1 | 65 | 44 | 0.075 | 0.01 | 60.15 | 7.95 | 14.2 | 11.6 | 6.5 | 2.1 | 0.32 | 36.6 |
| | 2 | 65 | 42 | 0.075 | 0.01 | 61.17 | 8.77 | 14.2 | 12.3 | 5.4 | 1.9 | 0.35 | 37.9 |
| | 3 | 82 | 39 | 0.081 | 0.01 | 74.83 | 8.78 | 14.3 | 54.9 | 5.5 | 2.1 | 0.38 | 33.6 |
| | 4 | 82 | 39 | 0.088 | 0.01 | 72.08 | 7.95 | 14.6 | 55.9 | 12.3 | 4.4 | 0.36 | 31.6 |
| | 5 | 92 | 39 | 0.109 | 0.01 | 79.77 | 7.94 | 14.3 | 66.4 | 5.3 | 2.8 | 0.53 | 26.1 |
| | 6 | 92 | 39 | 0.111 | 0.01 | 83.17 | 8.49 | 14.5 | 64.2 | 7.2 | 3.6 | 0.50 | 25.6 |
| | 7 | 110 | 85 | 0.205 | 0.01 | 104.23 | 6.82 | 14.6 | 93.1 | 8.9 | 7.2 | 0.81 | 17.9 |
| | 8 | 111 | 109 | 0.205 | 0.26 | 110.67 | 8.10 | 14.3 | 96.4 | 6.1 | 6.0 | 0.98 | 16.9 |
| | 9 | 138 | 70 | 0.365 | 0.15 | 126.67 | 7.14 | 14.6 | 100.0 | 4.4 | 4.2 | 0.95 | 13.9 |
| | 10 | 138 | 112 | 0.366 | 0.28 | 134.61 | 8.79 | 14.5 | 100.0 | 12.3 | 12.3 | 1.00 | 11.6 |
| | 11 | 137 | 108 | 0.391 | 0.25 | 130.31 | 6.91 | 14.2 | 100.0 | 5.4 | 5.4 | 1.00 | 8.8 |
| | 12 | 142 | 109 | 0.406 | 0.25 | 135.40 | 7.21 | 14.3 | 100.0 | 16.4 | 15.9 | 0.97 | 9.6 |
| | 13 | 136 | 107 | 0.402 | 0.25 | 130.56 | 10.30 | 14.1 | 20.3 | 6.5 | 1.8 | 0.28 | 38.4 |
| | 14 | 140 | 106 | 0.411 | 0.25 | 134.33 | 11.84 | 14.3 | 3.1 | 4.9 | 0.8 | 0.16 | 36.2 |
| | 15 | 40 | 40 | 0.056 | 0.42 | 40.00 | 8.01 | 14.3 | 0.0 | 8.9 | 0.8 | 0.09 | 46.9 |
| | 16 | 30 | 30 | 0.056 | 0.42 | 30.00 | 8.03 | 14.4 | 0.0 | 7.9 | 0.4 | 0.05 | 47.3 |

Example Y17, Y18

Cerium oxide particles were prepared under the same conditions as in Example Y1 except that the formulation of the cerium oxide raw material liquid and the cerium oxide precipitation solvent and the treatment conditions were shown in Table 3.

Based on the formulation of the cerium oxide raw material liquid shown in Table 3, the cerium oxide raw material liquid was prepared by mixing the cerium oxide particle raw material containing the compound of the element to be solid-soluted in or compounded with the obtained cerium oxide particles with pure water, and homogeneously mixing the mixture by stirring at a rotation speed of 20,000 rpm and at a preparation temperature of 50° C. for 30 min using CLEARMIX, and the cerium oxide particle material was dissolved in pure water to prepare the cerium oxide raw material liquid. The cerium oxide precipitation solvent was prepared under the same conditions as in Example Y1. In Table 3, Ce(NO$_3$)$_3$.6H$_2$O represents cerium (III) nitrate hexahydrate, NH$_3$ represents ammonia, and Fe(NO$_3$)$_3$.9H$_2$O represents iron nitrate nonahydrate. As Ce(NO$_3$)$_3$.6H$_2$O, a special grade reagent (Wako Pure Chemical Industries, Ltd.) was used, as NH$_3$, a special grade reagent (containing 28 wt % of NH$_3$, Kanto Kagaku Co., Inc.) was used, and as Fe(NO$_3$)$_3$.9H$_2$O, a special grade reagent (Kanto Kagaku Co., Inc.) was used.

Figure 19:
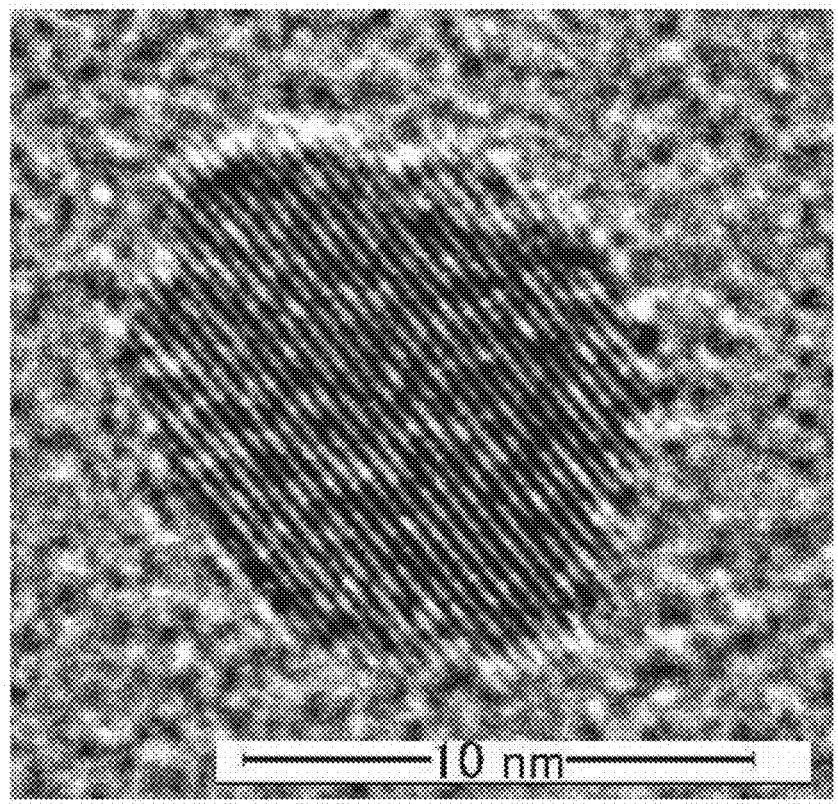
FIG. 19 shows a TEM photograph of the cerium oxide particles in which iron element is solid-soluted in or compounded with, obtained in Example Y17 of the present invention.
Figure 20:
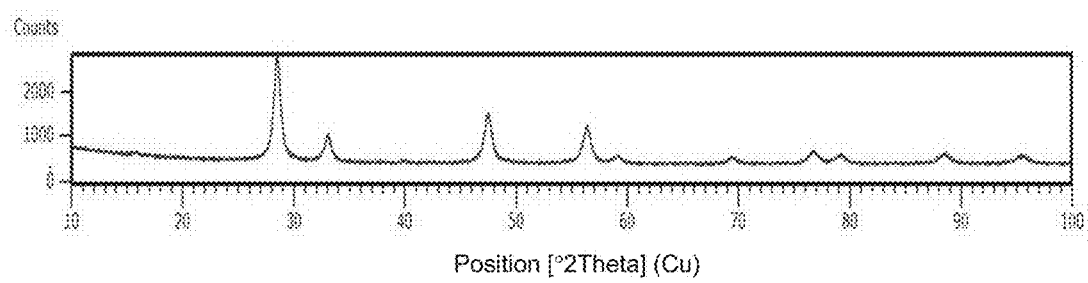
FIG. 20 shows an XRD measurement result of the cerium oxide particles in which iron element is solid-soluted in or compounded with, obtained in Example Y17 of the present invention.

FIG. 19 shows a TEM photograph of the cerium oxide particles obtained in Example Y17. As seen in FIG. 19, since lattice stripes were observed in one direction, it was found that the cerium oxide particles obtained in Example Y17 are single crystals. FIG. 20 shows an XRD measurement result of the cerium oxide particles obtained in Example Y17. As shown in FIG. 20, in the XRD measurement result of the cerium oxide particles obtained in Example Y17, only the peak derived from cerium oxide was detected, and in the XRD measurement result of the cerium oxide particles obtained in Example Y18, only the peak derived from cerium oxide was detected. As a result of EDS analysis of the cerium oxide particles shown in FIG. 19, it was found that molar ratio of cerium and iron Ce/Fe was 97.1/2.9 (mol), and was approximately the same as Ce/Fe (molar ratio) of the cerium oxide raw material liquid. The same EDS analysis was performed for ten cerium oxide particles obtained in Example Y17, and molar ratio of cerium and iron Ce/Fe was in the range of 96.0/4.0 to 98.1/1.9 (Mol). By using the present invention, it was found that an element other than cerium and oxygen could be solid-soluted or compounded in the cerium oxide nanoparticles. It was also confirmed that an element other than cerium and oxygen could be solid-soluted or compounded in the cerium oxide nanoparticles of single crystals obtained in Example Y18. By including a compound containing another element in the cerium oxide particle raw material when preparing the single crystal cerium oxide particles, it becomes possible to contain another element in the single crystal cerium oxide particles, so that it has become possible to uniformly incorporate another element in the cerium oxide particles.

introduction part d1 of the microreactor shown in FIG. 1, and liquid B corresponds to the second fluid to be processed which is introduced from the second introduction part d2 likewise. Replacement of the first introduction part d1 and the second introduction part d2 may be done arbitrarily. Analysis of the obtained iron oxide microparticles was carried out under the following conditions.

For the XRD measurement, the powder X-ray diffractometer X'Pert PROMPD (XRD Spectris Co., Ltd., PANalytical Division) was used. The measurement condition was measurement range of 10 to 100 [° 2Theta], Cu anticathode, tube voltage of 45 kV, tube current of 40 mA, and scanning speed of 16°/min. A peak at around 44° was used as a crystallite diameter, and was calculated using a silicon polycrystalline plate as a reference.

For the TEM observation, the transmission electron microscopy JEM-2100 (JEOL Ltd.). The observation condition was the acceleration voltage of 80 kV, and the observation magnification of 10,000 times or more. The primary particle diameter D1 of the iron oxide particles of

TABLE 3

| | Formulation of cerium oxide raw material liquid (Liquid A) | | | | | | pH measurement | | Formulation of cerium oxide precipitation solvent (liquid B) | |
|---|---|---|---|---|---|---|---|---|---|---|
| | Formulation [wt %] | | | | | | pH | temperature [° C.] | Formulation [wt %] | |
| Example 17 | Ce(NO$_3$)$_3$ 6H$_2$O | 1.8 | Fe(NO$_3$)$_3$ 9H$_2$O | 0.1 | Pure water | 98.1 | 2.93 | 16.0 | Pure water | 98.74 |
| 18 | Ce(NO$_3$)$_3$ 6H$_2$O | 1.8 | Fe(NO$_3$)$_3$ 9H$_2$O | 0.1 | Pure water | 98.1 | 2.93 | 16.0 | Pure water | 98.74 |

| | Formulation of cerium oxide precipitation solvent (liquid B) | | | Introduction flow rate | | Introduction temperature (liquid sending temperature) | | Introduction pressure (liquid sending pressure) | |
|---|---|---|---|---|---|---|---|---|---|
| | Formulation [wt %] | pH | measurement temperature [° C.] | Liquid A [ml/min] | Liquid B | Liquid A [° C.] | Liquid B | Liquid A [MPaG] | Liquid B |
| Example 17 | NH$_3$ | 1.26 | 11.91 | 14.5 | 100 | 30 | 135 | 109 | 0.359 | 0.25 |
| 18 | NH$_3$ | 1.26 | 11.91 | 14.5 | 150 | 30 | 135 | 110 | 0.379 | 0.25 |

| | Introduction temperature between processing surfaces (c) [° C.] | Discharged liquid | | Single crystal ratio [%] | Average particle diameter (D) [nm] | Crystal diameter (d) [nm] | d/D | CV value [%] |
|---|---|---|---|---|---|---|---|---|
| | | pH | [° C.] | | | | | |
| Example 17 | 129.00 | 8.68 | 14.1 | 100.0 | 9.8 | 9.8 | 1.00 | 10.6 |
| 18 | 130.83 | 7.89 | 13.9 | 100.0 | 6.4 | 6.3 | 0.98 | 37.9 |

(Z) Method of Producing α-Hematite Particles

Next, a method for producing α-hematite particles is specifically explained with reference to examples.

Example Z1

First, iron oxide microparticles (α-hematite particles) was precipitated by using an iron oxide raw material fluid as liquid A and an iron oxide precipitation fluid as liquid B, and mixing liquid A and liquid B using a microreactor.

As a microreactor, product name: ULREA (M. Technique Co., Ltd.) was used. In this case, liquid A corresponds to the first fluid to be processed which is introduced from the first examples is the average value (average primary particle diameter) of the measured particle diameters of 100 particles by TEM observation.

(Evaluation of Single Crystal)

As a method of evaluating that the α-hematite particles obtained by the examples are single crystals, the obtained α-hematite particles were observed by a TEM, and from the number X (number) of the α-hematite particles and the number Y (number) of the α-hematite particles observed as single crystals among them, the single crystal ratio was calculated by Y/X×100(%) and was evaluated. In the TEM observation, as a criterion for judging whether or not an individual particle is a single crystal, one in which lattice stripes (atomic arrangement in the crystal) is observed in one direction is recognized as a single crystal, and one in which the lattice stripes are disturbed or grain boundaries are observed is not a single crystal.

Liquid A was prepared by mixing iron (III) nitrate nonahydrate and pure water at a weight ratio of 2.0/98.0, and stirring the mixture at a rotation speed of 20,000 rpm and a processing temperature of 24 to 60° C. for a processing time of 60 min using CLEARMIX (product name: CLM-2.2S, M. Technique Co., Ltd.) to be mixed and dissolved. Liquid B was prepared by mixing sodium hydroxide and pure water at a weight ratio of 9.0/91.0, and stirring the mixture at a rotation speed of 8,000 rpm and a processing temperature of 50° C. for a processing time of 30 min using CLEARMIX to be mixed and dissolved.

Examples Z1 to Z6

Using the microreactor shown in FIG. 1, liquid A and liquid B of the formulations shown in Table 4 were introduced between the processing surfaces 1 and 2 under the processing conditions shown in Table 4, and were mixed in a thin film fluid formed between the surfaces 1 and 2 to precipitate iron oxide microparticles. A slurry liquid (hereinafter also referred to as "discharged liquid") containing iron oxide microparticles precipitated between the processing surfaces 1 and 2 was discharged from between the processing surfaces 1 and 2, and collected in the beaker b through vessel v. The rotation speed of the first processing unit 10 is 1,700 rpm.

"Introduction temperature between the processing surfaces c" in Table 4 was calculated from the following figure.

$$c = (a1 \times a2 + b1 \times b2)/(a2 + b2)$$

wherein
a1: temperature of the iron oxide raw material fluid
a2: flow rate of the iron oxide raw material fluid per unit time
b1: temperature of the iron oxide precipitation fluid
b2: flow rate of the iron oxide precipitation fluid per unit time Regarding abbreviations in Table 4, $Fe(NO_3)_3 \cdot 9H_2O$ represents iron (III) nitrate nonahydrate, and NaOH represents sodium hydroxide.

In Examples Z1 to Z6, the discharged liquid collected in the beaker b was allowed to stand until it reached 60° C. or lower, and iron oxide microparticles were settled down.

(Washing and Collection of Iron Oxide Microparticles)

The supernatant liquid in the beaker b was removed, pure water of 20 to 1,500 times weight of the weight of the settled iron oxide microparticles was added, and the iron oxide microparticles was washed by stirring the mixture at a rotation speed of 6,000 rpm and at a processing temperature of 25° C. for a processing time of 5 min using CLEARMIX. After performing the washing operation three times, the iron oxide microparticles were settled down again and the supernatant liquid was removed to obtain a hydrous wet cake of iron oxide microparticles.

(Preparation of Iron Oxide Dispersion/Preparation of Various Measurement Samples)

A part of the hydrous wet cake of the above iron oxide microparticles was charged into propylene glycol and was subjected to dispersion treatment at 20,000 rpm for 30 min using CLEARMIX, whereby iron oxide microparticle dispersion was obtained. The obtained dispersion was diluted with isopropyl alcohol, subjected to dispersion treatment with an ultrasonic washer, dropped on a collodion membrane, and dried to obtain a TEM observation sample. In addition, the hydrous wet cake of the iron oxide microparticles obtained after washing were dried at −0.10 MPaG at 20° C. for 15 hours or more to obtain iron oxide microparticles. The results are shown in Table 5.

Example Z7 to Z11

Iron oxide microparticles were precipitated in the same manner as in Examples Z1 to Z6, except that the formulation of the iron oxide raw material fluid and the iron oxide precipitation fluid and the processing conditions were changed to those shown in Table 4. A slurry liquid (hereinafter also referred to as "discharged liquid") containing iron oxide microparticles precipitated between the processing surfaces 1 and 2 was discharged from the space between the processing surfaces 1 and 2, and collected in the beaker b through vessel v.

In Examples Z7 to Z11, the discharged liquid collected in the beaker b was allowed to stand until reaching 60° C. or lower, and iron oxide microparticles were settled down.

Figure 23:
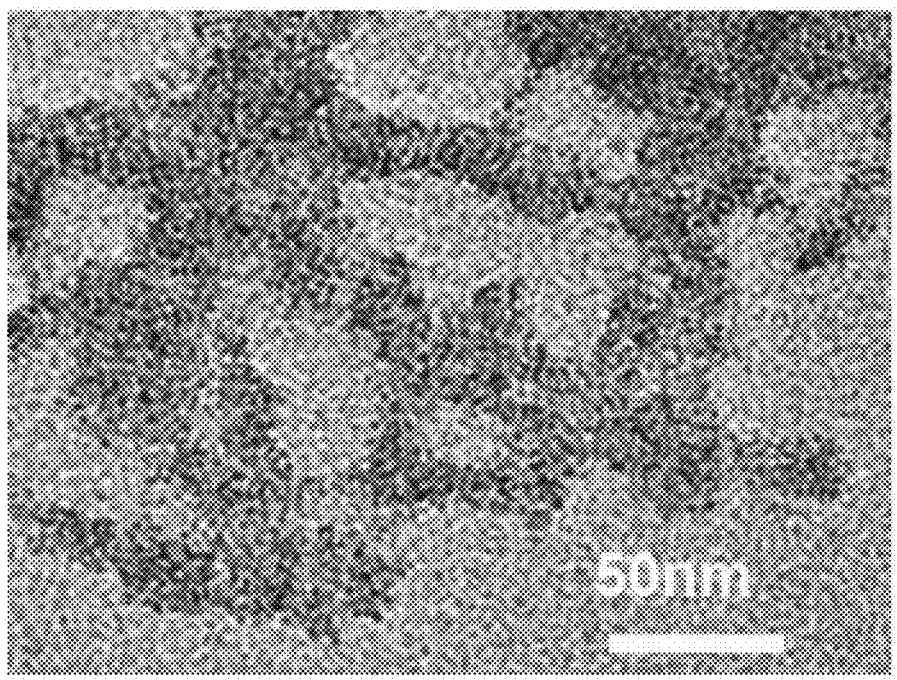
FIG. 23 shows a TEM photograph of the iron oxide microparticles obtained in Example Z10.

Washing and collection of iron oxide microparticles, and preparation of iron oxide microparticle dispersion, and preparation of various measurement samples were carried out in the same manner as in Examples Z1 to Z6. The results are shown in Table 5. In Examples Z10 and 11, the crystallinity was too low to discriminate the primary particle size by TEM observation, and the single crystal ratio could not be calculated. FIG. 23 shows a TEM photograph of the iron oxide microparticles obtained in Example Z10.

TABLE 4

| | | Formulation of oxide raw material liquid (Liquid A) | | | | Formulation of oxide precipitation solvent (liquid B) | | | |
|---|---|---|---|---|---|---|---|---|---|
| | | Solvent/ Formulation [wt %] | $Fe^{3+}$/ Formulation [wt %] | pH | pH measurement temperature [° C.] | Basic solvent/ Formulation [wt %] | | Solvent/ Formulation [wt %] | pH |
| Example 1 | Pure water 98.00 | $Fe(NO_3)_3$ $9H_2O$ 2.00 | 1.90 | 34.1 | NaOH 9.00 | Pure water 91.00 | >14 |
| 2 | Pure water 96.00 | $Fe(NO_3)_3$ $9H_2O$ 4.00 | 1.42 | 34.1 | NaOH 18.00 | Pure water 82.00 | >14 |
| 3 | Pure water 96.00 | $Fe(NO_3)_3$ $9H_2O$ 4.00 | 1.42 | 34.1 | NaOH 18.00 | Pure water 82.00 | >14 |
| 4 | Pure water 96.00 | $Fe(NO_3)_3$ $9H_2O$ 4.00 | 1.42 | 34.1 | NaOH 18.00 | Pure water 82.00 | >14 |

TABLE 4-continued

| | | | | | | | | | | | | |
|---|---|---|---|---|---|---|---|---|---|---|---|---|
| | 5 | Pure water | 96.00 | Fe(NO$_3$)$_3$ 9H$_2$O | 4.00 | 1.42 | 34.1 | NaOH | 18.00 | Pure water | 82.00 | >14 |
| | 6 | Pure water | 96.00 | Fe(NO$_3$)$_3$ 9H$_2$O | 4.00 | 1.42 | 34.1 | NaOH | 18.00 | Pure water | 82.00 | >14 |
| | 7 | Pure water | 98.00 | Fe(NO$_3$)$_3$ 9H$_2$O | 2.00 | 1.90 | 34.1 | NaOH | 9.00 | Pure water | 91.00 | >14 |
| | 8 | Pure water | 96.00 | Fe(NO$_3$)$_3$ 9H$_2$O | 4.00 | 1.42 | 34.1 | NaOH | 18.00 | Pure water | 82.00 | >14 |
| | 9 | Pure water | 96.00 | Fe(NO$_3$)$_3$ 9H$_2$O | 4.00 | 1.42 | 34.1 | NaOH | 18.00 | Pure water | 82.00 | >14 |
| | 10 | Pure water | 96.00 | Fe(NO$_3$)$_3$ 9H$_2$O | 4.00 | 1.42 | 34.1 | NaOH | 18.00 | Pure water | 82.00 | >14 |
| | 11 | Pure water | 96.00 | Fe(NO$_3$)$_3$ 9H$_2$O | 4.00 | 1.42 | 34.1 | KOH | 18.00 | Pure water | 82.00 | >14 |

| | | Introduction flow rate | | Introduction temperature (liquid sending temperature) | | Introduction pressure (liquid sending pressure) | | Introduction temperature between processing surfaces (c) | Discharged liquid | |
|---|---|---|---|---|---|---|---|---|---|---|
| | | Liquid A | Liquid B | Liquid A | Liquid B | Liquid A | Liquid B | | pH | [° C.] |
| | | [ml/min] | | [° C.] | | [MPaG] | | [° C.] | | |
| Example | 1 | 420 | 50 | 146 | 108 | 0.400 | 0.42 | 143.47 | 8.66 | 20.2 |
| | 2 | 420 | 29 | 146 | 106 | 0.413 | 0.42 | 143.42 | 6.23 | 20.2 |
| | 3 | 420 | 30 | 146 | 106 | 0.412 | 0.42 | 143.33 | 8.31 | 20.2 |
| | 4 | 420 | 31 | 146 | 106 | 0.411 | 0.42 | 143.25 | 9.95 | 20.2 |
| | 5 | 420 | 32 | 146 | 106 | 0.411 | 0.42 | 143.25 | 12.34 | 20.2 |
| | 6 | 420 | 33 | 146 | 106 | 0.411 | 0.42 | 143.17 | 13.68 | 20.2 |
| | 7 | 420 | 30 | 146 | 108 | 0.400 | 0.42 | 143.63 | 2.73 | 22.2 |
| | 8 | 420 | 25 | 146 | 106 | 0.411 | 0.42 | 143.75 | 5.04 | 20.2 |
| | 9 | 420 | 35 | 146 | 106 | 0.411 | 0.42 | 142.92 | >14 | 20.2 |
| | 10 | 420 | 30 | 56 | 79 | 0.056 | 0.12 | 57.53 | 8.91 | 20.2 |
| | 11 | 420 | 30 | 65 | 79 | 0.057 | 0.12 | 65.93 | 8.99 | 20.2 |

TABLE 5

| | | pH of discharged liquid | Single crystal ratio [%] | Average primary particle diameter (D1) [nm] |
|---|---|---|---|---|
| Example | 1 | 8.66 | 90.9 | 8.40 |
| | 2 | 6.23 | 91.3 | 22.30 |
| | 3 | 8.31 | 100 | 7.69 |
| | 4 | 9.95 | 100 | 8.19 |
| | 5 | 12.34 | 99.8 | 8.69 |
| | 6 | 13.68 | 94.6 | 15.60 |
| | 7 | 2.73 | 31.2 | 26.40 |
| | 8 | 5.04 | 26.9 | 31.20 |
| | 9 | >14 | 11.4 | 26.40 |
| | 10 | 8.91 | — | — |
| | 11 | 8.99 | — | — |

Figure 22:
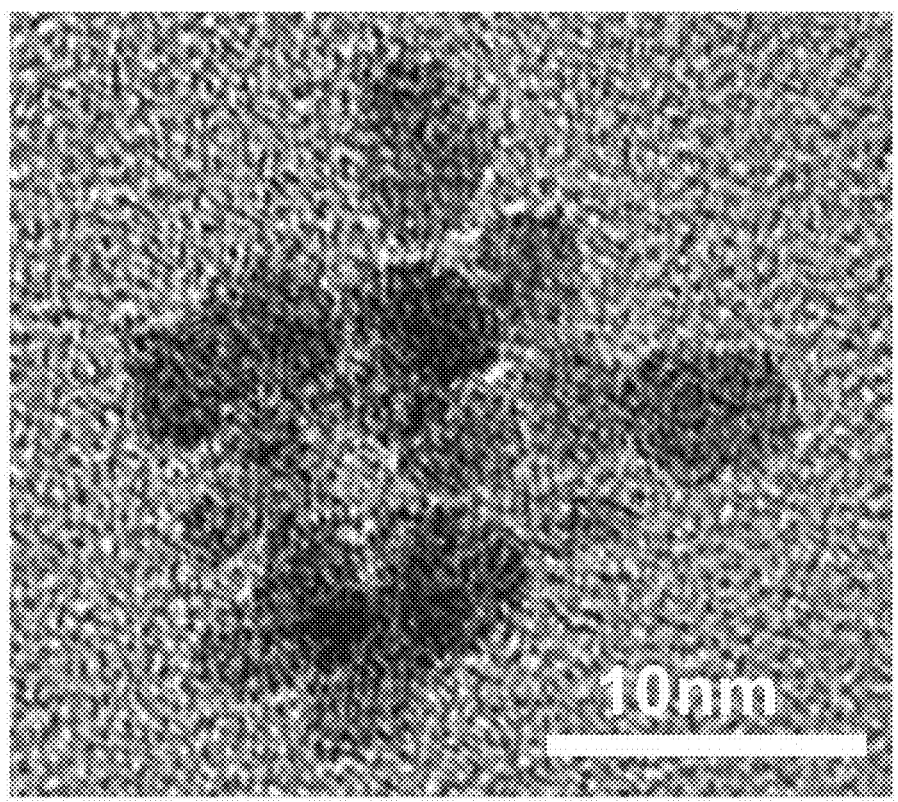
FIG. 22 shows a TEM photograph of the iron oxide microparticles obtained in Example Z1.

FIG. 22 shows a TEM photograph of the iron oxide particles obtained in Example Z1. It was found that the shape of the primary particle was a roughly spherical shape, and the average primary particle diameter was 8.40 nm. In addition, as a result of the XRD measurement of Example Z1, the peak of α-Fe$_2$O$_3$(hematite) was clearly detected. In the present invention, a roughly spherical shape means a substantially spherical shape. Specifically, when the particle shape is defined by major axis and minor axis, a roughly spherical shape means that the ratio of the minor axis to the major axis is in the range of 0.5 to 1.0.

REFERENCE SIGNS LIST

1 the first processing surface
2 the second processing surface
10 the first processing unit
11 the first holder
20 the second processing unit
21 the second holder
d1 the first introduction part
d2 the second introduction part
d20 opening

The invention claimed is:

1. A method of producing oxide particles, which comprises at least two fluids to be processed including a first fluid and a second fluid, wherein one of the first fluid and the second fluid is an oxide raw material liquid obtained by mixing at least an oxide particle raw material with a solvent, and the other of the first fluid and the second fluid is an oxide precipitation solvent obtained by mixing at least a basic substance with a solvent, and
  wherein the method comprises mixing the first fluid and the second fluid in a space between processing surfaces which are disposed so as to face each other, being capable of approaching to and separating from each other, at least one of which rotates relative to the other; and discharging a mixed fluid of the first fluid and the second fluid in which the oxide particles are precipitated from the space between the processing surfaces; and
  wherein the method controls crystallinity of the oxide particles discharged from the space between the processing surfaces so that 90% or more of the obtained oxide particles are single crystal oxide particles, by changing at least one selected from the group consisting of the temperature of the first fluid at the time of introduction in the space between the processing surfaces, the temperature of the second fluid at the time of introduction in the space between the processing surfaces, and the temperature of the first fluid and the second fluid at the time of mixing of the first fluid and the second fluid, to be 100° C. or higher.

2. The method of producing oxide particles according to claim 1, wherein the interval between the processing surfaces is set by a pressure balance between the force applied in the direction of approximating the processing surfaces and the pressure of the mixed fluid.

3. The method of producing oxide particles according to claim 1, wherein the first fluid passes in the space between the processing surfaces while forming a thin film fluid, and the second fluid is introduced in the space between the processing surfaces from an opening formed in at least one of the processing surfaces through a separate independent introduction path from the flow path through which the first fluid is introduced in the space between the processing surfaces, and the first fluid and the second fluid are mixed in the space between the processing surfaces.

4. The method of producing oxide particles according to claim 1, wherein the first fluid contains one or a plurality of solvents, and
the temperature of the first fluid at the time of introduction in the space between the processing surfaces is a temperature higher than the standard boiling point of the solvent having the lowest standard boiling point among one or a plurality of solvents contained in the first fluid.

5. The method of producing oxide particles according to claim 1, wherein the introduction pressure of the first fluid at the time of introduction in the space between the processing surfaces exceeds the standard pressure, and
the temperature of the first fluid at the time of introduction in the space between the processing surfaces is a temperature higher than the standard boiling point of the first fluid, and lower than the boiling point under the introduction pressure.

6. The method of producing oxide particles according to claim 5, wherein the temperature at the time of mixing is the introduction temperature c (° C.) between the processing surfaces of the mixed fluid which is calculated by the following equation:

$$c=(a1 \times a2+b1 \times b2)/(a2+b2)$$

wherein,
a1: introduction temperature of the oxide raw material liquid (° C.)
a2: introduction flow rate of the oxide raw material liquid (ml/min)
b1: introduction temperature of the oxide precipitation solvent (° C.)
b2: introduction flow rate of the oxide precipitation solvent (ml/min).

7. The method of producing oxide particles according to claim 1, wherein pH of the mixed fluid is controlled within a predetermined range.

8. The method of producing oxide particles according to claim 1, wherein the second fluid contains one or a plurality of solvents, and
the temperature of the second fluid to be introduced in the space between the processing surfaces is a temperature higher than the standard boiling point of the solvent having the lowest standard boiling point among one or a plurality of solvents contained in the second fluid.

9. The method of producing oxide particles according to claim 1, wherein both of the introduction pressure of the first fluid and the introduction pressure of the second fluid at the time of introduction in the space between the processing surfaces exceed the standard pressure, and
the temperature of the first fluid at the time of introduction in the space between the processing surfaces is a temperature higher than the standard boiling point of the first fluid, and lower than the boiling point under the introduction pressure, and
the temperature of the second fluid at the time of introduction in the space between the processing surfaces is a temperature higher than the standard boiling point of the second fluid, and lower than the boiling point under the introduction pressure.

10. The method of producing oxide particles according to claim 1, wherein the ratio d/D of the average crystal diameter (d) obtained by X-ray diffraction measurement of the oxide particles to the average particle diameter (D) obtained by transmission electron microscope observation of the oxide particles is 0.50 or more.

11. The method of producing oxide particles according to claim 1, wherein a temperature of either one of the first fluid and the second fluid is 175° C. or lower.

12. The method of producing oxide particles according to claim 1, wherein the oxide particles have a primary particle diameter of 20 nm or less.

13. The method of producing oxide particles according to claim 1, wherein the oxide particles are oxide particles which do not require a dry heat treatment.

14. The method of producing oxide particles according to claim 1, wherein another element is solid soluted in or compounded with the oxide particles.

15. The method of producing oxide particles according to claim 1, wherein the oxide particle raw material is magnetite particle raw material, and the oxide particles are magnetite particles.

16. The method of producing oxide particles according to claim 1, wherein the oxide particle raw material is cerium oxide particle raw material, and the oxide particles are cerium oxide particles.

17. The method of producing oxide particles according to claim 15, wherein pH of the mixed fluid is 9 or more.

18. The method of producing oxide particles according to claim 17, wherein the shape of the magnetite particles is controlled so as to approach a spherical shape by decreasing pH of the mixed fluid, and the shape of the magnetite particles is controlled so as to approach a square shape by increasing pH of the mixed fluid.

19. The method of producing oxide particles according to claim 15, wherein a molar ratio of $Fe^{2+}$ ion and $Fe^{3+}$ ion contained in the oxide raw material liquid, $Fe^{2+}/Fe^{3+}$, is 0.500±0.010.

20. The method of producing oxide particles according to claim 15, wherein pH of the oxide raw material liquid is 4 or less.

* * * * *